US008103463B2

(12) United States Patent
Kalgren et al.

(10) Patent No.: US 8,103,463 B2
(45) Date of Patent: Jan. 24, 2012

(54) SYSTEMS AND METHODS FOR PREDICTING FAILURE OF ELECTRONIC SYSTEMS AND ASSESSING LEVEL OF DEGRADATION AND REMAINING USEFUL LIFE

(75) Inventors: Patrick W. Kalgren, Conesus, NY (US); Antonio E. Ginart, Marietta, GA (US); Sashank Nanduri, Ann Arbor, MI (US); Anthony J. Boodhansingh, Webster, NY (US); Carl S. Byington, Pittsford, NY (US); Rolf F. Orsagh, Rochester, NY (US); Brian J. Sipos, Rochester, NY (US); Douglas W. Brown, Atlanta, GA (US); Christopher M. Minnella, Rochester, NY (US); Mark Baybutt, Webster, NY (US)

(73) Assignee: Impact Technologies, LLC, Rochester, NY (US)

( * ) Notice: Subject to any disclaimer, the term of this patent is extended or adjusted under 35 U.S.C. 154(b) by 718 days.

(21) Appl. No.: 11/859,256

(22) Filed: Sep. 21, 2007

(65) Prior Publication Data

US 2008/0141072 A1    Jun. 12, 2008

Related U.S. Application Data

(60) Provisional application No. 60/826,426, filed on Sep. 21, 2006.

(51) Int. Cl.
 *G01R 15/00* (2006.01)
(52) U.S. Cl. ............ 702/57; 702/64; 702/117; 702/182; 702/189
(58) Field of Classification Search .................. 702/59, 702/64, 81, 109, 117, 179, 182, 189; 714/41, 714/42, 44; 379/2; 204/400
See application file for complete search history.

(56) References Cited

U.S. PATENT DOCUMENTS

| 5,195,046 | A | * | 3/1993 | Gerardi et al. ................... 702/35 |
| 5,270,222 | A | | 12/1993 | Moslehi |
| 5,465,321 | A | * | 11/1995 | Smyth ............................ 706/20 |
| 5,719,495 | A | | 2/1998 | Moslehi |
| 6,363,332 | B1 | | 3/2002 | Rangarajan et al. |
| 6,366,208 | B1 | | 4/2002 | Hopkins et al. |
| 6,529,135 | B1 | | 3/2003 | Bowers et al. |
| 6,745,151 | B2 | | 6/2004 | Marko et al. |

(Continued)

OTHER PUBLICATIONS

Orshansky et al., 'Approaches to Statistical Circuit Analysis for Deep Sub-Micron Technologies', 1998, IEEE Publication, pp. 6-9.*

(Continued)

*Primary Examiner* — Mohamed Charioui
*Assistant Examiner* — Elias Desta
(74) *Attorney, Agent, or Firm* — Duane C. Basch; Basch & Nickerson LLP

(57) ABSTRACT

Disclosed are systems and methods for prognostic health management (PHM) of electronic systems. Such systems and methods present challenges traditionally viewed as either insurmountable or otherwise not worth the cost of pursuit. The systems and methods are directed to the health monitoring and failure prediction of electronic systems, including the diagnostic methods employed to assess current health state and prognostic methods for the prediction of electronic system failures and remaining useful life. The disclosed methodologies include three techniques: (1) use of existing electronic systems data (circuit as a sensor); (2) use of available external measurements as condition indicators and degradation assessor; and (3) performance assessment metrics derived from available external measurements.

29 Claims, 56 Drawing Sheets

U.S. PATENT DOCUMENTS

| | | | |
|---|---|---|---|
| 6,747,445 | B2 | 6/2004 | Fetterman et al. |
| 6,782,345 | B1 | 8/2004 | Siegel et al. |
| 6,807,507 | B2 | 10/2004 | Kumar et al. |
| 6,892,317 | B1 | 5/2005 | Sampath et al. |
| 7,034,660 | B2 | 4/2006 | Watters et al. |
| 7,103,460 | B1 | 9/2006 | Breed |
| 2005/0018371 | A1 | 1/2005 | Mladenik et al. |
| 2005/0038614 | A1 | 2/2005 | Botts et al. |
| 2005/0190359 | A1 | 9/2005 | Bacque et al. |
| 2006/0152224 | A1 | 7/2006 | Kim et al. |

OTHER PUBLICATIONS

Yu X et al., 'Research of Independent Component Analysis', 2004, IEEE Publication, pp. 4804-4809.*

Unofficial International Search Report and Written Opinion dated Jun. 19, 2008 for corresponding PCT application PCT/US07/79193.

Kalgren, P.; Baybutt, M.; Minnella, C.; Ginart, A.; Roemer, M.; Dabney, T.; Application of Prognostic Health Management in Digital Electronic Systems, Big Sky, Montana, Mar. 3-10, 2007.

Nanduri, S.; Almeida P.; Kalgren, P.; Roemer, M.; Circuit as a sensor, A practical approach toward embedded electronic prognostics. Autotestcon 2007, IEEE Systems Readiness Technology Conference, Baltimore's Inner Harbor, Baltimore, Maryland, Sep. 17-20, 2007.

Ginart, A; Brown, D; Kalgren, P; and Roemer, M; On-line Ringing Characterization as a PHM Technique for Power Drives and Electrical Machinery. Autotestcon 2007, IEEE Systems Readiness Technology Conference, Baltimore's Inner Harbor, Baltimore, Maryland, Sep. 17-20, 2007.

Brown, D.W.; Kalgren, P.W.; Roemer M.; Dabney, T.; Electronic Prognostics a Case Study Using Switched Mode Power Supplies (SMPS). Autotestcon 2006, IEEE Systems Readiness Technology Conference, Sep. 2006.

Brown, D.W.; Kalgren, P.W.; Byington, C.S.; Orsagh, R.F.; Electronic prognostics—A case study using Global Positioning System (GPS). Autotestcon 2005, IEEE Systems Readiness Technology Conference, Sep. 2005.

* cited by examiner

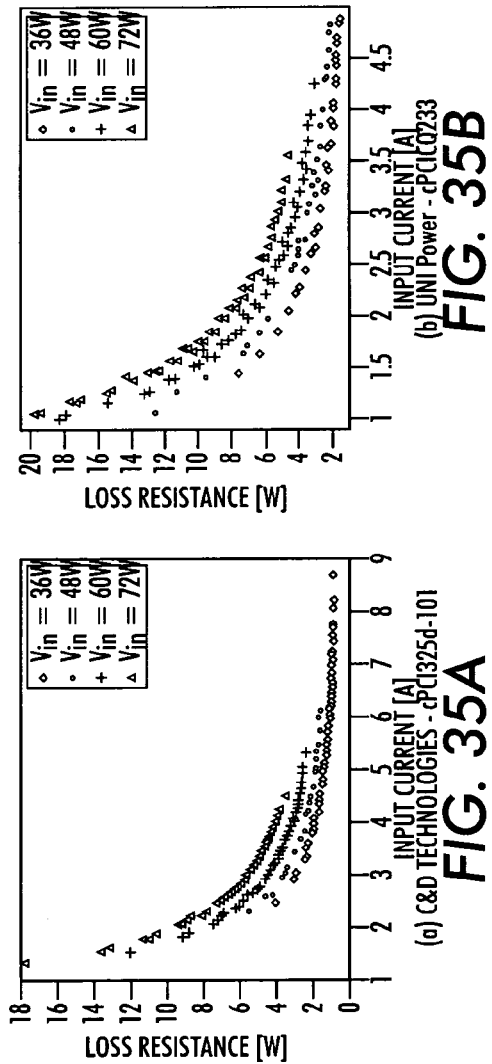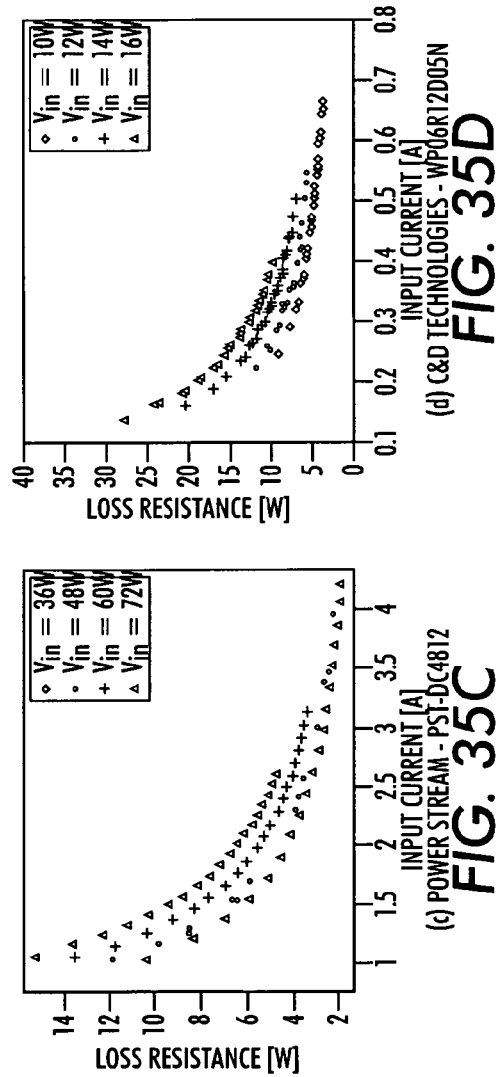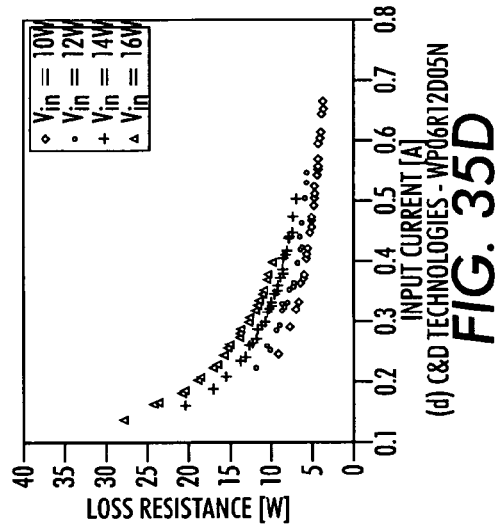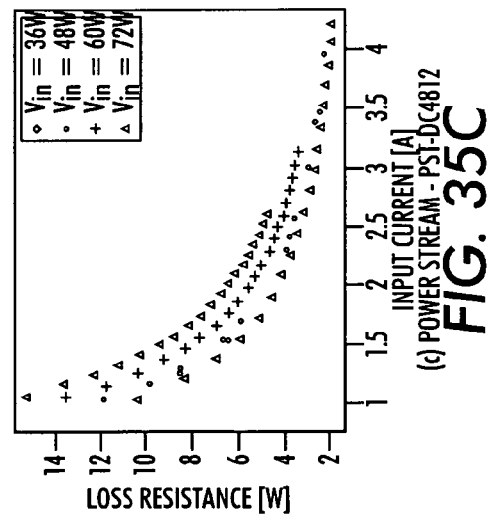
FIG. 35A
FIG. 35B
FIG. 35C
FIG. 35D

CIRCUIT TEST

TRANSISTOR MODEL

SYSTEMS AND METHODS FOR PREDICTING FAILURE OF ELECTRONIC SYSTEMS AND ASSESSING LEVEL OF DEGRADATION AND REMAINING USEFUL LIFE

This application claims priority from U.S. 60/826,426 for "Diagnostics and Prognostics for Prediction of Electronic System Failures and Useful Life Remaining," filed Sep. 21, 2006, which is hereby incorporated by reference in its entirety.

GOVERNMENT RIGHTS

These inventions were made with Government support under the Small Business Innovative Research program (contracts #N68335-06-C-0080, #N68335-04-C-0093, #N68335-05-C-0099, #N68335-07-C-0170, and #N68335-05-C-0128) awarded by Naval Air Warfare Center and Joint Strike Fighter program office. The Government has certain rights in the inventions.

The disclosed system and method is directed to the health monitoring and failure prediction of electronic systems, including the diagnostic methods employed to assess current health state and prognostic methods for the prediction of electronic system failures and remaining useful life. The disclosed technology utilizes three core techniques: (1) Use of existing electronic systems data (Circuit as a Sensor); (2) Use of available external measurements as condition indicators and degradation assessor; and (3) Performance assessment metrics derived from available external measurements.

BACKGROUND AND SUMMARY

With increased reliance on the operation of electronic equipment for day-to-day tasks, as well as the circuits and components within them, it is increasingly important to be able to assess not only the operating state of such equipment, but also if and when such equipment is experiencing degraded operation or is near failure and end of useful life. The ability to have Condition Based Maintenance (CBM) and Prognostic Health Management (PHM) capability on electronic systems, in order to monitor operating states, track performance, identify degraded performance and predict useful life is of significant advantage to the military as well as the commercial sector.

The electronic systems PHM technology begins by utilizing both diagnostic and prognostic features to develop health indicators to assess the current health and predict the amount of useful life remaining of an electronic system.

An electronic health indicator is a collection of one or more diagnostic features used to determine the overall lifetime (or health) of a system. An electronic health indicator is primarily used to determine the percentage of health remaining, or health index of a system.

A prognostic feature is a collection of one or more diagnostic features used to measure the rate of degradation to predict the amount of time left remaining during the useful life of the system, also referred to as Remaining Useful Life (RUL). One aspect of the present invention is the novel approach employed, particularly including the following: (i) No external circuit requirements; (ii) No circuit or system alterations; (iii) Data acquisition using low bandwidth connection; (iv) No external sensor requirements; and (v) Identification and verification of features (feature extraction) as trend indicators of damage accumulation.

Prognostic health management using minimal or no sensors is a further advantage as it avoids increasing costs and reduces the complexity of the equipment. Accordingly, aspects of the disclosed systems and methods are directed to the use of PHM techniques both at a general equipment level and also at the electronic system component and circuit level.

Use of existing electronic systems data (Circuit as a Sensor): The disclosed embodiments address the need for diagnostics and prognostics by providing a method to diagnose and predict electronic system failures and provide information supporting remaining useful life (RUL) assessment and prediction. This method incorporates existing data, typically utilized to perform a core or required device operation and not originally designed for failure prediction, to provide a self-contained system to detect faults and predict failures. As used herein, this is referred to as "circuit as sensor" (CAS). The circuit as sensor concept, enables implementation of prognostics for electronic devices, including devices having analog and/or digital components and in particular those that are digital and radio frequency in nature, utilizing few, if any, prognostics dedicated sensors. Examples of such devices would include, but are not limited to RF, IF, and baseband circuits, various digital circuits and motor drive applications and actuator controllers, as well as digital circuit error checking and flow control. This technology is presented using two use cases: a global positioning system (GPS) receiver and a RF transreceiver integrated circuit.

Use of available external measurements as condition indicators and degradation assessor: The approach integrates collaborative diagnostic and prognostic techniques from engineering disciplines including statistical reliability modeling, damage accumulation models, physics-of-failure modeling, signal processing and feature extraction, and automated reasoning algorithms. Further disclosed in embodiments herein is a PHM system for monitoring performance of an electronic system, comprising: a plurality of electronic circuit components (e.g., MOSFET), each component having a modeled operating state relative to at least one feature and each generating respective signals representative of the feature pursuant to the component operation; a data collection memory (e.g., RS-232 buffer, laptop) for storing samples of said electronic signals; and a computer (laptop), responsive to said electronic signals and the modeled operating state, for performing data analysis relative to the feature and detecting a variance in the operation of the component, wherein the computer further determines the health and/or remaining useful life of the component and the electronic system.

Performance assessment metrics derived from available external measurements: This method uses model-based assessments in the absence of fault indications, and updates the model-based assessments with sensed information when it becomes available to provide health state awareness at any point in time. Intelligent fusion of this diagnostic information with historical component reliability statistics provides a robust health state awareness as the basis for accurate prognostic predictions.

The following patents are believed to provide examples related to electronic prognostics and are hereby incorporated by reference, in their entirety, for their teachings:

| | | |
|---|---|---|
| 7,034,660 | Sensor devices for structural health monitoring | Apr. 03, 2002 |
| 6,892,317 | Systems and methods for failure prediction, diagnosis and remediation using data acquisition and feedback for a distributed electronic system | Dec. 16, 1999 |
| 6,807,507 | Electrical over stress (EOS) monitor | Jun. 27, 2002 |

-continued

| 6,782,345 | Systems and methods for diagnosing electronic systems | Oct. 03, 2000 |
| --- | --- | --- |
| 6,747,445 | Stress migration test structure and method therefore | Oct. 31, 2001 |
| 6,745,151 | Remote diagnostics and prognostics methods for complex systems | May 16, 2002 |
| 6,529,135 | Integrated electric motor monitor | Oct. 12, 1999 |
| 6,363,332 | Method and apparatus for predicting a fault condition using non-linear curve fitting techniques | Dec. 22, 1998 |
| 5,719,495 | Apparatus for semiconductor device fabrication diagnosis and prognosis | Jun. 05, 1996 |
| 5,270,222 | Method and apparatus for semiconductor device fabrication diagnosis and prognosis | Dec. 31, 1990 |

The following papers also described the use of electronic prognostics and prognostic health management techniques and methods, and are hereby incorporated by reference in their entirety:

Brown, D. W.; Kalgren, P. W.; Byington, C. S.; Orsagh, R. F.; *Electronic prognostics—A case study using Global Positioning System (GPS)*, Autotestcon 2005, IEEE Systems Readiness Technology Conference, September 2005;

Brown, D. W.; Kalgren, P. W.; Roemer M.; Dabney, T.; *Electronic Prognostics a Case Study Using Switched Mode Power Supplies (SMPS)*, Autotestcon 2006, IEEE Systems Readiness Technology Conference, September 2006;

Ginart, A; Brown, D; Kalgren, P; and Roemer, M; *On-line Ringing Characterization as a PHM Technique for Power Drives and Electrical Machinery*, Autotestcon 2007, IEEE Systems Readiness Technology Conference, Baltimore's Inner Harbor, Baltimore Md., Sep. 17-20, 2007;

Kalgren, P.; Baybutt, M.; Minnella, C.; Ginart, A.; Roemer, M.; Dabney, T.; *Application of Prognostic Health Management in Digital Electronic Systems*, Big Sky, Mont., Mar. 3-10, 2007; and Nanduri, S.; Almeida P.; Kalgren, P.; Roemer, M.; *Circuit as a sensor, A practical approach toward embedded electronic prognostics*, Autotestcon 2007, IEEE Systems Readiness Technology Conference, Baltimore's Inner Harbor, Baltimore Md., Sep. 17-20, 2007.

Disclosed in embodiments herein is a method for monitoring the health-state for electronic equipment, comprising: measuring current and voltage at an input and an output of the electronic equipment and acquiring data therefrom; using the measured data, calculating performance metrics for the equipment; separating the measured data into a plurality of data classes; generating performance models for at least one data class; extracting diagnostic features from measured data values by comparing calculated performance metrics with the diagnostic models; and identifying the source and severity of a fault based upon the diagnostic features.

Also disclosed in embodiments herein is a prognostic health management system for monitoring performance of an electronic system, comprising: a plurality of electronic circuit components, located in said electronic system, at least one component having a modeled operating state relative to at least one feature and generating respective electrical signals representative of the feature pursuant to the component operation; a data collection memory for storing samples of said electrical signals; and a computer processor, responsive to said electrical signals and the modeled operating state, for performing data analysis relative to the feature and detecting a variance in the operation of the component, wherein the processor further determines the health and/or remaining useful life of the component and the electronic system.

BRIEF DESCRIPTION OF THE DRAWINGS

FIGS. 35A-D are graphical illustrations of loss resistance characterization curves for each of four power supplies.

DETAILED DESCRIPTION

The following detailed description includes an embodiment for a health monitoring system capable of generating a health assessment for electronic systems. The disclosure is divided into three sections, including first a description of the general operation of the health monitoring system followed by detailed explanation of three embodiments demonstrating this capability.

General Operation

Figure 1:
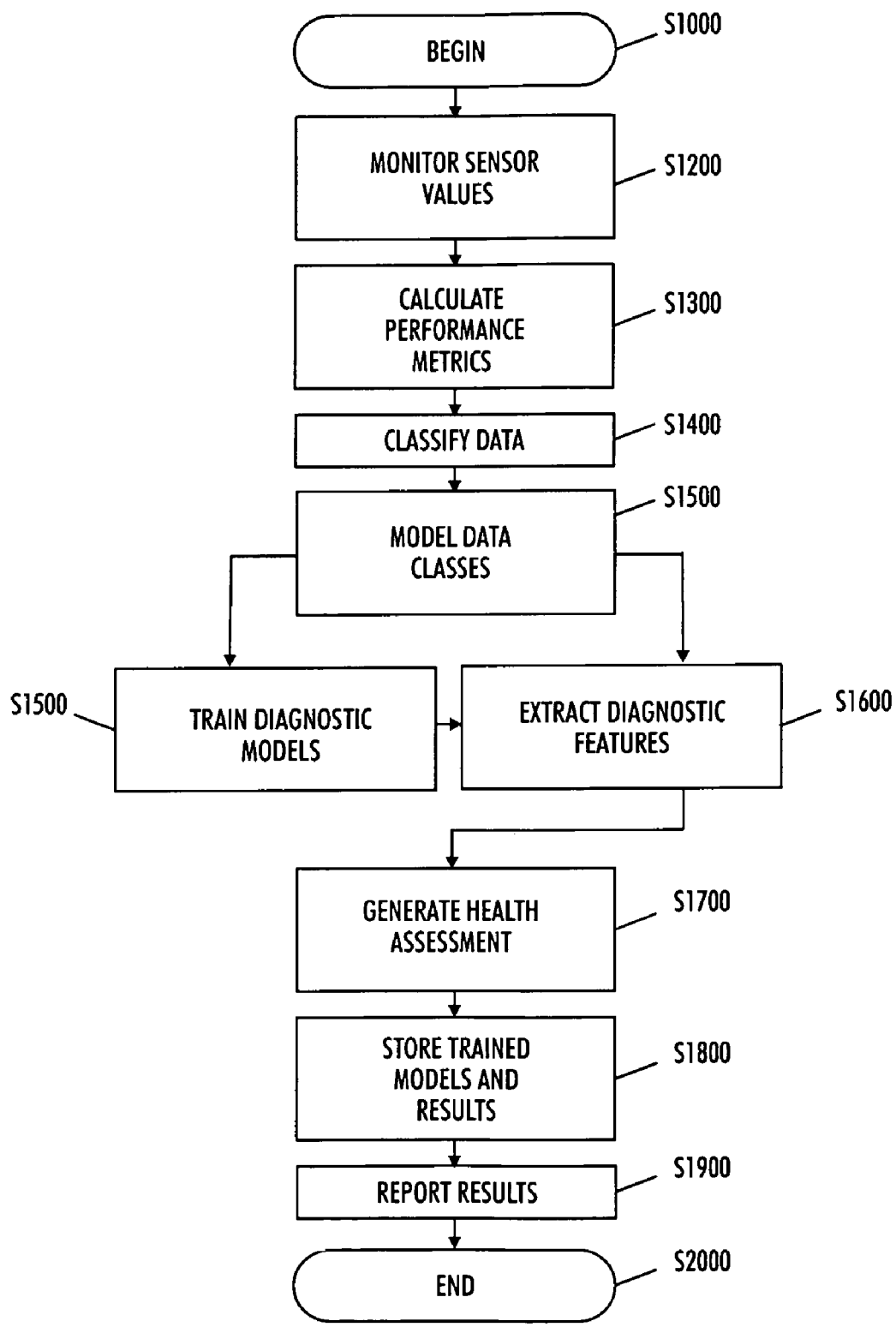
FIG. 1 is a flowchart depicting general operation of an electronic system prognostic health monitoring system.
Figure 2A:
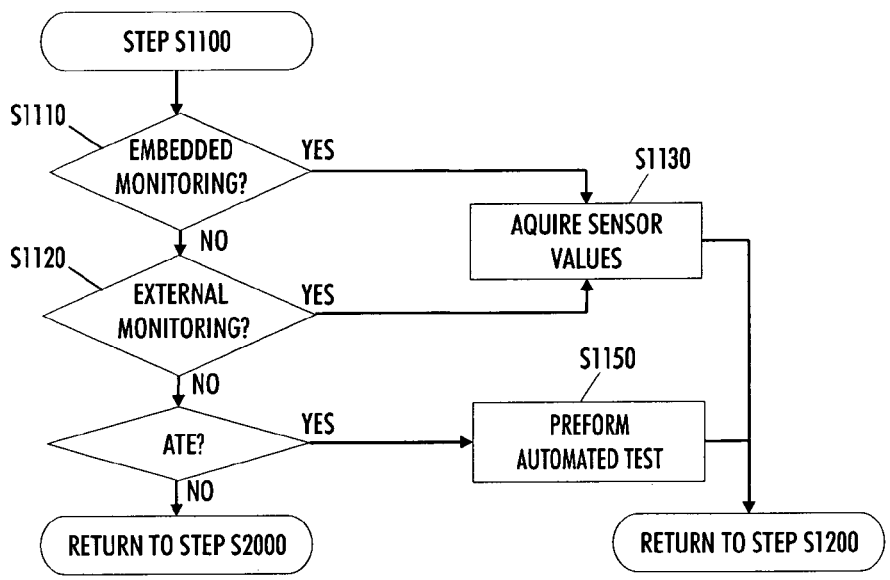
FIGS. 2A-2B are flowcharts illustrating alternative monitoring methodologies.

The general operation of the electronic system prognostic health monitoring system is set forth in the flowchart of FIG. 1. Each step is described in more detail as follows. At step S1100, the process begins by monitoring sensor values. There are several ways to monitor sensor values, which are dependent on the hardware architecture of the monitoring system as described in the next section. An outline of the monitoring procedure is provided in FIG. 2A. For the case where the health monitoring system is configured as an embedded or external monitoring system, step S1130 is used to monitor data by acquiring sensor values. Alternatively, when the health monitoring system is configured as automated test equipment (ATE), monitoring values are acquired by executing an automated test as described in FIG. 2B, beginning with step 1150. Both of these steps are now described in further detail.

Figure 2B:
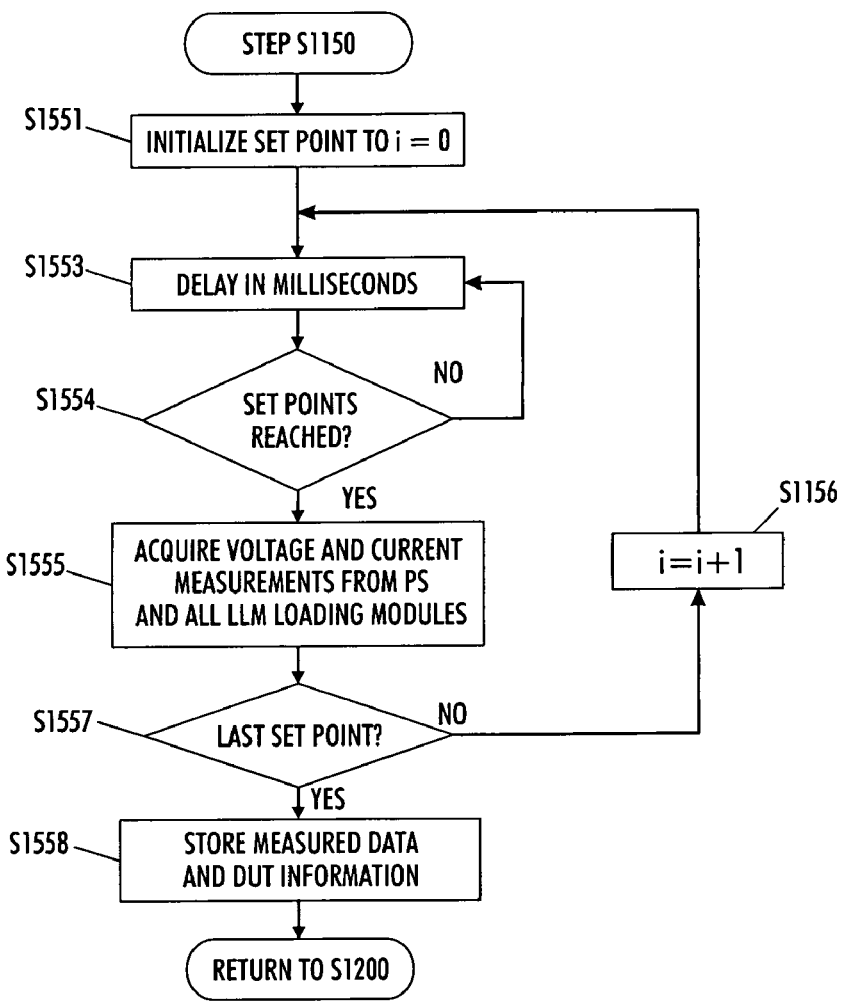

At S1130, sensor values are acquired from each sensor in the health monitoring unit using an analog-to-digital converter (ADC). The ADC digitizes the output of each sensor and sends the results to a processor. Next, in step S1150, the ATE acquires monitoring data by performing an automated test. Each automated test is executed using a profile, or collection, of pre-determined operating points, or set points. Each set point is used to apply an electrical stimulus to the electric power converter, or the device under test (DUT). The procedure for the automated test is described relative to steps S1551-S1558 (FIG. 2B). The appropriate profile for the DUT is selected from the disk drive or similar storage media or storage device and loaded into memory. Also, the first set point is sent to the digital controllers at the Power Source (PS) and Loading and Measurement Module (LMM). A command is sent to the digital controllers at the PS and LMM to execute the set point. An appropriate amount of time (approximately on the order of milliseconds) is spent waiting for the source module and all of the loading modules of the PS and LMM to adjust to the new set point, respectively.

At step S1554, after the delay, the source module and the loading module are checked to verify each set point was reached to within the tolerance specified by the profile. If the set point is not reached for at least one of the loading modules or source module then step S1553 is repeated. Otherwise, step S1555 is executed. At step S1555 voltage and current measurements made at the PS and loading and measurement module data are sent to the computer using the standard data bus and then stored into memory. The profile is examined at step S1556 for additional set points. If more set points are available then step S1557 is executed, otherwise step S558) is executed. The next set point is then sent to the digital controls at the PS and LMM. At step S1558, all of the acquired measurements made in step S1555 are saved to the disk along with information uniquely identifying the device, such as the serial number, model, and manufacturer.

After monitoring the data, performance metrics are calculated at step S1200 using explicit analytical expressions in term of monitored data values. All calculations are made using a microprocessor, processor or embedded processor. Performance metrics are calculated for each acquired set of monitored values.

Next, at step S1300, a fuzzy, neural network or fuzzy-neural network is used to separate the acquired monitored values and associated performance metrics into multiple data classes, or distinct groups.

Performance models are generated (step S1400) using performance metrics and monitoring values associated with each data class. A performance model may consist of an analytical best-fit expression or a neural network that relates the performance metrics with the monitoring values for each data class. Other examples, include a comparison of two performance models generated using a neural network and analytical model, respectively, with the measured performance metric loss resistance.

In the training of diagnostic models step S1500, the diagnostic models are used to represent characteristics, or features, of the electronic systems' operational lifetime. This period is also referred to the normal health-state. Diagnostic models are performance models generated from a series of past or historical, monitoring values and performance metrics to characterize, or baseline, the healthy or normal health-state of the system. The diagnostic models may be updated periodically during the lifetime of the system and are stored in a non-volatile memory or recorded in another medium for later access.

Diagnostic features are extracted (step S1600) from monitored values by comparing measured performance history with the trained diagnostic model for each class using statistical analysis, trend analysis, threshold analysis, pattern analysis, quantitative state estimation, and signal processing techniques.

A health assessment is generated at step 1700, where a neural network, neural-fuzzy network, Bayesian network, causal network, rule-based system, or an expert system is used to combine the diagnostic features into a health assessment for the power converter. The health assessment identifies the source of the fault by isolating down to a component or a group of components, probability of overall system failure, and an estimate of the remaining useful lifetime (RUL) [e.g., in units of time or other time-related metric] of the system. The RUL is generated using trending analysis, quantitative state estimation techniques, and qualitative state estimation techniques.

Trained models, health assessments and RUL predictions are stored in rewritable non-volatile memory such as flash memory, hard disk drive and magnetic memory as represented by S1800. Also, stored are historical monitoring values and associated performance metrics used to update the trained diagnostic models in step S1500. At step S1900 the health assessment is reported or sent to a third party hardware or software module either via a digital communication protocol or displayed to a human operator using visual indicators such as light-emitting diodes (LEDs) and electronic displays.

Methodology 1—Use of existing electronic systems data (Circuit as a Sensor): The use of data and signals already present in a system for the purposes of diagnostics and prognostics is a method of analysis with a wide range of potential benefits and applications. This process is also referred to as the "circuit-as-a-sensor" (CAS) approach. The objective of this approach is to analyze all available forms of information present within the system already, and fuse together critical data relevant to the health state of the device. After desired parameters (S1100) have been selected, the device is then analyzed in a variety of potential operating environments in order to determine ranges of variation on the critical parameters previously selected. Monitoring of critical parameters also occurs as the device progresses on the path from fully operational to device failure. During the monitoring and data collection phase, the procedure implements device mode detection and analysis techniques to differentiate between useful device data and device data that may be irrelevant due to undesirable device conditions. Once a comprehensive knowledge base is developed for all critical parameters, individual parameter models (S1400) can be generated and combined to create an overall device model. Once critical parameters have been identified and analyzed under a variety of possible operating conditions, the information obtained through analysis can be combined with observed device operation to generate performance metrics used in classifying (S1700) various operating stages of the device. At this stage in the process, device models can be extracted and adjusted based on simulation and experimental data. Once the device model has undergone extensive simulated and experimental analysis, device health assessments can be accurately formed.

Figure 3:
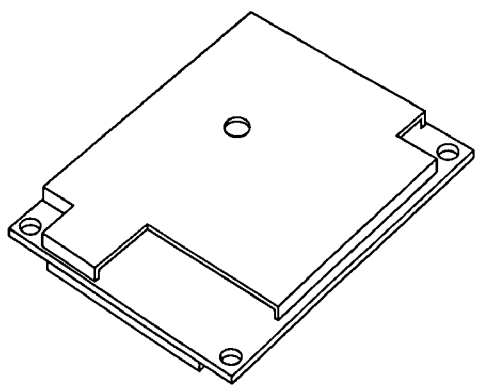
FIG. 3 is an illustrative example of a global positioning device that provides an embodiment for the disclosed system.

The Garmin GPS 15L-W, shown in FIG. 3 was selected for failure mode analysis and accelerated failure testing. The Garmin GPS was selected because of the thorough documentation, its commercial, off-the-shelf, availability and cost, it included embedded temperature sensing thermocouples and has a relatively small form factor.

Although it is to be understood that the disclosed embodiments have broad and extensive applicability to non-GPS and non-avionic systems, the following background is useful in order to set the context in which the GPS embodiment was developed and tested. The global positioning system (GPS) is a space-based radio-navigation system managed by the U.S. Air Force (USAF). GPS, originally developed as a military force enhancement system, supports the existence of two different services: the Precise Positioning Service (PPS) and the Standard Positioning Service (SPS). The PPS is reserved for military use and requires special PPS receivers to access the system, while the SPS is available to civilian users throughout the world. Fundamentally, both services operate on the same principles. Accuracy is the main difference between the two systems; the SPS provides a less accurate positioning capability than its counterpart; Global Positioning System Standard Positioning Service Signal Specification, Department of Defense, 1993; hereby incorporated by reference in its entirety.

The GPS constellation includes twenty-four satellites in continuous operation with six additional backup satellites, each having an orbital radius of 26559.7 km. All satellites in the constellation are separated into six groups consisting of four satellites per group and are separated 60° apart with a maximum angle of inclination of 55° from the equator. Additionally, the satellites are designed to provide reliable service over a 7 to 10 year life time. Every active satellite broadcasts a navigation message based upon data periodically uploaded from the Control Segment (CS), which continuously monitors the reliability and accuracy of each satellite. All GPS systems consist of three major subsystems: (i) GPS Satellites; (ii) Transmission Paths; and (iii) GPS Receivers Failure Mode Analysis A study of stand-alone GPS receivers that met Federal Aviation Administration TSO C-129 requirements found that the probability of a receiver outage from a software-related problem was much greater than the occurrence of a total device failure (see e.g., Nisner, P. D., and R. Johannessen: Ten Million Points From TSO Approved Aviation Navigation: Journal of the Instate of Navication, Vol. 47, No. 1. Institute of Navigation, Fairfax, Va. (Spring 2000) 43-50; hereby incorporated by reference in its entirety). To explain this phenomenon, a physical understanding of GPS receiver failure is required.

Failure mode analysis, starting at the device level, is essential to show that software failure modes manifest from small physical deviations in high frequency analog circuits. In failure mode analysis, circuit models are developed to simulate a circuit's performance when damage accumulates in discrete components. Monte Carlo simulation utilizes these device-level circuit models to analyze the changes in performance characteristics of the high frequency analog circuits. Then a system-level, fault-to-failure progression model is developed based on changes in circuit performance characteristics. The identified features from the system-level model describe the fault-to-failure transition.

Component Identification

Figure 4:
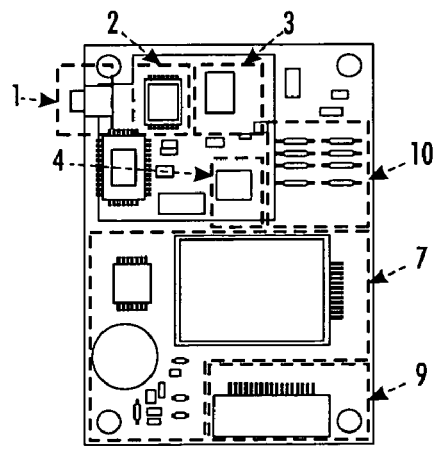
FIGS. 4-5 illustrate example printed circuit board layouts (e.g., front and rear sides of a GPS receiver circuit board) of the global positioning system receiver depicted in FIG. 3.
Figure 5:
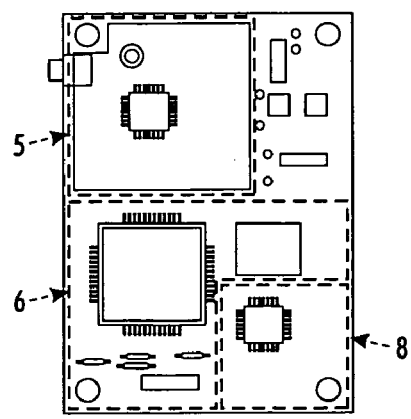

Identification of the critical components in the target application is required before any failure mode analysis is performed. A critical component is a discrete element, such as a single transistor, or a relatively complicated circuit, such as a radio-frequency (RF) mixer, that contains a relatively high probability (or risk) of failure. FIGS. 4 and 5 present example board layouts of the GPS receiver investigated. Table 1 provides a summarized reference of critical components with an associated number and color to identify the component name and circuit type.

TABLE 1

Component Reference Table

| | | Circuit Type | | | |
|---|---|---|---|---|---|
| No. | Circuit or Device | Low Freq. Analog | High Freq. Analog | Low Imped-ance | High Imped-ance |
| 1 | Antenna | | X | | |
| 2 | Low Noise Amplifier | | X | | |
| 3 | Bandpass Filter | | X | | |
| 4 | RF Mixers | | X | | |
| 5 | Crystal Oscillator | | X | | |
| 6 | Digital Signal Processor | | | | X |
| 7 | Flash Memory | | | | X |
| 8 | Serial Drive | | | | X |
| 9 | Serial Port | | | | X |
| 10 | Voltage Regulator | | | X | |

Circuit Analysis

Many high frequency analog circuits, such as RF mixers and RF low noise amplifiers (LNA), are implemented with MOSFET devices. These circuits are sensitive to device variations at frequencies exceeding 1 GHz. Therefore, variation in any device, either active or passive, can cause the following circuit characteristics to change: (i) Phase response; (ii) Frequency response; (iii) Linearity; (iv) Gain; and (v) Impedance matching.

Figure 6:
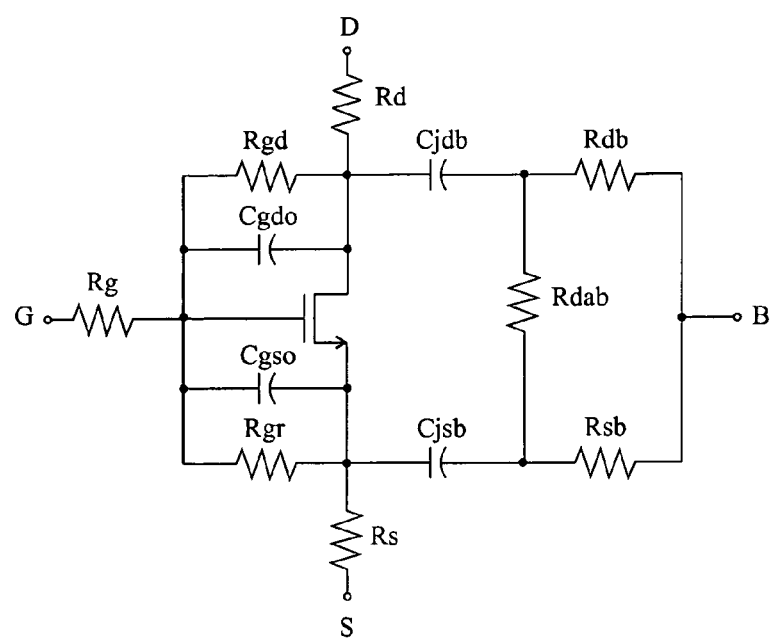
FIG. 6 is an illustration of a damage accumulation model used in accordance with an aspect of the disclosed system and method.
Figure 7:
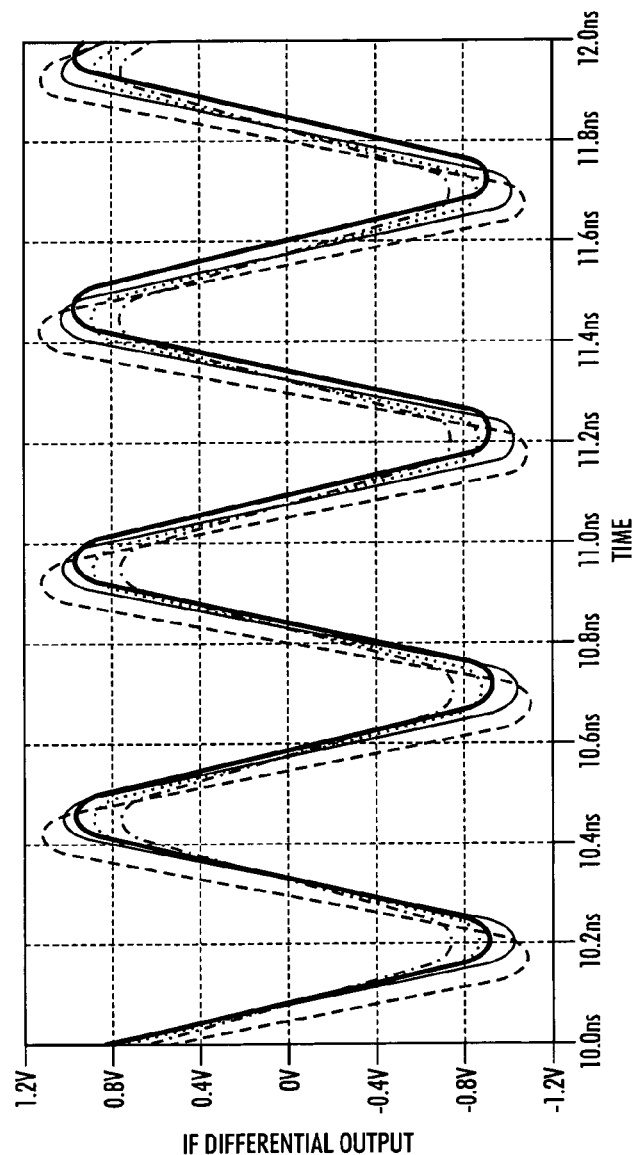
FIG. 7 is a graphical representation of the results of a Monte Carlo analysis across multiple trials.

RF mixers are composed of transistors and traditional passive devices including inductors, capacitors, and resistors. A Monte Carlo worst-case analysis was performed on a RF mixer circuit. The time-dependent dioxide breakdown (TDDB) damage accumulation model, shown in FIG. 6, replaced the MOSFET devices in both circuits. The equivalent gate-to-source capacitance ($C_{gso}$) provided a damage accumulation parameter with a tolerance of 10%. FIG. 7 shows the results of the Monte Carlo analysis. The time domain phase of the RF mixer plots for ten different trials indicated a maximum phase difference between any two plots of about ten percent.

System Analysis

Figure 8:
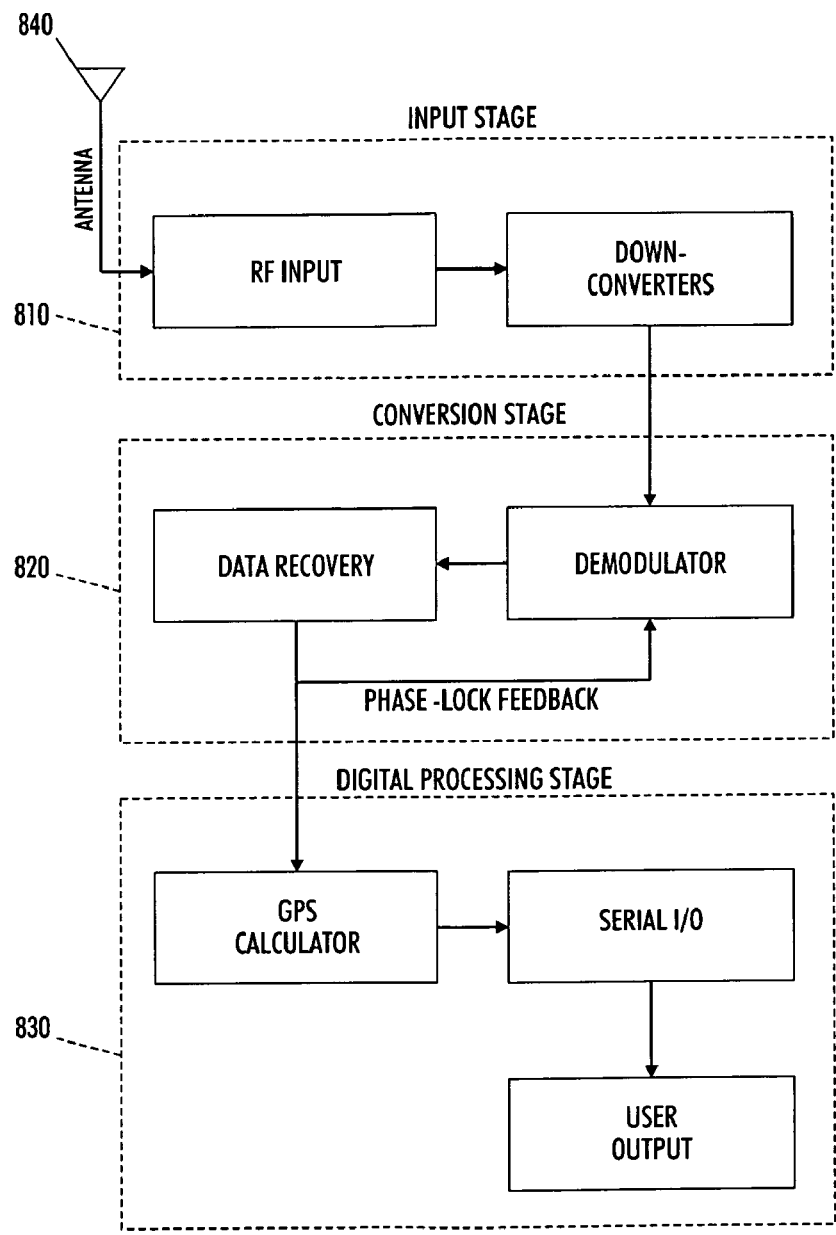
FIG. 8 is a block diagram of an exemplary global positioning system receiver.

Analyzing a sophisticated electronic system using a schematic can be rather complex. Instead, a system diagram can be used to model system functionality by representing the functionality of the electronic system. For example, FIG. 8 shows a block diagram of a GPS receiver 800. A GPS receiver 800 typically includes three fundamental stages: (i) Input stage 810; (ii) Conversion stage 820; (iii) Processing stage 830, as well as an antenna 840.

These stages are very interrelated because of the complex nature of the GPS receiver. The input stage is the first stage in any GPS receiver. The front end of the input stage 810 includes an antenna 840 and a RF amplifier. The conversion stage 820 demodulates the incoming RF signal for data recovery. It includes the demodulator, phase-lock feedback mechanism, and data recovery/reconstruction. In a basic binary phase shift keying (BPSK) system, the output from the RF amplifier is down-converted to a lower frequency or an intermediate frequency (IF) and mixed with quadrature local-oscillator (LO) signals. The composite signal is then fed back to phase-lock to the carrier. Low pass filtering the outputs of one of the mixers recovers the data as described by Chenming Hu and Qiang Lu, "A unified gate oxide reliability model," In IEEE International Reliability Physics Symposium, pages 47-51, 1999; which is hereby incorporated by reference in its entirety. The data can be digitally processed once it is recovered from the RF signal. The digital processing stage recovers the navigation messages by continuously synchronizing each satellite's gold code with the incoming data stream.

The overall reliability of a GPS receiver depends on the tolerance of each subsystem. The two largest reliability concerns include the low noise amplifier (LNA) and the RF mixers. As shown earlier, changes in phase response, frequency response, impedance mismatching, and linearity were all attributed to device-level degradation of MOSFET devices. Consequently, synchronizing errors occur when the digital processing stage decodes the incoming data stream. The end result is a reduction in coverage of the GPS receiver which triggers two typical failure modes:

Precision Failure—increased position error
Solution Failure—increased outage probability These failure conditions result in measurable parameter changes during failure progression.

Failure Modes and Effects

Failure mode, effects, and criticality analysis, or "FMECA," is a method of analysis used to understand the root cause of failures, along with their relative probability of occurrence, criticality, and their effects on a system. The FMECA used for the GPS receiver in accordance with an embodiment described herein provided a complete description of the fault-to-failure progression.

Feature Extraction

A basic building block of the procedure is the selection and analysis of the features that will form the skeleton of the device model used for health assessment. A diagnostic feature is a system parameter (or derived system parameter) that is sensitive to the functional degradation of one or more circuits contained in the system. Diagnostic features can be used to predict the occurrence of an undesired system event or failure mode. Direct measurements of diagnostic features are typically not feasible because they require advanced and usually impractical measuring techniques. However, system-level features can provide valuable and easily obtainable diagnostic and prognostic information. For example, in a GPS receiver there are system-level features that are universal to every receiver. Most receivers report these features using the National Marine Electronics Association (NMEA) 0183 protocol. Therefore, data acquisition techniques require only an RS232 connection from a computer to a receiver.

The system features are selected based on potential contribution to health state analysis, feasibility of extraction, and level of analysis required to produce meaningful information. Below is a list of critical parameters in GPS systems that are used to make accurate heath assessments of such devices.

Figure 9:
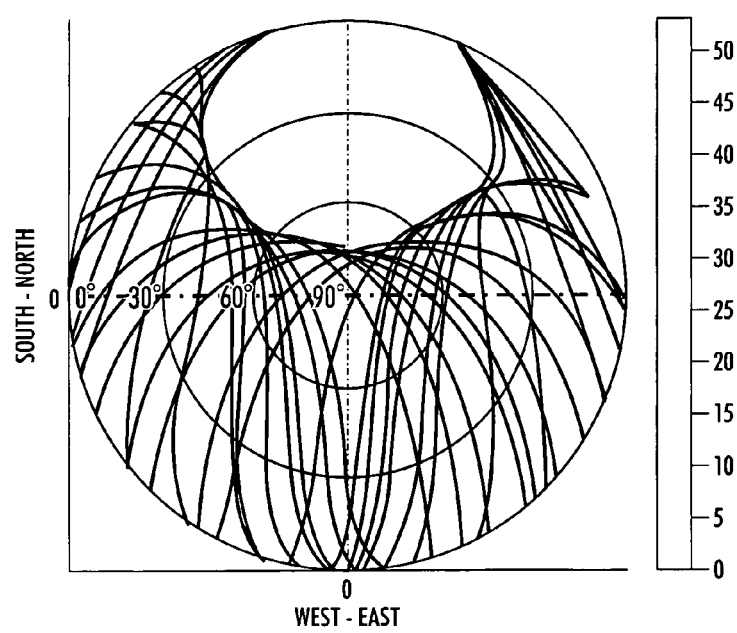
FIG. 9 is a skyplot of recorded signal-to-noise data.
Figure 10A:
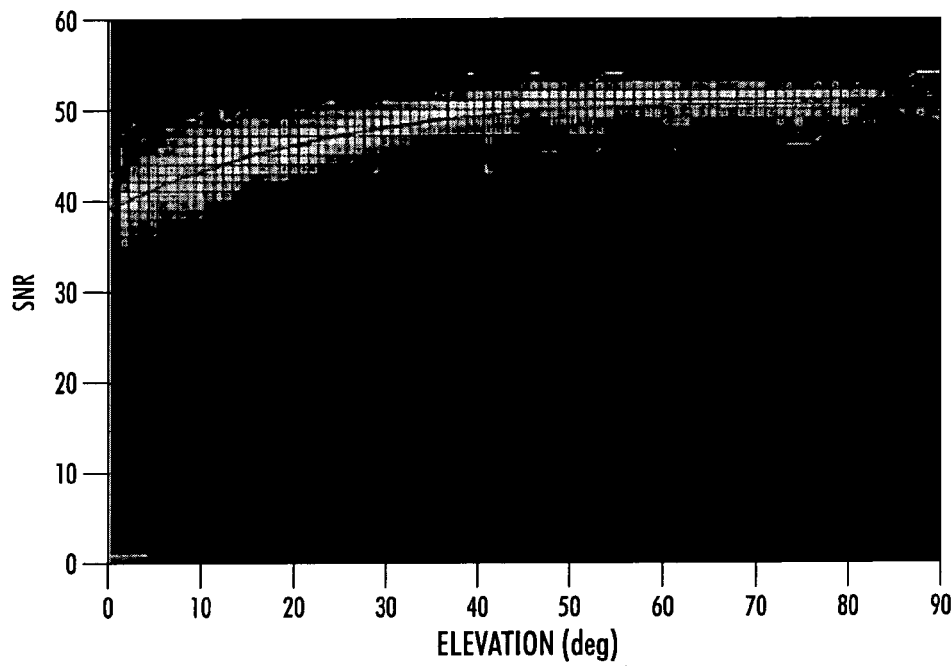
FIG. 10A is a plot for a histogram of normalized signal-to-noise ratio and FIG. 10B is a density plot of signal-to-noise ratio versus elevation.

SNR—Signal-to-Noise-Ratio is a measure of the amount of actual signal power divided by the total noise power present. This feature is readily available and provided via the NMEA protocol, and can be interpreted via detailed analysis to demonstrate relevance to health assessment procedures. The targeted SNR diagnostic feature was extracted from the skyplot (e.g., FIG. 9). A density plot of SNR vs. elevation angle was generated as illustrated in FIG. 10A. The density plot was generated assuming that SNR was independent of the azimuth angle. This assumption is believed valid for measurements where the elevation angle is greater than 30°.

Figure 10B:
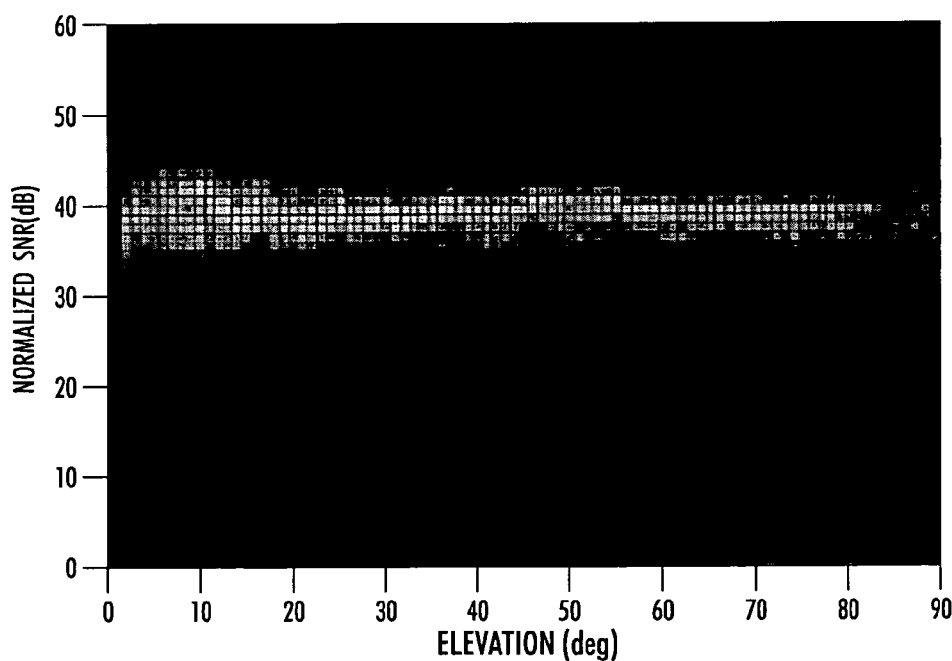
Figure 11:
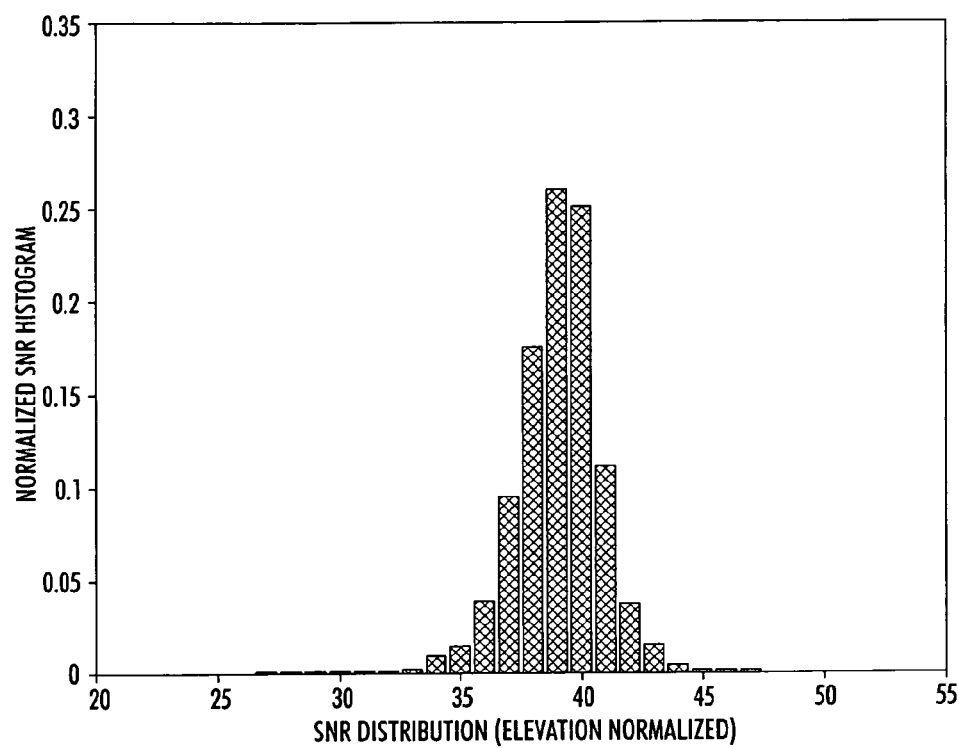
FIG. 11 is a histogram of normalized signal-to-noise ratio data.

The SNR data used to generate the density plot fit provides a fourth order system model. The fitting parameters (or coefficients) used in the fitting model were generated by taking the average values of the fitting parameters for twelve different data sets. The only degree of freedom in the model is the SNR offset coefficient $A_o$ of the fitting model in Equation 1. The SNR data was normalized using the fitting model, shown in FIG. 10B, showing a Gaussian distribution as illustrated in FIG. 11. The distribution of the normalized SNR data had a standard deviation of approximately 1.6.

$$SNR = A_o + (0.4878)\phi - (7.849 \times 10^{-3})\phi^2 + (5.710 \times 10^{-5})\phi^3 - (1.586 \times 10^{-7})\phi^4 \qquad \text{Equation 1}$$

BER—Bit-error-rate or bit-error-ratio is a parameter used to measure the accuracy of a system subjected to the presence of electrical noise. It is often calculated as the number of erroneous or incorrect bits received divided by the total number of bits transmitted. All real world electronic systems dealing with transmission and reception of data through a realistic communication channel will be subjected to the effects of electrical noise. BER was chosen as a critical parameter for its universal presence in digital communication schemes, ease of calculation/extraction from devices, as well as a proven capability to indicate trends relative to device health.

As mentioned previously, BER is ubiquitous is communication systems with digital components, making it an ideal candidate for further analysis into potential application in diagnostics and prognostics of electronic communication systems. Further analysis was then performed to determine the ease of extraction of the BER information as well as health indication capability. BER in GPS systems can be calculated through transmission of pseudorandom noise (PN) sequences or basically any type of data that is known at transmission, and then the received information is compared to the known transmitted data. This allows for a simple and accurate method to obtain the BER of a system, qualifying it for another desired characteristic of critical health parameters, ease of extraction. Since BER is present in most GPS systems and can also be extracted fairly easily from GPS systems, it was then analyzed for its performance in health prediction. The last component of parameter analysis was determined through successful simulation and hardware experimentation. Simulations were created and ran with variation of particular parameters implemented to simulate values that would be produced by a degraded system. Particular parameters that were varied within the simulation included thermal noise, DC offset, phase offset, phase noise, and antenna gain. Monitoring the BER values of a communication system as parameters were modified to simulate degradation of the system provided confirmation that BER is affected as the system is degraded. Values were then taken from the simulations to generate a representative model for BER as a device progresses from healthy to failure. Test bench experiments were then implemented with a GPS data simulator and GPS receivers. This allowed the calculation of BER for an equivalent GPS system and the ability to analyze the accuracy of the BER model as generated from the simulation. A range of GPS receivers were used, each exposed to a different level of degradation. The use of the GPS data simulator allowed prior knowledge of transmitted information, which is then compared to information obtained from the degraded receiver units. Vast amount of BER data was produced, giving the ability to fine tune the degradation model developed in software. The model is then modified taking into considerations developed from the test bench experiments. The end result is a refined model for BER in GPS systems, covering from a healthy device to failure. This resulting model is then fused or integrated with similar or alternative models for other critical parameters, providing the final device model.

Figure 12:
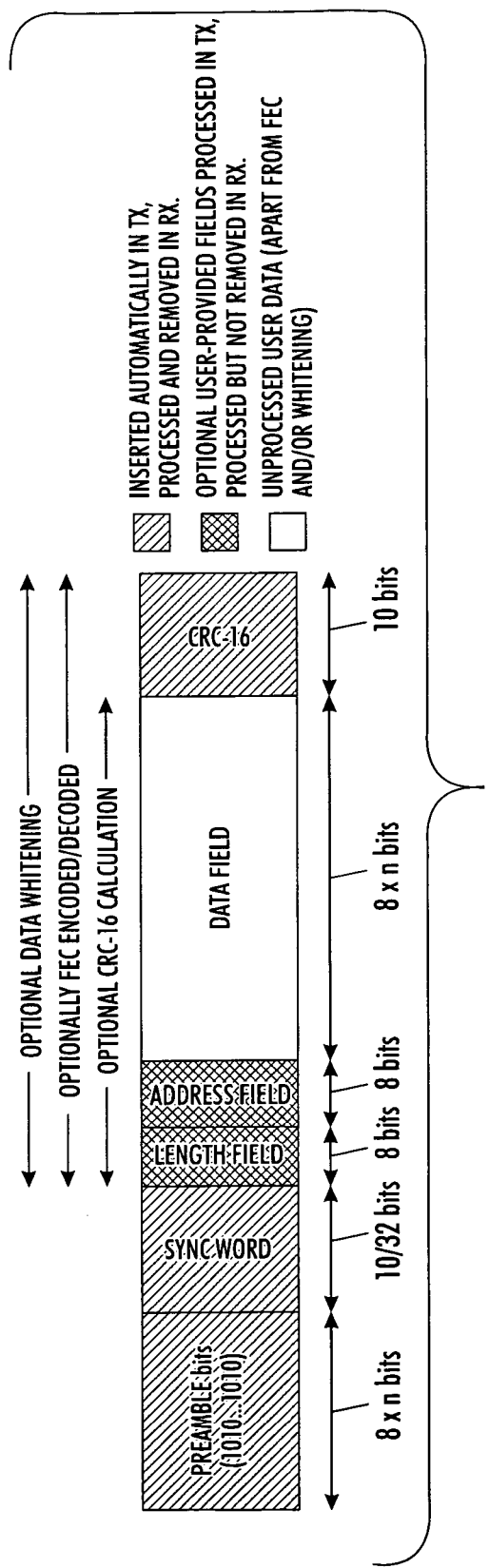
FIG. 12 illustrates an exemplary format of a data packet.

CRC—Cyclic-redundancy-check is a fault detection method included in most communication protocols that is used to determine if data that has been received has been altered by noise during transmission. The CRC is essentially a mathematical function that takes as an input the data of a frame and a predetermined polynomial, dividing the frame data by the polynomial, with the result producing a CRC value. The data at the transmitter is appended with a CRC number which is verified by the receiver—see FIG. 12 which illustrates an exemplary format of a data packet. The CRC error reflects the number of packets that have a mismatch between the CRC number at the receiver and transmitter.

As with BER, CRC is a very common parameter in most communication protocols, including those used in GPS, making it ideal for implementation. The potential application of the CRC parameter was also looked into due to the ease of extraction. The CRC data is included within the transmitted and received data (data packet format in FIG. 12), making the process of extraction relatively easy as compared to other types of data. Analysis of CRC applicability to health assessment was performed through a detailed hardware experimentation using master/slave combinations of healthy and degraded boards communicating at various rates, frequencies, and distances.

LQI—Link Quality Indicator is a parameter that is included with the NMEA standard commonly used for GPS devices. The Link Quality Indicator in most GPS devices has a variety of potential values as shown below:
0—fix not available,
1—GPS fix,
2—Differential GPS fix
3=PPS fix
4=Real Time Kinematic
5=Float RTK
6=estimated (dead reckoning)
7=Manual input mode
8=Simulation mode Although the information that could be gained from the LQI parameter has relatively low resolution in terms of detail it provides, the readily accessible nature of the parameter makes it an ideal candidate to provide more information to compliment the other critical parameters being observed.

RSSI—The Received Signal Strength Indication value is an estimate of the signal level in the current channel. This value is based on the current gain setting in the RX chain and the measured signal level in the channel. Typical values for RSSI offset are presented in Table 2. This parameter is readily available as it is included in the NMEA standard and easily extractable as an integer value from the frame in which it is contained. Similar range tests were conducted as with previous parameters, the goal being to observe the relationship between device health and RSSI. Signal strength is an obvious choice for a critical parameter as it has potential value as an indicator in degradation of the receiver circuitry, but also has potential to be a significant indicator in mode detection procedures.

TABLE 2

RSSI Offset Values

| Data rate | RSSI |
|---|---|
| 2.4 kbps | 71 |
| 10 kbps | 69 |
| 250 kbps | 72 |
| 500 kbps | 72 |

FO—Frequency Offset refers to the offset between the transmitted frequency and the received frequency. When using FSK, GFSK or MSK modulation, the demodulator compensates for the offset between the transmitter and receiver frequency, within certain limits, by estimating the centre of the received data. Previous studies have indicated that analog RF components are very sensitive to stress factors. It is estimated that minor changes in frequency synthesis capability will manifest as changes in the frequency offset value.

A health state analysis technique that uses existing system data could potentially become unreliable or inaccurate if the system data used in parameter and device modeling becomes invalid. Invalid system data could be the result of a variety of events that would cause the system to operate incorrectly, which in turn provides faulty data to the parameter and device models, resulting in inaccurate trending, false alarms, non-detection of failure, or a variety of other undesirable results. The purpose of mode detection is to verify that the device or system is operating normally and therefore the data collected for device and system modeling will provide accurate and reliable predictions of health status. Successful mode detection is accomplished through a combination of real-time and historical analysis of available parameters containing information about the operating mode of the device.

Similar to the process of parameter selection mentioned above, parameters are carefully chosen that will provide existing, relative, and extractable information about the device mode. Parameters related to the operational information of GPS devices can be determined through the use of the available data sentences provided to conform to the NMEA protocol. Relevant parameters are listed below:

LQI—This is the same parameter that is mentioned above in the health assessment feature section. This parameter is one of the most basic pieces of information used in mode detection, as it describes whether or not the device is able to obtain a fix on the satellites. As before, its inclusion in the NMEA protocol provides that devices conforming to the popular standard will have this information readily available.

NOS—Number of satellites in use is a parameter readily available in the data sentences and is used in mode detection for GPS devices. In order for a GPS receiver to function properly, a minimum of four satellites must be in use to assure functionality.

DOP—Dilution of precision or other dilution of precision measurements (HDOP, VDOP, PDOP, and TDOP) is a measure of the confidence level in the determination of the receiver precision. The parameter is used in mode detection analysis for weighting the information received. When the DOP parameter is ideal at a value of 1, the information provided for modeling should be considered higher priority than information obtained when the parameter is much higher.

GPS devices also posses capabilities to include proprietary sentence data, which also provides valuable information in determining valid modes for system data collection and analysis. Beneficial Garmin proprietary parameters are listed below:

Receiver Failure—This is a discrete value available to the device which indicates whether the device is functioning or not.

ROM Checksum Test—Indicates if the device memory is functioning correctly.

Stored Data Lost—Indicates if the data has maintained information from previous operating instances.

RTC—Identifies the ability of the device to maintain a real-time clock. Since a real time clock is critical to GPS applications, a failure of the clock would result in device inoperability.

OD—Oscillator drift (OD) can be detected within the device and indicated within a data sentence. Excessive oscillator drift would create erroneous results and poor data to modify models with.

Device Temperature—If the device is operating outside of its functional specification the device is not guaranteed to produce valid results.

Accelerated Failure Testing

Figure 13:
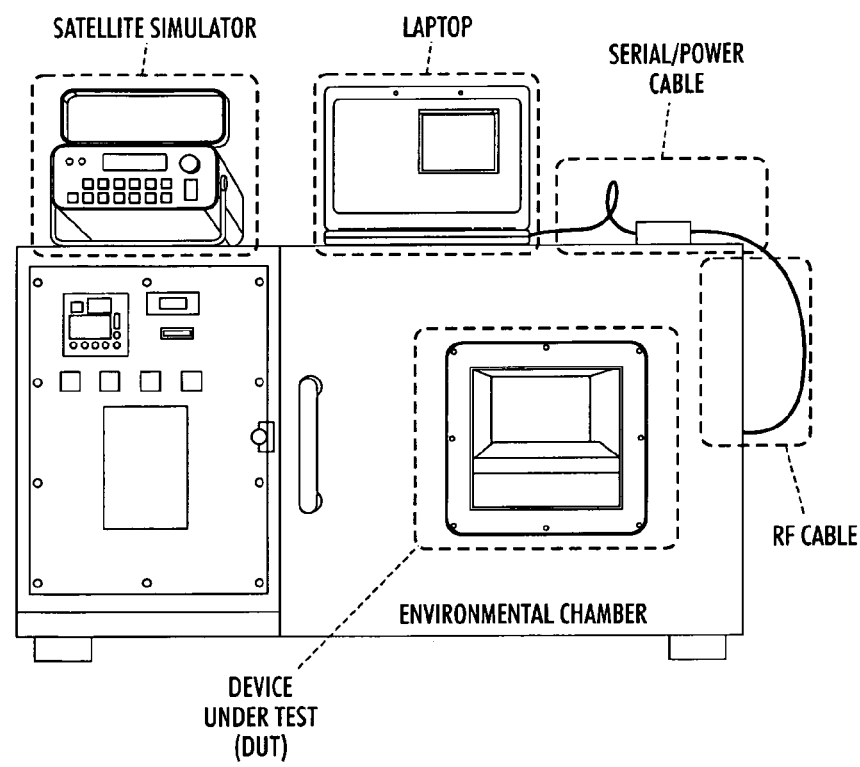
FIG. 13 is an exemplary illustration of an accelerated failure test setup.

Accelerated failure testing validated the derived diagnostic feature set. Accelerated failure testing is the process of determining the reliability of an electronic system over a short period of time by accelerating environmental conditions as described by the MIL-STD-810 specification [Silverman, Mike, "Summary of HALT and HASS Results at an Accelerated Reliability Test Center," 1996; hereby incorporated by reference in its entirety]. The accelerated tests consisted of placing a GPS receiver (e.g., Garmin GPS 15L-W) under thermal cycling stress. During the test, the GPS receivers received a constant reference signal from a GPS satellite simulator located approximately six feet away. A laptop monitored the features using a RS-232 connection. The laptop, including RS-232 buffer memory, and digital memory (RAM, disk or removable media), stored the features (including principal feature) in memory for analysis. In a real-time embodiment, such features may be similarly stored and analyzed to track the performance of the device being monitored. GPS testing was halted approximately every 100 cycles to record live constellation data (DUT). The cycle time lasted about forty minutes for each test. FIG. 13 shows an exemplary setup for the accelerated failure test.

Once all the desired critical parameters have been identified, experiments are performed in simulation and with actual devices to generate valid parameter and device models, allowing for accurate system health assessment. Computer software simulations are performed to obtain a general assessment of how the desired system is performing and how varying parameters will affect system results. This allows actual device experiments to be created and provides indications as to the type of results that should be expected from the actual device experiments. Although the simulations are created with real life parameters built in to the simulation, it is impossible to perfectly replicate an actual functioning environment with computer software. Due to imperfect environmental matches between software simulations and real-world environments, the results of the simulations and device experiments will differ. The information generated from software simulations form the backbone of the models used to represent the system. Once hardware experiments are performed in the lab, the variations in results from the simulated results are analyzed and hybrid models are formed out of an integration or fusion of software and hardware models, with real-world factors accounted for within the model.

Electronic devices with both RF and digital components are becoming more and more common as technology advances, resulting in a variety of possible software and hardware experiments available in the RF/digital area. GPS devices are based on high frequency communication between satellites in orbit and devices present on the earth's surface. Simulations of radio frequency links were performed to analyze the communication link present in GPS devices. The simulation reports a variety of parameter information such as bit-error-rate, signal power, and constellation data. As discussed previously, these parameters are critical in health assessment and can be analyzed with ease. With a working simulation and developed expectations as to how the system should perform in a real-world environment, actual hardware experiments can then be performed to analyze differences in simulation and finalize models for maximum accuracy.

Experimental Results

Figure 14:
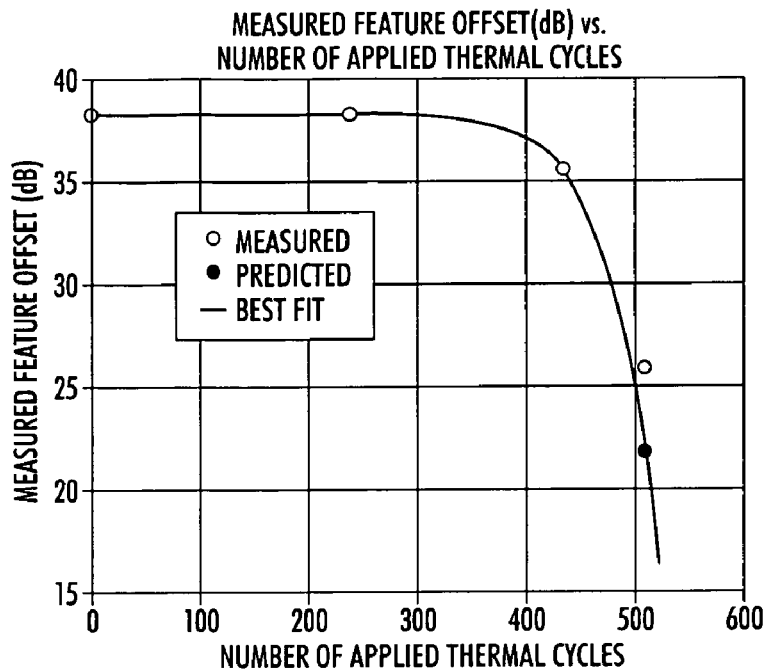
FIGS. 14-15 are exemplary plots depicting the relationship of the measured feature offset.
Figure 15:
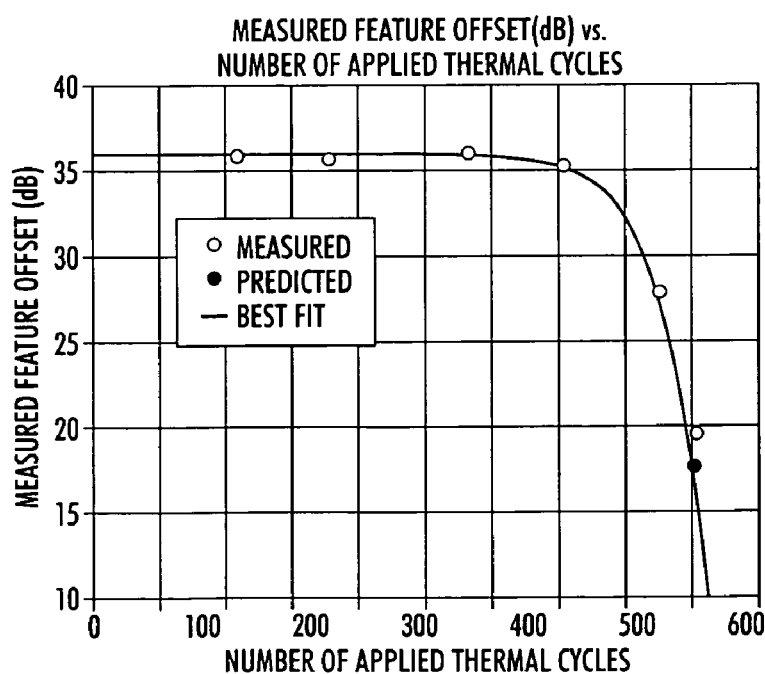

GPS: Two Garmin GPS receivers were tested to failure. The first GPS receiver (S/N 81417589) failed after approximately 500 cycles. According to the test logs, the environmental chamber was set to cycle between −40° C. and 95° C. with a total cycling time of 40 minutes per cycle. FIG. 14 shows an exemplary illustration of the relationship of the measured feature offset versus the number of applied thermal cycles, illustrating actual, predicted and best-fit information. Principle feature offset was calculated with live constellation data. A solution failure occurred when the offset dropped below 30 dB. Therefore, the last data point was extrapolated using the GPS Satellite Simulator. The second GPS receiver (S/N 81417585) failed after approximately 450 cycles. The environmental chamber was set to cycle between −40° C. and 110° C. with a cycling time of about forty minutes. FIG. 15 shows the results of the experiment run on the second receiver. The first five data points followed an exponential trend as represented in Equation 1. The amount of thermal cycling applied to the GPS receiver after the fifth measurement was determined by using the best fit line in FIG. 15. One thousand minutes (or 25 cycles) of additional accelerated failure testing was necessary to achieve the targeted reduction in feature offset value. The GPS receiver was then subjected to an additional one thousand minutes of thermal cycling and the offset calculated with live constellation data. Further degradation in the principle feature value (PFV) offset resulted.

The equation below calculated the predicted value of PFV offset.

$$PFV = A + B\exp(\lambda N)$$ Equation 2

The best-fit parameters for each test are provided in Table 3 where A, B, and λ are experimental fitting parameters and N represents the number of applied thermal cycles.

TABLE 3

Experimental Fitting Parameters

| Device Under Test | Fitting Parameters (Eq 2) |
|---|---|
| GPS Receiver (S/N 81417589) | A = 38.53 [dB] |
| | B = −2.927e−004 [dB] |
| | λ = 2.1251e−002 |
| GPS Receiver (S/N 81417585) | A = 38.39 [dB] |
| | B = −3.423e−006 [dB] |
| | λ = 3.2197e−002 |

Figure 16:
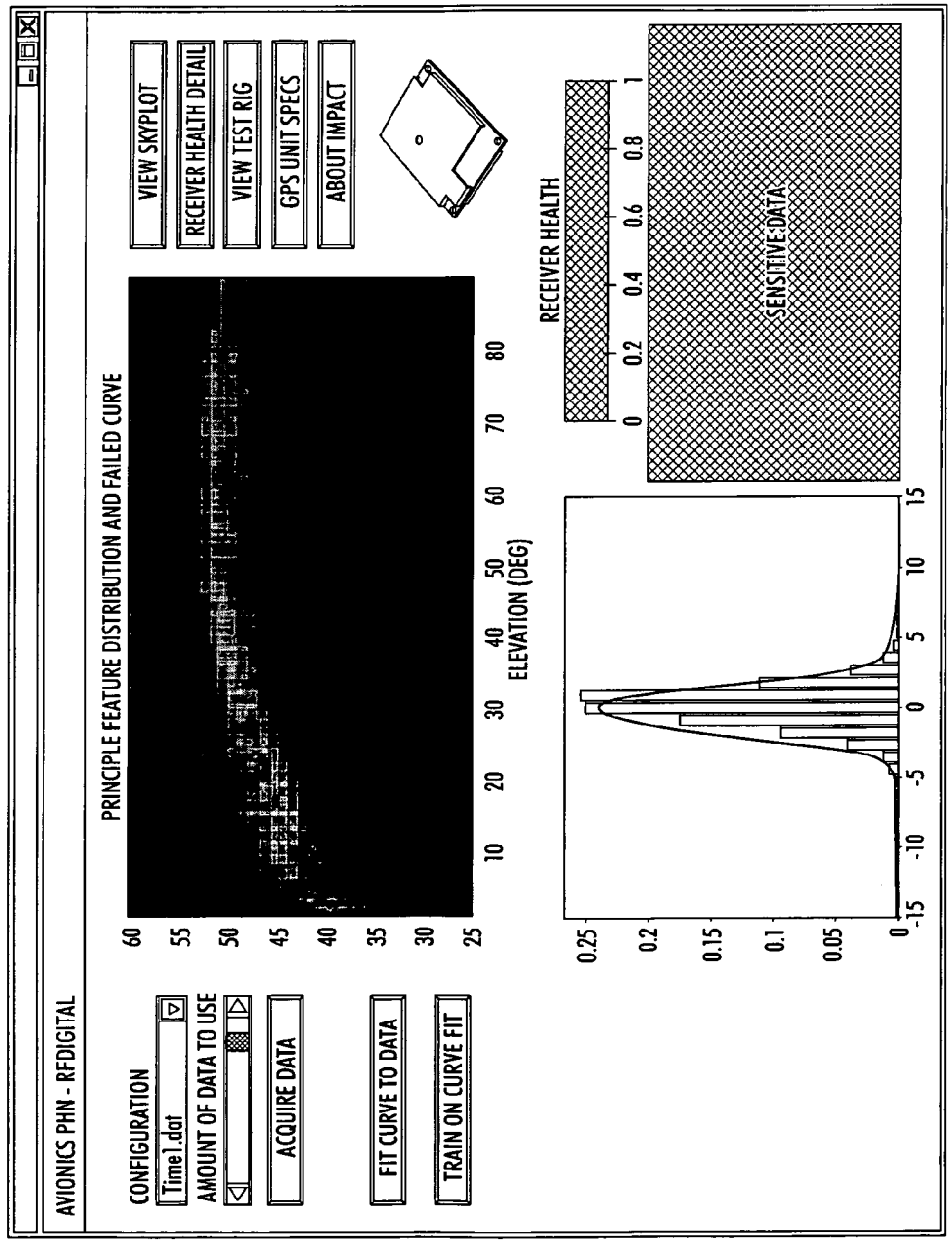
FIGS. 16 and 17 are exemplary graphical user-interface screens depicting, respectively, healthy and degraded global positioning system receiver data in accordance with an aspect of the present invention.
Figure 17:
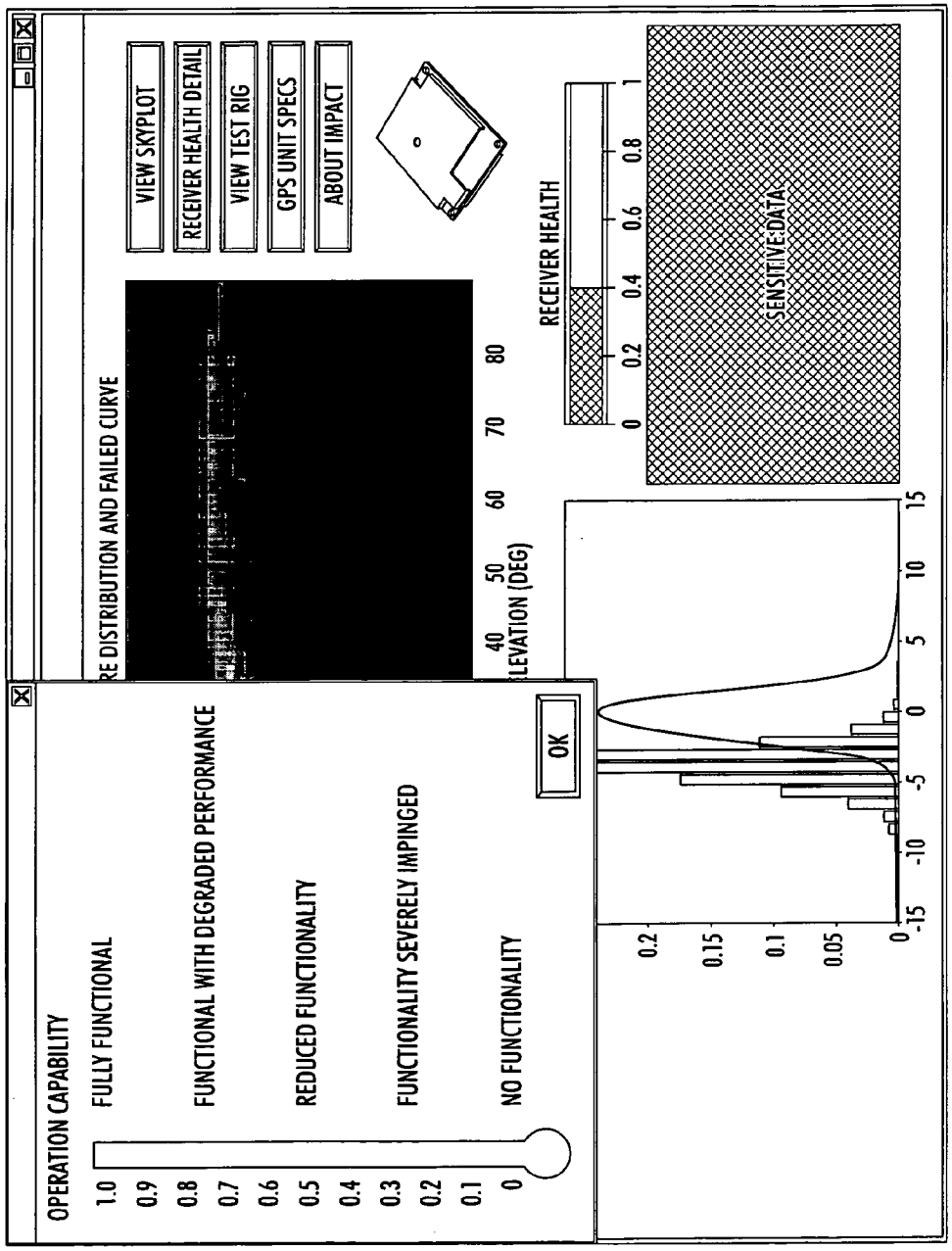

The real-time health monitoring system utilized, in the described embodiment, a MATLAB GUI as part of the experimental set-up. The system used data from the FIG. 16, which shows the PHM results from a healthy Garmin GPS receiver and its associated health index. FIG. 17 shows the PHM results from a degraded Garmin GPS receiver and its associated health index.

Radio-Frequency Integrated Circuit (RFIC): The CC2500 Radio Frequency Integrated Circuit (RFIC) single chip transceiver and SmartRF® 04 Evaluation Board System (FIG. 18C) were selected for hardware testing and experimentation. A population of twelve (12) RFIC chips was used for the failure testing. Seven of these chips were seeded with faults by means of accelerated aging. These chips were quantified to different levels of damage based on the time that they were subjected to elevated temperature conditions. The following table, Table 4, outlines the degradation levels for the chips used in the study.

TABLE 4

Degradation levels of RFIC

| Damage level | Chip No. | Time (seconds) |
|---|---|---|
| Healthy | B5-B1 | 0 |
| Level 1 | S6 | 3300 |
| | S7 | 4200 |
| | S8 | 5100 |
| Level 2 | S9 | 6500 |
| | S10 | 6300 |
| Level 3 | S11 | 6900 |
| | S12 | 7200 |

Figure 18A:
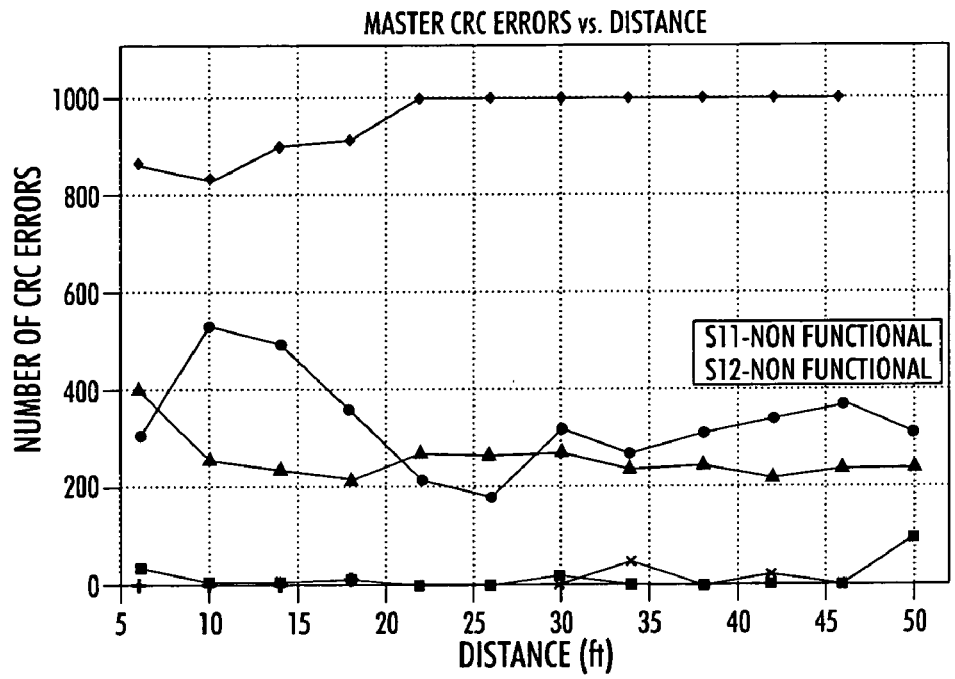
FIGS. 18A and 18B are illustrative graphs of cyclic-redundancy check errors for master and slave units tested.
Figure 18B:
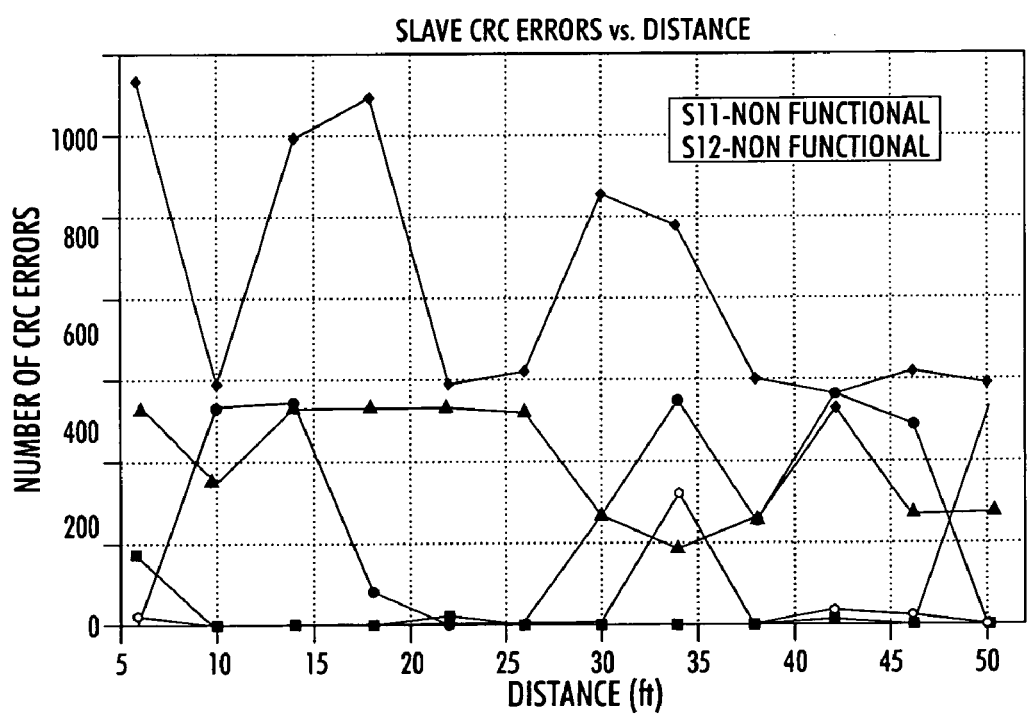
Figure 18C:
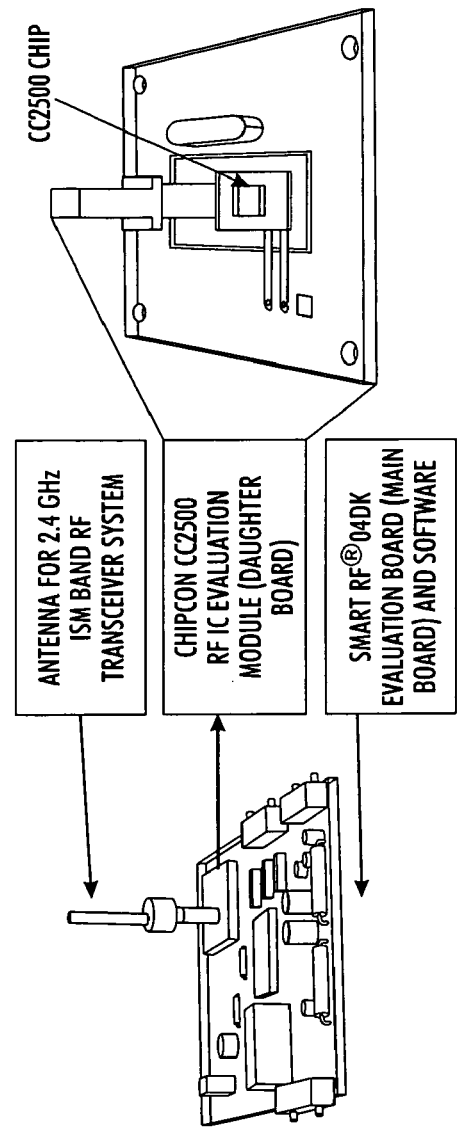
FIG. 18C illustrates an evaluation circuit employed in one embodiment.

The results of the tests for the RFIC were analyzed to determine if CRC had a distinguishable relationship to the health of the unit. The results (see FIG. 18) indicated that CRC does have a noticeable relationship to the health of the unit. FIGS. 18A and 18B show the CRC errors for the Master and Slave Units. With the exception of one chip, a clear distinction can be observed between baseline and seeded fault test CRC data. Two chips exhibited complete communication failure but still retained digital functionality. It was possible to configure and write to the registers of the two chips.

Figure 19A:
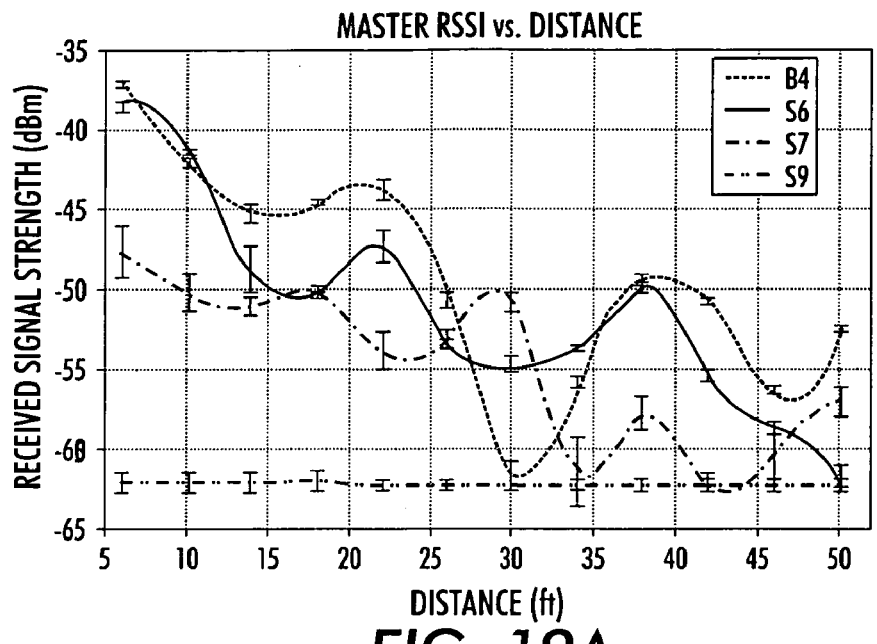
FIGS. 19A and 19B are, respectively, graphs of the received signal strength indicator versus distance for the master and slave devices.
Figure 19B:
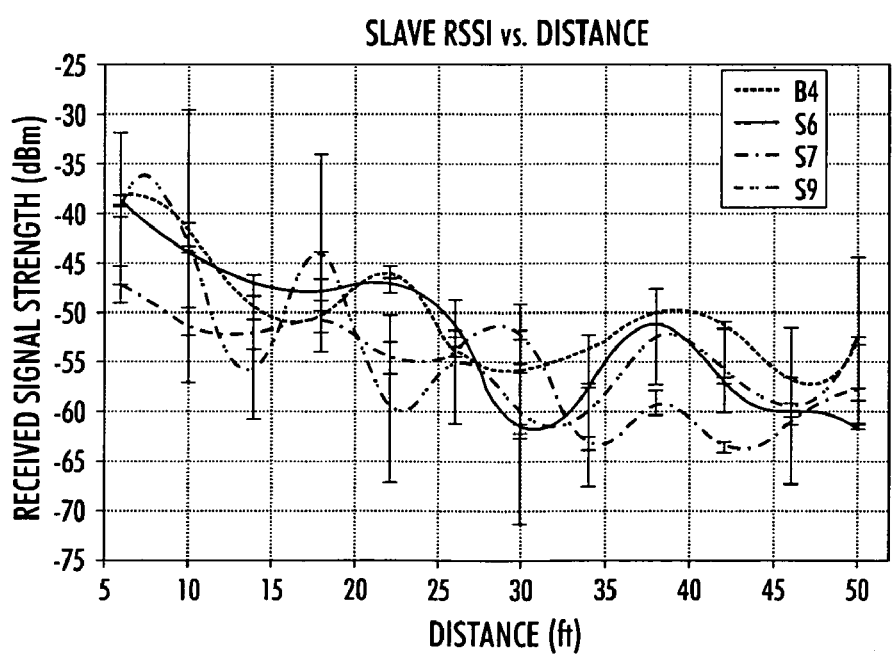

FIG. 19 shows the trend of RSSI value of the chips with the varying distance. As expected, the RSSI value should decrease with increasing distance. Four of the chips are shown for better visual clarity. An offset was also determined in relation to degradation levels.

Figure 20A:
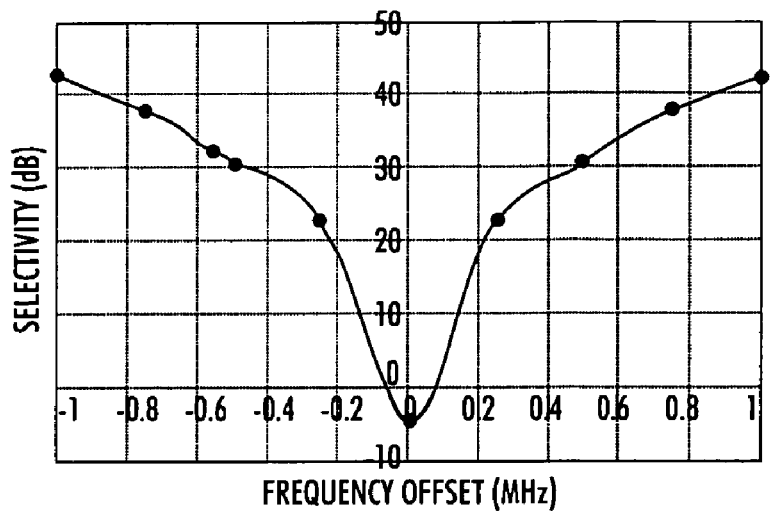
FIGS. 20A and 20B are data plots that illustrate power sensitivity as a function of frequency offset at a fixed data rate.
Figure 20B:
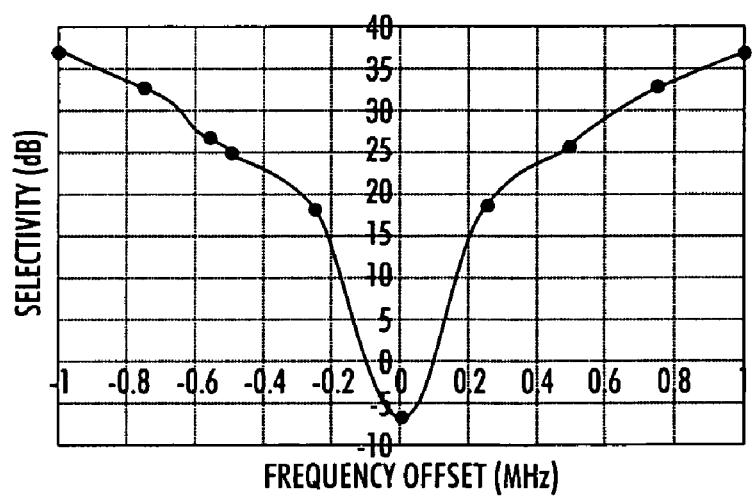
Figure 21A:
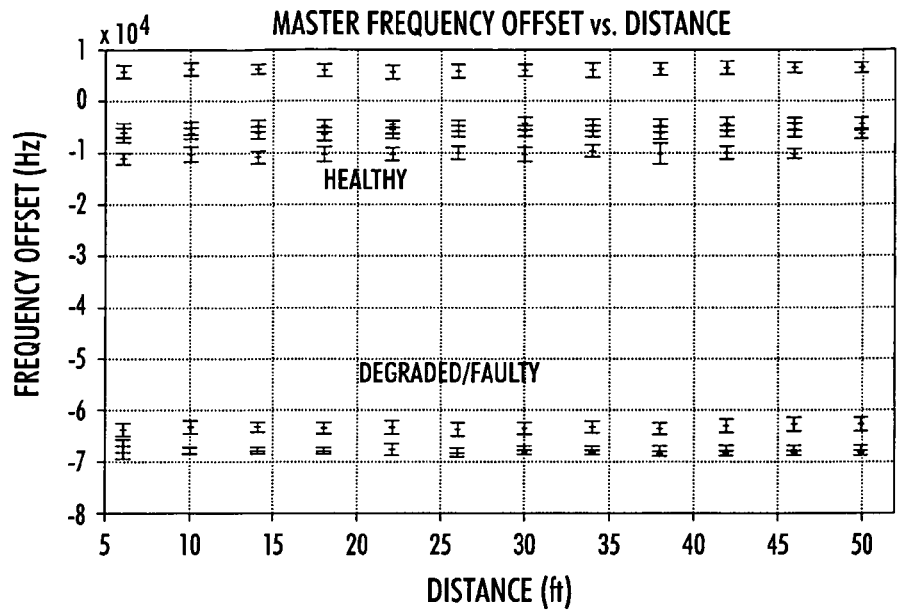
FIGS. 21A and 21B are illustrative plots that depict frequency offset versus distance for master and slave devices, respectively.
Figure 21B:
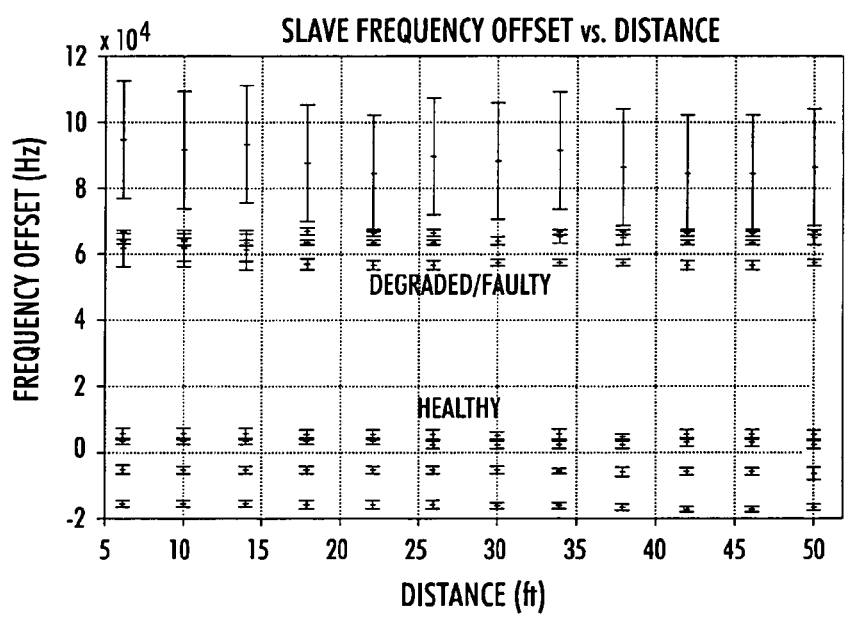

Shown in FIGS. 20A and 20B are typical plots for power sensitivity as a function of frequency offset at a fixed data rate. FIG. 20A shows the typical sensitivity at 2.4 Kbps, when IF is 273.9 KHz, whereas FIG. 20B shows typical sensitivity at 10 kbps, when IF is 273.9 KHz. FIGS. 21A and 21B show the trend of frequency offset with the varying distance. As seen, a characteristic separation (frequency offset) can be observed between the healthy and degraded chips.

Overall functionality was accessed by collectively analyzing the data gathered from the different test runs. The results from the range tests were used to construct a feature matrix (f) for each chip (Equation 3). Each row is assigned to one feature and captures the variation of that feature as a function of distance.

$$f = \begin{bmatrix} RSSI_{D1} & RSSI_{D2} & RSSI_{D3} & \ldots \\ FreqOff_{D1} & FreqOff_{D2} & FreqOff_{D3} & \ldots \\ CRC_{D1} & CRC_{D2} & CRC_{D3} & \ldots \end{bmatrix}$$ Equation 3

Using Singular Value Decomposition (SVD), a multivariate classification technique, the authors generated a fused health state from the feature matrix (f). In SVD, the matrix 'f' is represented as shown in Equation 4.

$$f_{M \times N} = U_{M \times M} \Sigma_{M \times N} V_{N \times N}^T \qquad \text{Equation 4}$$

The first two elements of the principle diagonal of the Zigma matrix are plotted in 2D space (i.e. $\Sigma_{(1,1)}$ values along the x axis and $\Sigma_{(2,2)}$ values along the y axis).

Figure 22A:
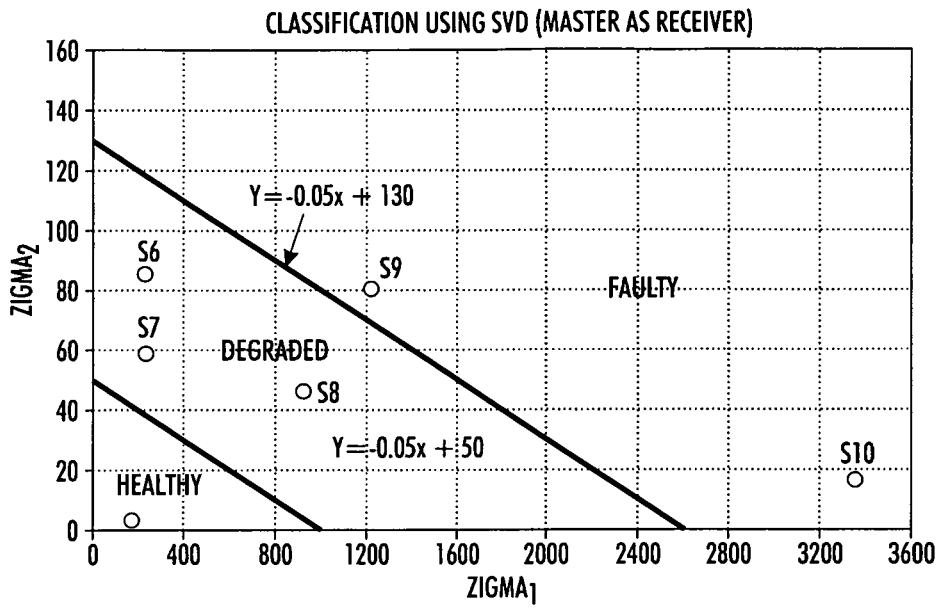
FIGS. 22A and 22B are illustrative plots that depict health state classifications for master and slave devices, respectively.
Figure 22B:
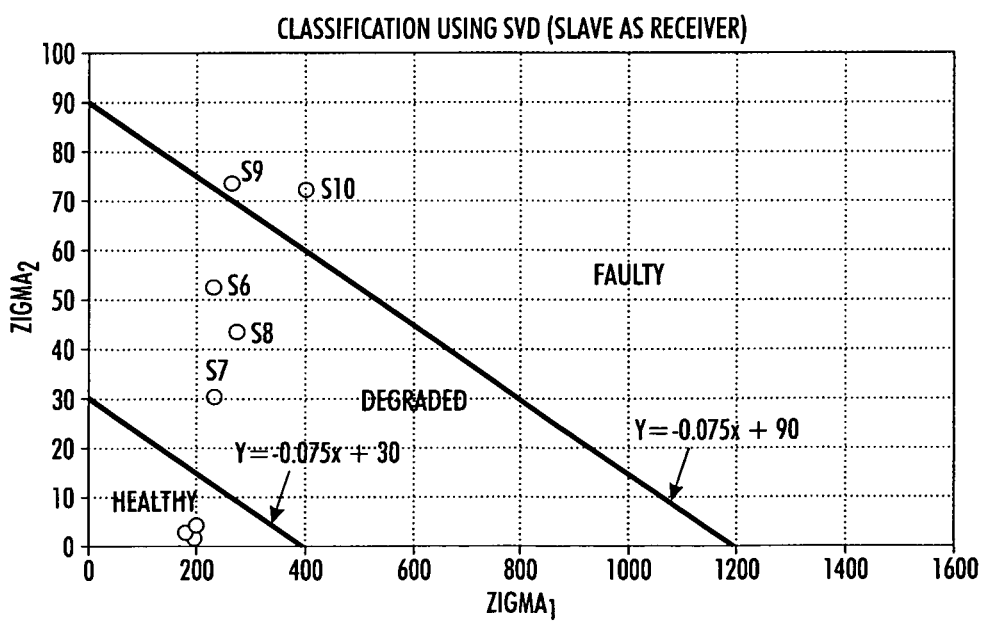

As seen in FIGS. 22A and 22B, a distinct health state classification can be observed in the Master and Slave. The healthy chips start out in a tight cluster at bottom left of the plots and progress outward as they are subjected to accelerated stress.

Methodology 2—Use of internal/existing system measurements to achieve electronic system health assessment: The following disclosure shows the ability to provide electronic system health assessment through existing analog measurements, including: voltage, current, and temperature and digital measurement: built-in self test (BIT or BIST) and related measurements.

The embodiments of this example take the form depicted in FIG. 1 and FIG. 2 and related subfigures. The monitored electronic system begins health assessment in step S1000 transitioning to S1100 where sensors acquire the necessary analog and digital measurements. Application of this method is equally applicable to embedded monitoring, external monitoring, or ATE deployment; steps S1110, S1120, and S1130, respectfully.

In the ATE deployment, this method follows the process flow depicted in FIG. 2B. Entering the ATE testing regime in step S1150 following the execution flow as described above. In this particular method, the loading and measurement module (LMM) may take the form of one or various software applications designed to load or test the system thoroughly. It should also be appreciated that similar functionality may be achieved using customized hardware.

Upon completion of step S1100 (and sub steps), performance metrics are calculated at step S1200 using the acquired analog and digital measurements. Such measurements complement one another to calculate accurate performance metrics. That is to say temperate may be used in conjunction with current and voltage to achieve normalization through dissimilar temperature gradients. Digital measurements are used for statistical merit adding verification to the calculated performance metrics.

Figure 23:
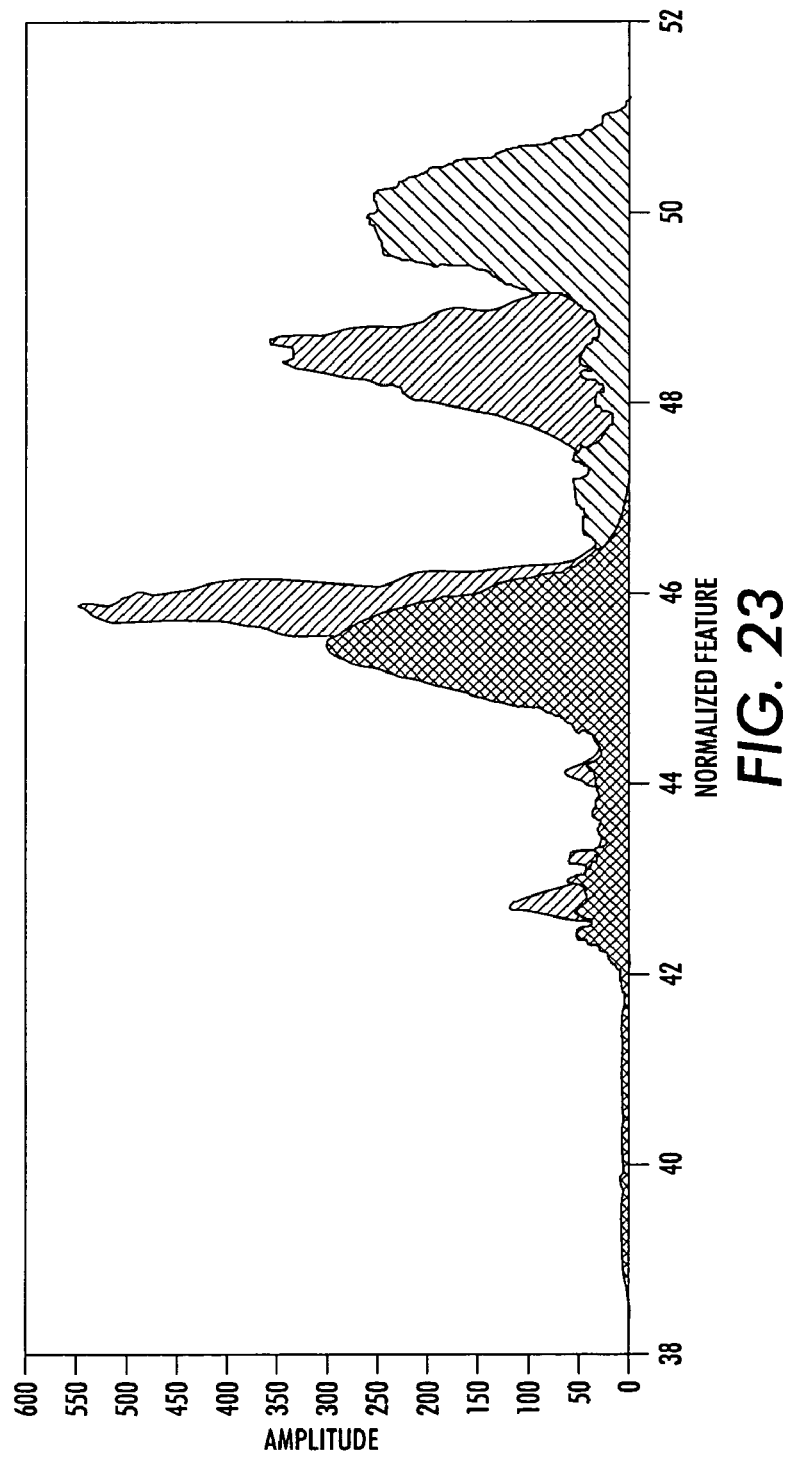
FIG. 23 is a plot depicting the various modes (levels of functional degradation) using the relationship between amplitude and a normalized feature.

Once performance metrics are calculated, the system enters step S1300 where classification techniques are applied. Specific techniques, as described above, are applied to achieve mode detection discerning between levels of functional degradation (shown in FIG. 23 relative to an amplitude versus normalized feature plot). Up to four statistical moments (i.e. mean, variance, skew, and kurtosis) are used to classify the functional operation of the electronic system.

Figure 24:
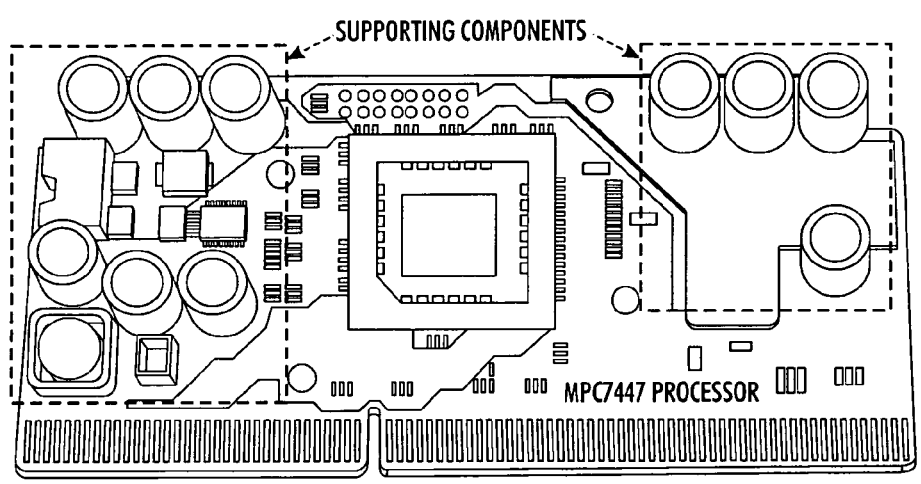
FIG. 24 is an illustration of an exemplary test system (MPC7447 μP on a removable processor card)

The system used in one embodiment was the MPC7447 host processor, a high-performance, low-power 32-bit implementation of the PowerPC RISC (Reduced Instruction Set Computer) architecture with a full 128-bit implementation of Freescale's AltiVec™ technology. A detailed search of commercially available products incorporating MPC7447 µPs on a removable processor card resulted in identification of Genesi's Pegasos PowerPC computing platform. The Pegasos-PPC utilizes a MPC7447 processor on an affordable and completely removable edge card configuration, as shown in FIG. 24, which is inserted into a fully populated motherboard. Further information on MPC7447 can be found at http://www.freescale.com/webapp/sps/site/prod_summary.jsp?code=MPC7447&srch=1#top.

In one scenario, thermo-electrical stress testing was used as an effective third means of accelerated life testing yielding prompt failure. These included thermal cycling, thermo-electrical overstress and a combinational environment (Thermal Cycling and Vibration Stress).

Figure 25A:
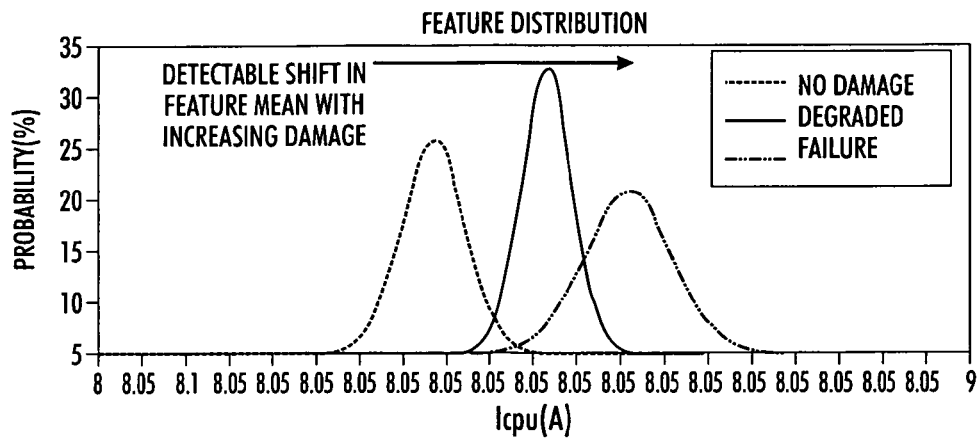
FIGS. 25A and 25B are graphs illustrating exemplary data for an accelerated aging process.
Figure 25B:
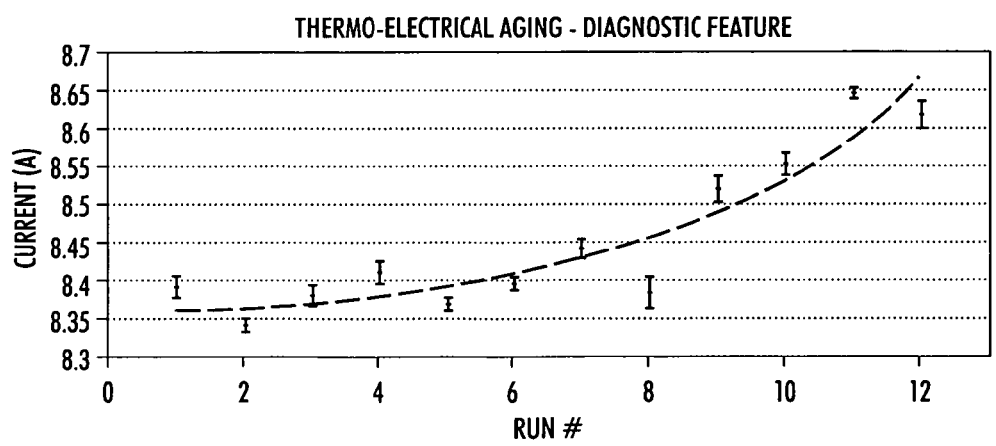

The baseline measurements taken after successive thermo-electrical aging processes showed dramatic increases in current consumption. Each aging cycle escalated the core processor voltage causing a damaging, cascaded effect of increasing core temperate causing increased current consumption. As the device is aged, the quantity of trapped electrons increases causing the leakage current of the device to grow proportionally at nominal operating conditions. This increased leakage current is the primary indicator of incipient faults occurring within the device and has been measured and quantified over the accelerated aging process, as shown in FIGS. 25A-B. More specifically, FIG. 25A shows the shift in feature mean as damage increases, and FIG. 25B shows thermo-electrical aging of the device.

Methodology 3 Performance assessment metrics derived from available external measurements: A specific example demonstrating the aforementioned capability extends from the Navair Small Business Innovative Research (SBIR) program under contracts referenced above. The following discussion describes the ability to provide performance assessment for electronic systems that are derived from available external measurements.

The methodology once again follows the steps outlined in FIG. 1. After monitoring the data, performance metrics are calculated at step S1200 using explicit analytical expressions in term of monitored data values. All calculations are computed using a microprocessor, processor or embedded processor. Performance metrics are calculated for each acquired set of monitored values, with primary performance metrics including loss resistance, power loss, and converter efficiency.

For example, power loss ($P_{loss}$) is computed by taking the difference between the input power and output power of an N output converter (Equation 5). Input power and output power is computed by multiplying the time-instantaneous values for current and voltage at each input and output port respectively.

$$P_{loss} = P_{in} - \sum_{i=1}^{N} P_{out(i)} \qquad \text{Equation 5}$$

Loss Resistance ($R_{loss}$) is computed by dividing, or normalizing, the computed power loss by the measured input current ($I_{in}$) squared (Equation 6).

$$R_{loss} = \frac{P_{loss}}{I_{in}^2} \qquad \text{Equation 6}$$

And, the Efficiency (Eff) is computed by taking the ratio of output power to input power of an N output converter as set forth in Equation 7.

$$Eff = \frac{\sum_{i=1}^{N} P_{out(1)}}{P_{in}} \qquad \text{Equation 7}$$

Figure 26:
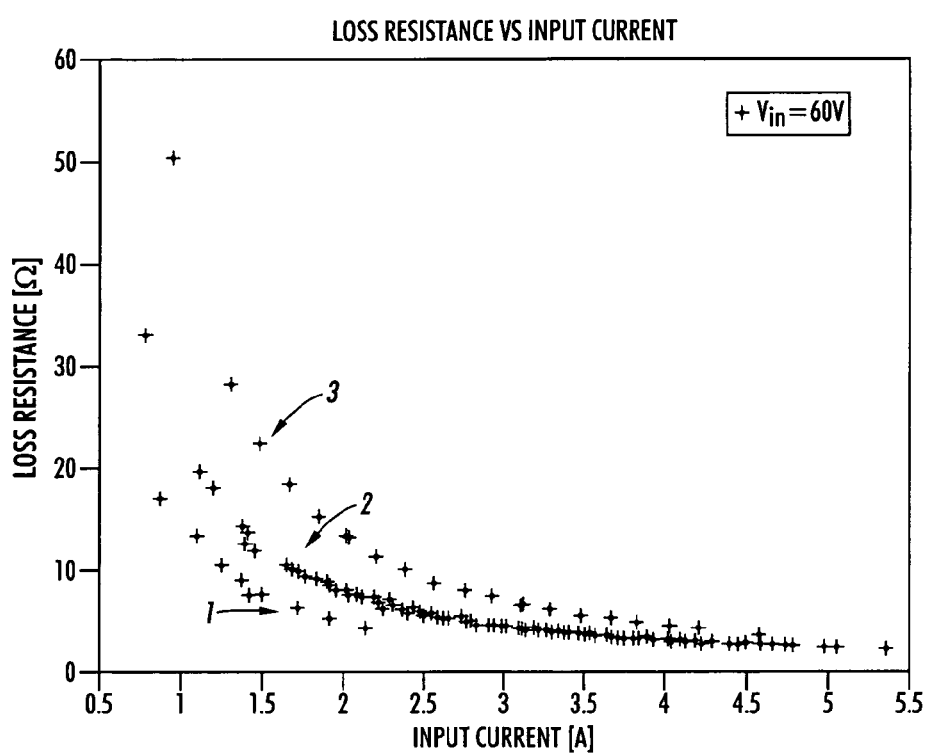
FIG. 26 is a graphical illustration of the use of a loss resistance performance metric for classification of performance.

Next, at step S1300, a fuzzy, neural network or fuzzy-neural network is used to separate the acquired monitored values and associated performance metrics into multiple data classes, or distinct groups. An example is illustrated in FIG. 26, where monitored values are separated into three different data classes (reference arrows 1, 2 and 3, respectively) using the performance metric loss resistance.

Figure 27A:
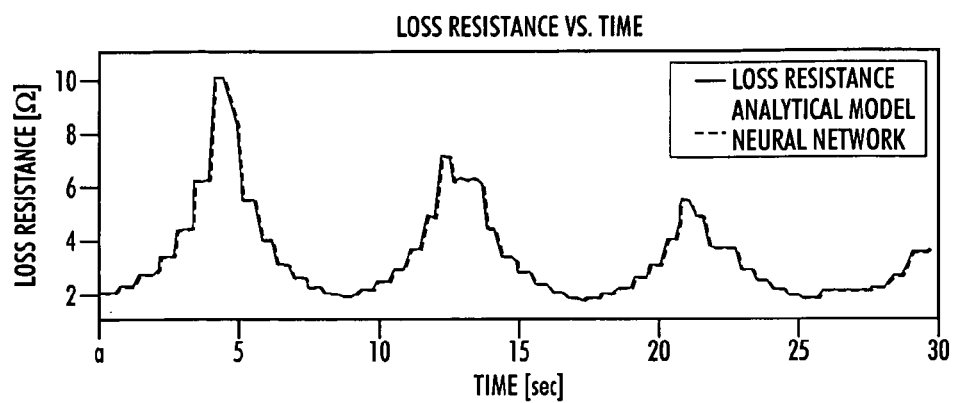
FIGS. 27A and 27B are comparative examples of plots showing performance models generated using a neural network, and analytical model, respectively.
Figure 27B:
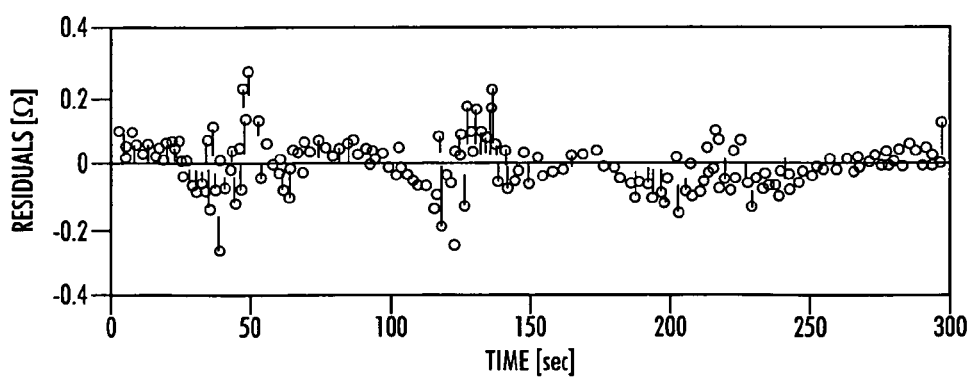

Performance models are then generated (step S1400) using performance metrics and monitoring values associated with each data class. An example of an analytical best-fit model is provided in Equation 8 relating the performance metric loss resistance with input voltage and current. Provided in FIGS. 27A and 27B is a comparison of two performance models generated using a neural network and analytical model respectively with the measured performance metric loss resistance. Note: in the model, A and X are vectors, $H_{11} \ldots H_{33}$ are the modeling coefficients, and the variables $I_{in}$ and $V_{in}$ represent the measured input current and output current, respectively.

$$R_{loss}(I_{in}, V_{in}) = A \cdot X \quad \text{Equation 8}$$

where
$A = [H_{11} H_{12} H_{13} H_{21} H_{22} H_{23} H_{31} H_{32} H_{33}]$
$X = [1 \; I_{in}^{-1} I_{in}^{-2} V_{in} V_{in} I_{in}^{-1} V_{in} I_{in}^{-2} V_{in}^{2} V_{in}^{2} I_{in}^{-1} V_{in}^{2} I_{in}^{-2}]^T$ The steps S1700 to S1900 are applied after this stage.

Hardware Architecture

Three hardware configurations or embodiments for the electric power converter health monitoring system are described in this section, and include embedded, external, and automated test equipment (ATE). Embedded health monitoring utilizes available hardware within the power converter itself. External health monitoring uses a third-party hardware module connected external to the power converter to acquire monitoring values in a passive configuration. ATE health monitoring includes equipment used to externally perturb the electric power converter with electrical stimuli (rather than passive monitoring) and measure the responses.

Figure 28:
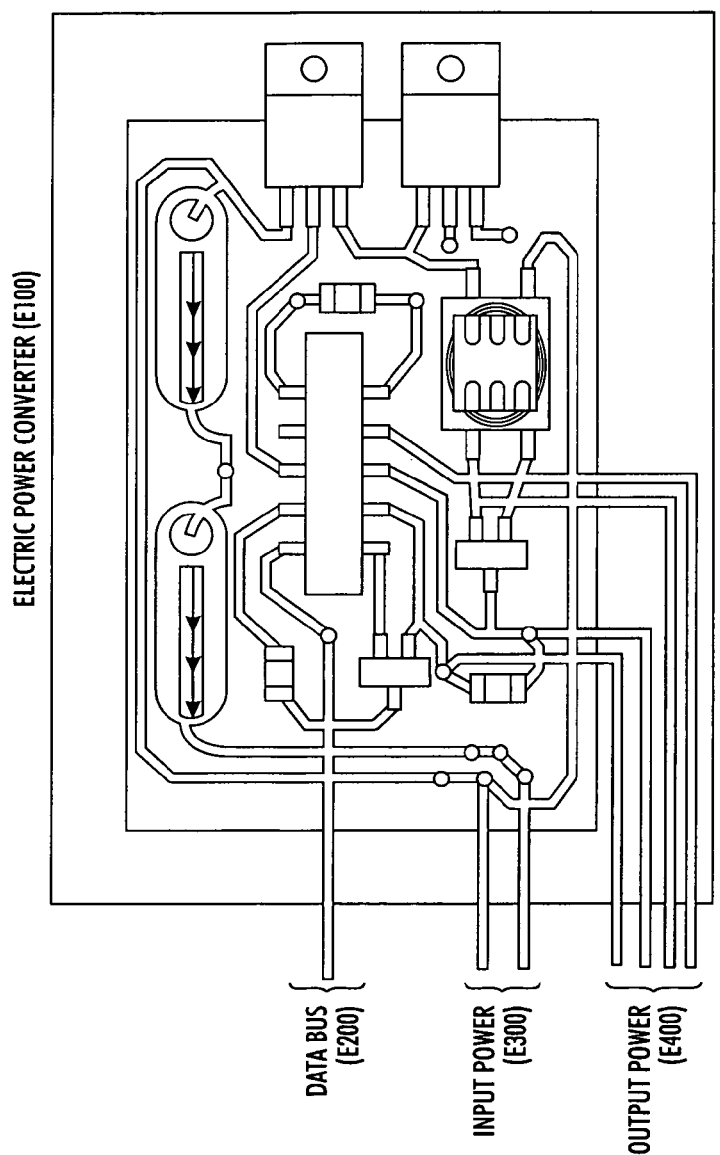
FIG. 28 is an illustrative schematic of an electric power converter having an embedded health monitoring system.
Figure 29:
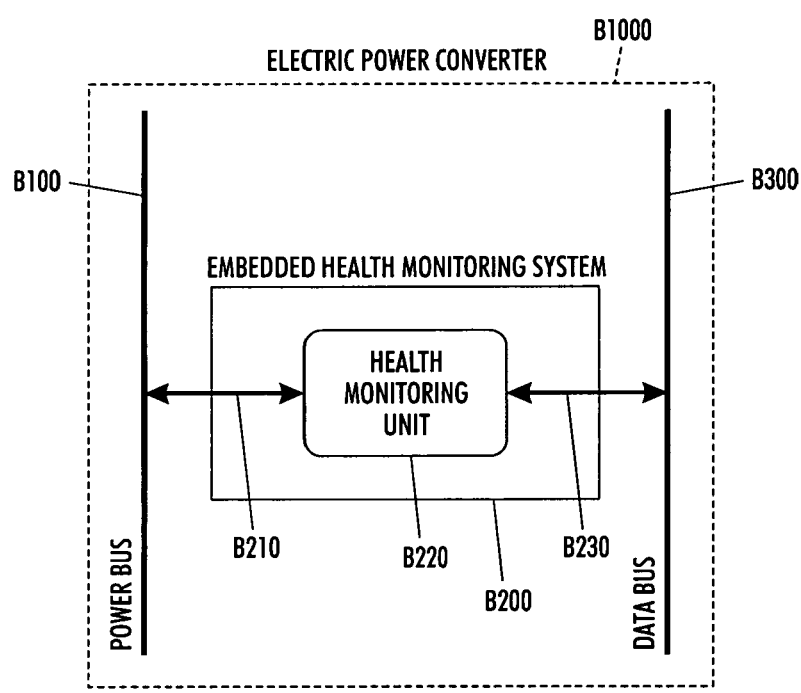
FIG. 29 is a block diagram of an exemplary embedded health monitoring system.

The embedded health monitoring system, illustrated in FIG. 28 utilizes available hardware within the power converter (E100) itself. As denoted by the figure, the embedded health monitoring system utilizes available sensors to measure the input current and voltage from the input power lines (E300) and all the output currents and voltages at the output power lines (E400) of the electric power converter (E100). The embedded health monitoring system (E500) is also depicted in more detail as a block diagram in FIG. 29. The embedded health monitoring system (B200) is contained within the electric power converter (B1000). The internal power bus (B100) is connected by connection (B210) to the health monitoring unit (B220). The internal power bus (B100) includes input power lines (E300) and all the output power lines (E400). The digital bus of the health monitoring unit (B230) is connected to the main data bus (B300) of the electric power converter.

Figure 30:
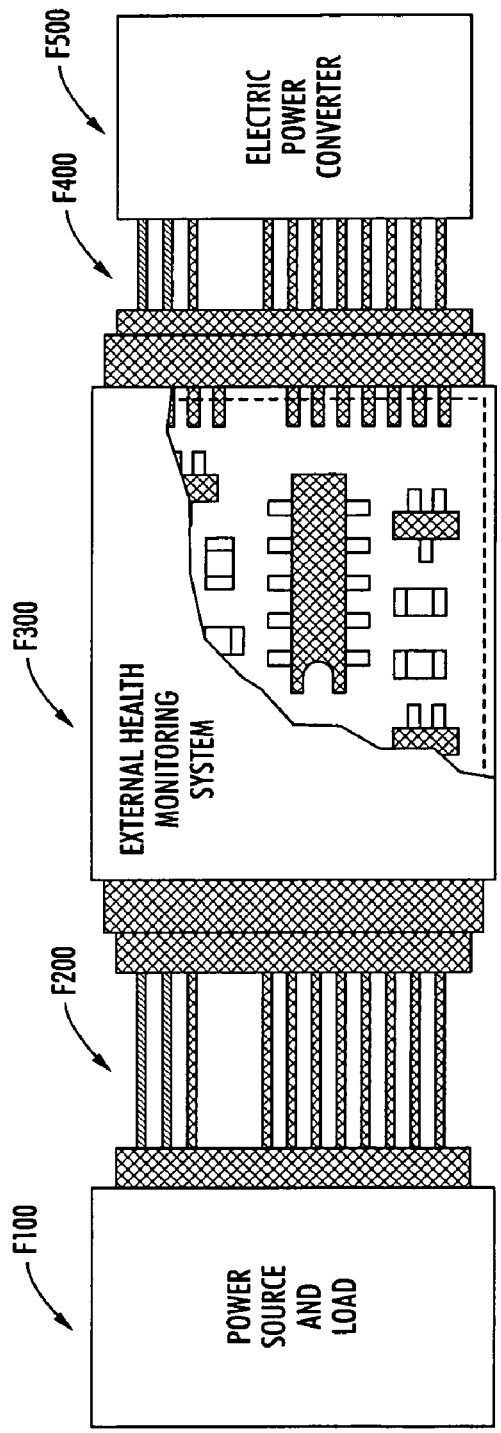
FIGS. 30 and 31 are block diagrams of an exemplary external health monitoring system.

An external health monitoring system, for example the system illustrated in FIG. 30, can be implemented as a third-party module as previously noted. As denoted in the figure, the external health monitoring system (F300) is connected between the power source and load (F100) and the electric power converter (F500) using two cables (F200) and (F400). For this embodiment all of the power and data lines of the input power cable (F200) and the converter power cable (F400) are wired together within the external health monitoring system (F300).

Figure 31:
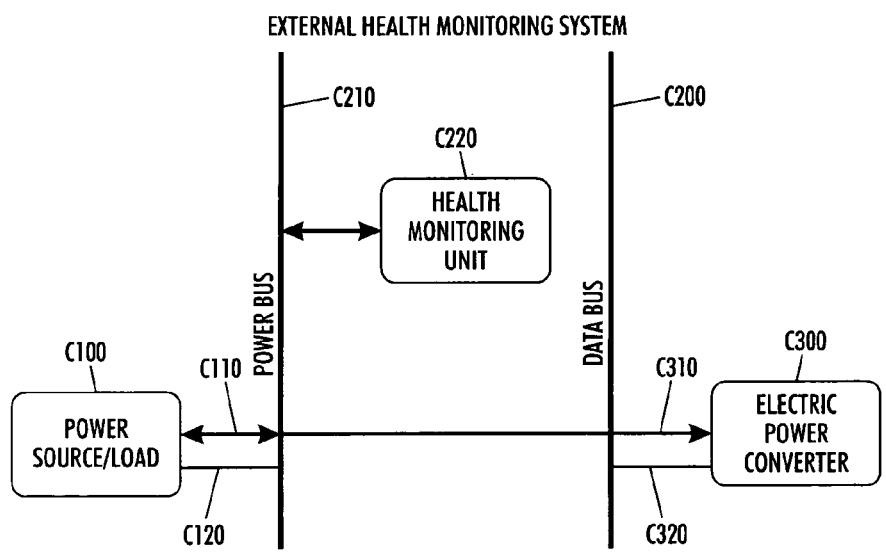

The external health monitoring system (C200) is described in more detail as a block diagram in FIG. 31. The input power cable (F200) contains the input power lines (C110) and the data lines (C120) which are wired together with the converter power lines (C310) and the converter data lines (C320) of the converter power cable (F400) respectively. This allows a direct connection between the power source and load (C100) and the electric power converter (C300). Within the external health monitoring system (F300) there is a power bus (C210) and data bus (C230) which are connected to both the input power lines (C110) and input data lines (C120). Both the power bus (C210) and the data bus (C230) are connected to the health monitoring unit (C220).

Figure 32:
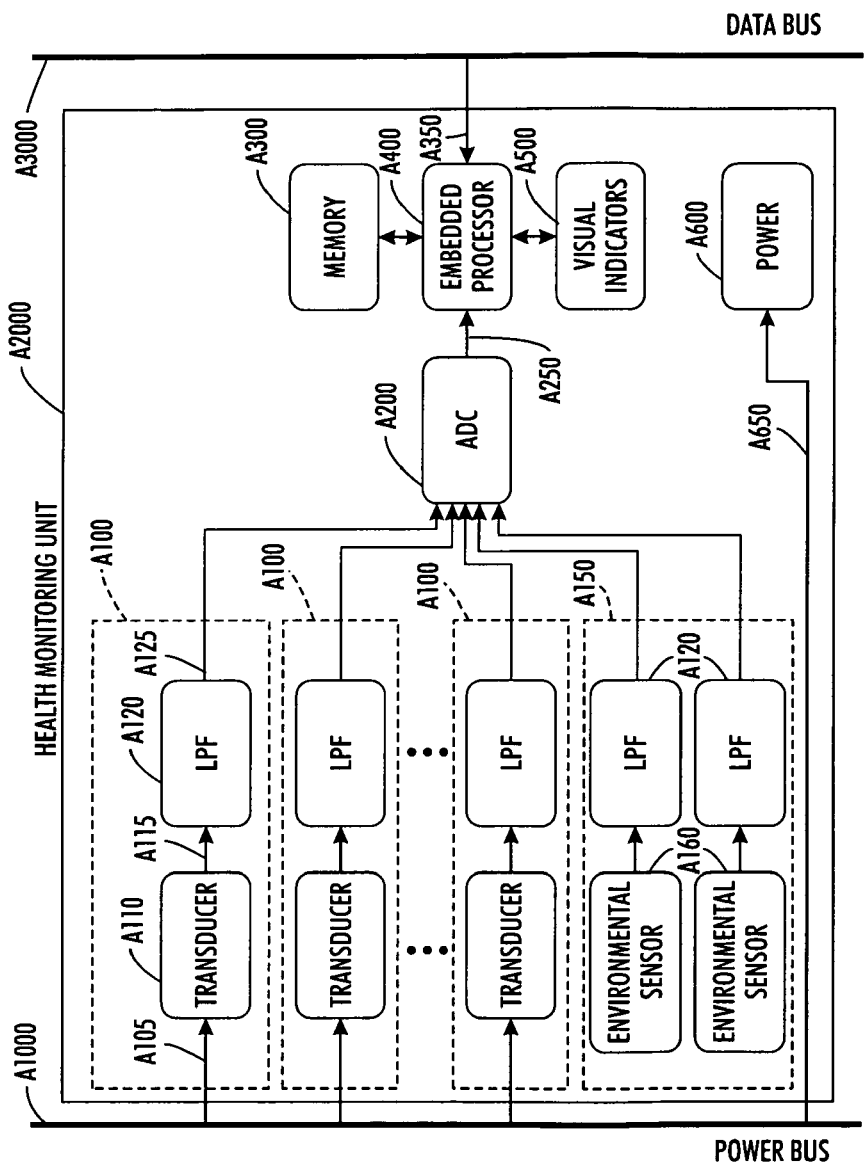
FIG. 32 is a block diagram of a health monitoring unit as depicted in FIGS. 29 and 31.

The health monitoring unit (A2000) used in the embedded health monitoring system (B220) and the external health monitoring system (C220) is depicted in the block diagram in FIG. 32. The power bus (A1000) contains the electrical connections delivering power to the electrical power converter and the power supplied from the electrical power converter. Contained within the health monitoring unit is a collection of censors (A100) and (A150). The sensors (A100) are connected to the power bus (A105) to monitor the input and output voltages and currents of the electrical power converter where each sensor is used to measure a single electrical quantity. Each sensor (A100) includes a transducer (A110) and low-pass filter (A120). Each transducer (A110) is used to convert either voltage or current to an appropriate electrical signal. The outputs of the low-pass filters from each sensor are connected to an analog-to-digital converter (ADC) (A200). The sensors (A150) are a collection of environmental sensors (A160). Each environmental sensor is essentially a transducer used to measure one or more of the following environmental parameters: temperature, vibration, humidity, radiation and pressure. Each environmental sensor is connected to a low-pass filter (A120). Each low pass filter (A120) is designed to anti-alias the electrical signals measured from the transducer.

The output of each transducer is connected to one channel of the ADC. The ADC quantizes all of the sensor values into digital signals. The ADC is connected via connections (A250) to the embedded processor (A400). The embedded processor is connected to non-volatile memory (A300) to store historical health assessment information, performance metrics, and trained models. The health assessments generated by the processor can be displayed using visual indicators (A500) or sent to a third party using the data bus (A3000) connected to the embedded processor. Visual indicators include light-emitting diodes (LEDs), digital displays and similar devices. All of the power requirements for the health monitoring unit (A2000) are met using a low-power electric power converter (A600) connected at (A650) to the power bus (A1000).

The automated testing equipment (ATE) health monitoring system described herein evaluates an electric power converter and generates a health assessment. The ATE health monitoring system is similar to the embedded health monitoring system and the external health monitoring system as discussed above, except that the monitored data is acquired by actively perturbing the system with electrical stimuli rather than passively monitoring.

Figure 33:
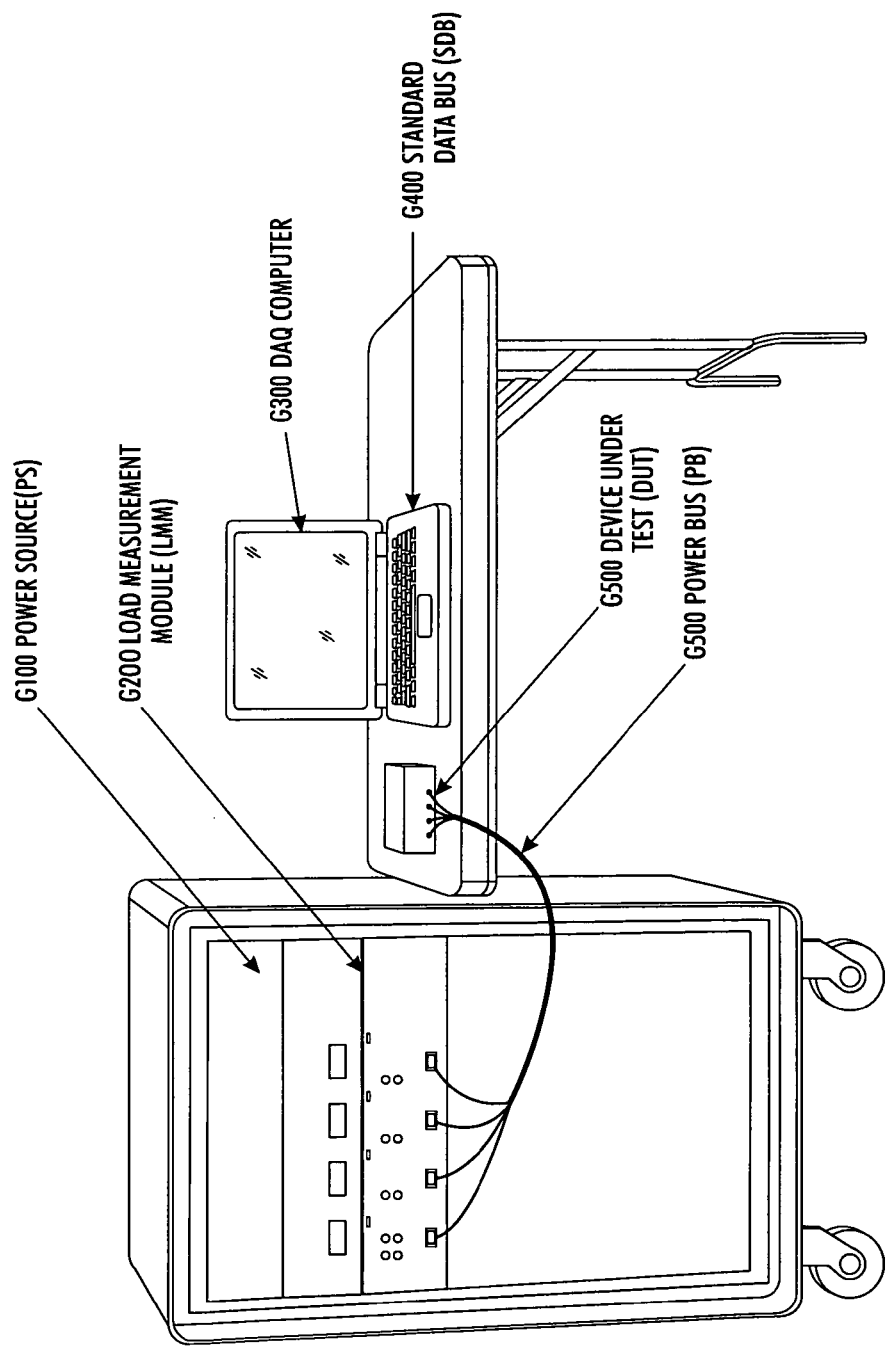
FIG. 33 is a graphical representation of automated test equipment used with the health monitoring system.
Figure 34:
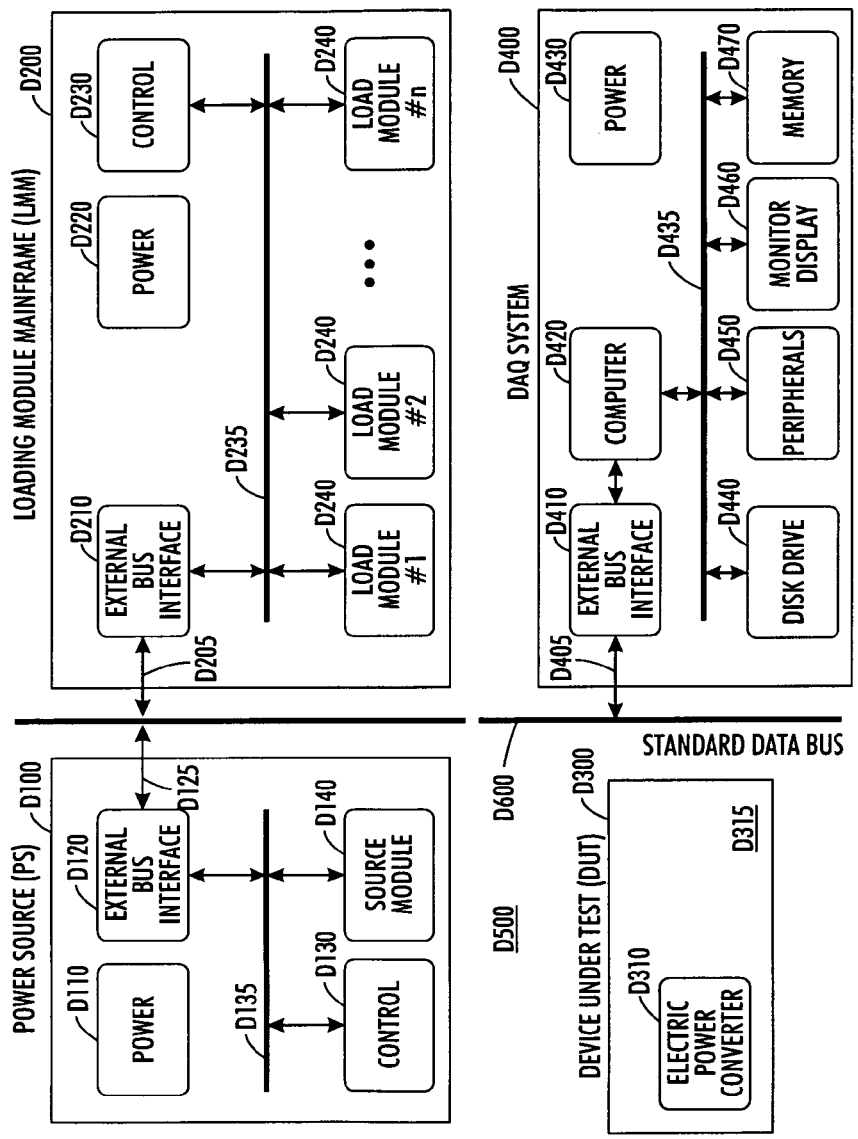
FIG. 34 is a block diagram of the system of FIG. 33.

The ATE health monitoring system, illustrated in FIG. 33, can be implemented as an offline health monitoring system for an electric power converter. As illustrated in the figure, the ATE health monitoring system (G1000) includes a power source (PS) (G100), loading and measurement module (LMM) (G200), DAQ computer (0300), standard data bus (SDB) (G400), the device under test (DUT) (G500), and the power bus (PB) (G600). The ATE health monitoring system (G1000) is described in more detail referring to the block diagram of FIG. 34.

The power source (D100) provides electrical power to the DUT (D300) during a test. The power provided to the DUT is supplied by the source module (D140). The source module is a programmable power source able to change voltage and current set points. The source module (D140) is controlled by the local digital controller (D130). The local digital controller communicates with the standard data bus (D600) through the external bus interface (D120). The external bus, source module, and digital controller are all connected together using a local data bus (D135). Using this interface, the digital controller transmits the measured values of voltage and current from the source module (D140) to the standard data bus (D600). The PS utilizes readily available electric power sources (D110) such as single or three phase 115/230 VAC.

The loading module mainframe (D200) absorbs electrical power from the DUT during a test. The loading module mainframe contains at least one loading module (D240) to absorb power from the device under test. Typically, there is one loading module for each output channel of the device under test. All the loading modules are, in one embodiment, controlled by the local digital controller (D230), although it is conceivable that a distributed control system may be employed. The local digital controller communicates with the standard data bus (D600) through the external bus interface (D210). The external bus, digital controller, and all the loading modules are connected together using a local data bus (D235). Using this interface, the digital controller transmits the measured values of voltage and current for all the loading modules (D240) to the standard data bus (D600). The LMM utilizes readily available electric power sources (D220), such as single or three phase 115/230 VAC.

The data acquisition (DAQ) system is designed to control the PS (D100) and LMM (D200) using an external bus interface (D410). The external bus interface is connected (D405) to the standard serial bus (D600) and the computer (D420). The LMM also utilizes readily available electric power sources (D470), again for example single or three phase 115/230 VAC.

The computer (D420) is connected to a disk drive (D440), peripherals (D450), monitor display (D460) and memory (D470) through a local data bus (D435). The computer includes of a microprocessor or embedded processor. The disk drive (D440) is a non-volatile storage device that hosts the operating system, programs, measured data, test records, and testing profiles. Alternative media may be employed in conjunction with or in place of the disk drive. The monitor display (D460) is used to visually represent health assessment information to the operator. Also, memory (D470) provides temporary storage for programs, profiles, raw data, and the operating system. Peripherals (D450) include devices the operator uses to interface with the computer such as a mouse, keyboard, external data storage, wireless devices and other visual devices. The computer (D420) is used to run, or execute, each automated test. The computer controls the PS and LMM by sending commands to the SDB. During each automated test, the computer also receives values measured from the PS source module and all the LMM load modules.

Four (4) unique power supplies were investigated to validate the loss resistance model developed above. FIG. 35 shows the loss resistance characterization curves obtained for each DUT.

Electronic PHM Development

Feature-based diagnostics and prognostics can be implemented for electronic systems by identifying key prognostic features that correlate with failure progression. Obtained features can be tracked and trended over the system's life and compared with the model-based useful-life-remaining estimates to provide corroborative evidence of a degrading or failing condition. A feature-driven artificial intelligence-based approach can implement such a PHM system. With examples of good, bad, and unknown feature sets, classifiers can be developed using an array of techniques from straight-forward statistical methods to artificial intelligence methods such as neural networks and fuzzy logic systems. For a prognostics implementation, the automated reasoning algorithm can be trained on evidenced features that progress through a failure. In such cases, the probability of failure, as defined by some measure of the "ground truth", trains the predictive algorithm based on the input features and desired output prediction. In the case of a neural network, the network automatically (dynamically) adjusts its weights and thresholds based on the relationships it sees between the probability of failure curve and the correlated feature magnitudes.

Utilizing sound engineering principles and building on diligent study of physical failure mechanisms, the developed electronic prognostic health management technology leverages existing circuit operational data as a basis for prognostic feature extraction and provides a high-confidence component health index. This index reflects the component's current operating condition and establishes the foundation for a prediction of remaining useful life.

Disclosed in embodiments above is a method for prediction of electronic system failures and useful life remaining, comprising: selecting at least one feature of the electronic system for monitoring, said feature being represented as a signal in the system; regularly monitoring the feature and storing the signal in real-time without interrupting the operation of the system; developing a model of the degradation of the system wherein the model includes the feature; and calculating, based upon the model and the stored signals, the remaining useful life of the system.

Three major electronic system PHM methods have been identified and are believed to find particular use in avionic systems. The major characteristics of multiple failure types were examined and techniques identified that are useful for monitoring and predicting failures. In one of the embodiments, the selection of GPS circuits for testing permits a substitution of economical test articles for destructive testing and data collection. The availability of an existing data stream permits monitoring and implementation of prognostic algorithms without additional sensors, an important aspect of the technique demonstration. At least one method was developed following a NMEA 0183 protocol to interface a GPS Receiver required to perform the accelerated failure tests outlined herein. The extracted signals investigated during the accelerated failure test provided a sound basis for feature extraction and statistical analysis.

This technique was extended to other RF electronic applications where digital data is readily available during the normal operation of the device, and it should be appreciated that the disclosed techniques may find similar applications. The RFIC results supplement the findings of the GPS effort and strengthen the circuit as a sensor methods. This method can be extended to software defined radios and radar applications as well.

Using Methodology 2, as set forth above, the ability to detect degradation using available external features was successfully demonstrated. Also established was a distinct ability to capture fault-to-failure progression data through a series of accelerated aging tests designed to isolate and increase the likelihood of failure due to specific known failure mechanisms. The matriculated failure modes were quantified through minimally invasive monitoring of system feature data as the device degraded over time. The developed understanding of semiconductor device failure and the ability to measure and trend such shifts in performance indicates the further ability to develop prognostic health monitoring techniques for a wide breadth of digital components and systems.

has Also described is an ability to identify external available features as traceable indicators of damage accumulation. The switch mode power supply (SMPS) use case, Methodology 3, demonstrated the capability of using these features to derive performance of critical electronic systems.

Turning now to another exemplary embodiment, standard power drives found in industry and military fleets are based on a power electronics controller and an induction motor. Recent trends indicate migration from induction motors to synchronous permanent magnet (PM) machines or hybrid type motors. Nevertheless, the basic structure of the standard six-transistor inverter feeding a PM or induction motor will most likely continue to be the basic inverter structure in the future. Standard inverters contain powerful microcontrollers and high-band signal instrumentation devices with high-voltage isolation. These inverters measure real-time terminal voltage and current for each of the motor phases. In addition, inverters are designed to protect against simultaneous transistor leg trigger. Real-time measurements of input and output voltage are common when vector control techniques are required. Furthermore, many controllers include a tachometer for angular position and speed feedback. Additionally, the inverter and motor have over-heating protection typically located in the power transistor and in the winding of the motor; in some cases, measures to protect the motor bearing against overheating are also incorporated into the design. Historically, frequency response has been one of the accepted methods of characterizing semiconductors and electric machines, and off-line impulse tests (or stator surge) of electrical machines are among several techniques to determine turn faults in windings.

Figure 36:
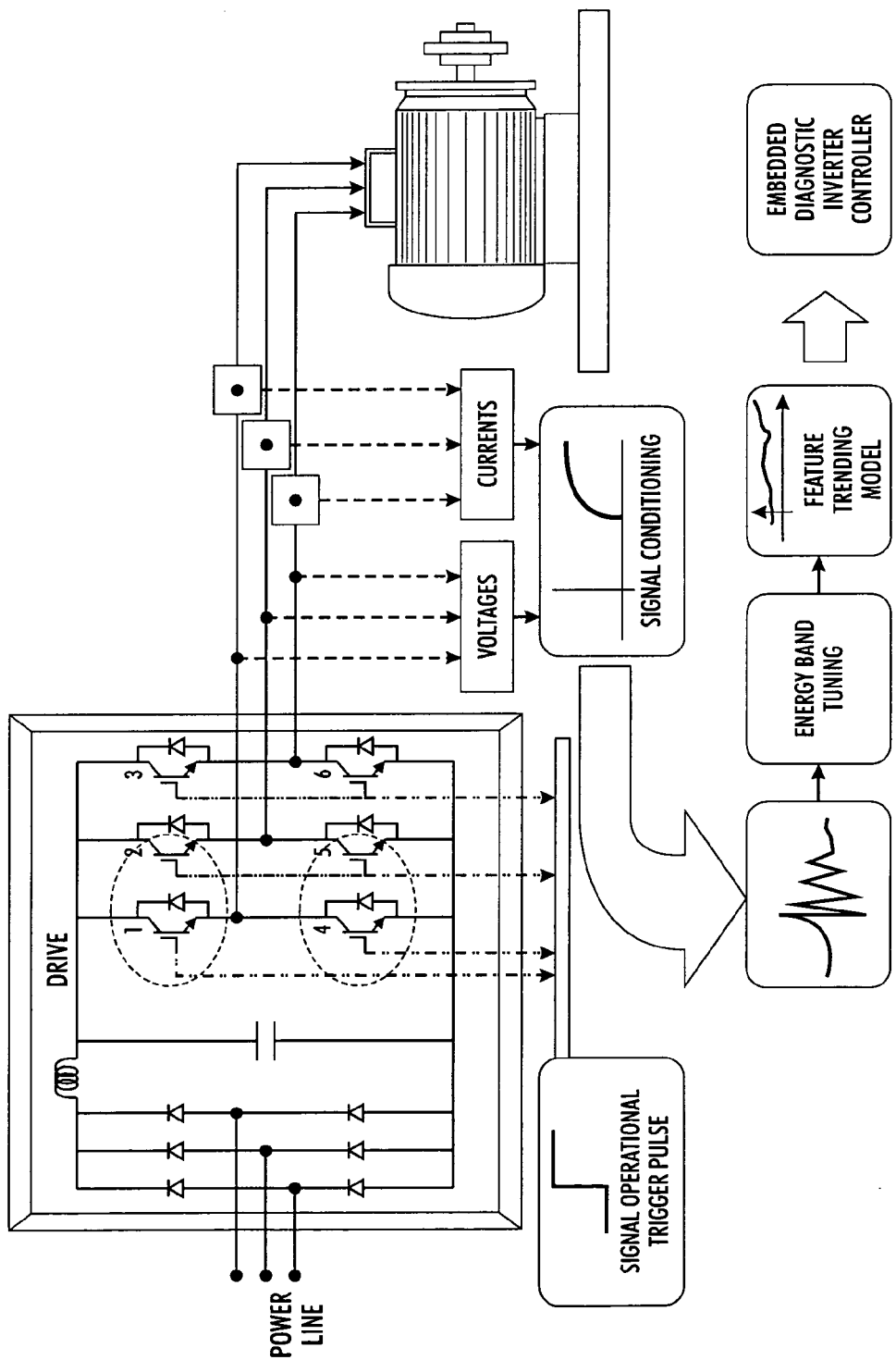
FIG. 36 is a block diagram illustrating an embodiment for a ringing characterization technique.

One ringing characterization technique, depicted in FIG. 36, has the potential of measuring the relative aging effects of switching transistors, diodes, and stator motor windings. This technique takes advantage of already available inverter instrumentation, used to measure current and voltage, and the available microcontroller time of the modern power drives.

The relative aging effects of the switching transistors of the power electric drive are measured by characterizing the resonance frequency of the equivalent circuit. The equivalent circuit is formed by the capacitance and inductance of the switching device in conjunction with the inductance and resistance of the motor stator windings, which acts as a current source. Major contributors to the frequency response of the circuit are the parasitic capacitances and inductances present in the semiconductor and motor windings. Fundamentally, a strong relationship exists between variation in semiconductor capacitances and defects/errors in the fabrication process and winding aging.

Figure 37:
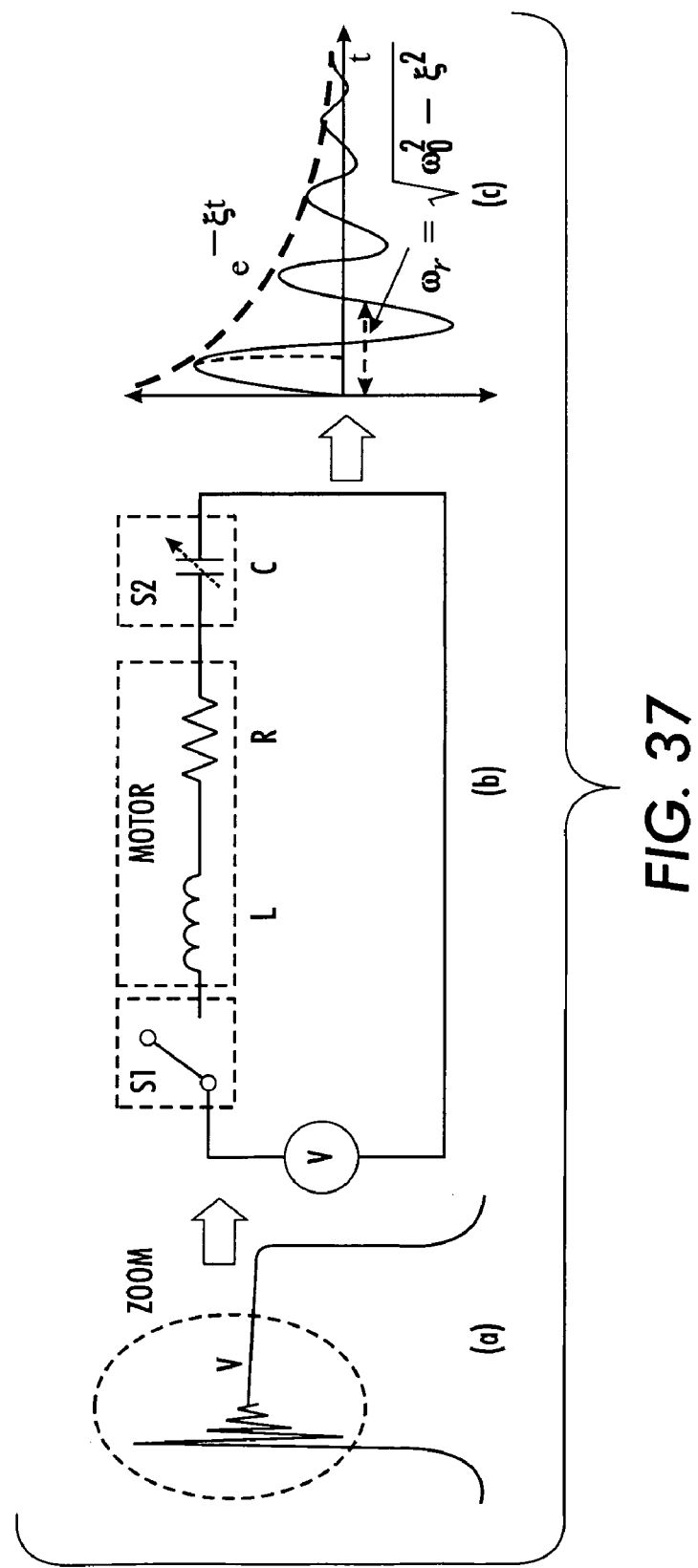
FIG. 37 is a representation of a ringing characterization in the embodiment of FIG. 37.

During a transition between off-to-on states for a transistor such as an insulated gate bipolar transistor, the drain-to-source properties may be modeled as a switched capacitor for a short period of time. During this transition, second and third order harmonic oscillations are observed among the inductive load of the motor and the non-linear capacitive behavior of the semiconductor. In FIG. 37, (a) illustrates a simplified model of the ringing oscillation observed during this transition between the transistor (S1) and its clamping diode (S2). This is observed as a step response of a second order system. The circuit model of the phenomena includes the two switches (S1 & S2) and the stator-winding coil of the circuit as shown in (b) of FIG. 37. In the same figure, (c) shows a simplified characterization of the system as a step response of a second order circuit.

The RLC system illustrated in FIG. 37, section (b) can be expressed as a second-order differential equation as shown below in Equation 9.

$$\frac{\partial^2 i(t)}{\partial t^2} + 2\xi \frac{\partial i(t)}{\partial t} + \omega_o^2 i(t) = 0 \ A/s^2 \qquad \text{Equation 9}$$

where:

$\xi = \frac{R}{2L}$ is a damping factor and $\omega_o = \frac{1}{\sqrt{LC}}$ the resonant frequency in [rad/s]

The current modeled in Equation 9 has similar oscillatory behavior with the ringing oscillation observed in FIG. 37 (a). The oscillatory, or ringing, behavior can be computed, providing an opportunity to track the on-line values of the power device parameters, such as the damping factor, voltage over-shut, and ringing frequency.

$$i(t) = e^{-\xi t}\left[A_1 e^{\sqrt{\xi^2-\omega_0^2}} + A_1 e^{\sqrt{\xi^2-\omega_0^2}}\right] \qquad \text{Equation 10}$$

When the damping factor is smaller than the resonant frequency, the solution is complex creating a ringing oscillation. Thus, $$i(t) = e^{-\xi t}[be^{j\omega_r}] \qquad \text{Equation 11}$$

where:

$\omega_r = \sqrt{\omega_0^2 - \xi^2}$ is the ringing frequency in [rad/s]

The final expression (Equation 11) for the current represents the same harmonic frequency of the voltage waveform shown earlier in (a) of FIG. 37. Therefore, measuring this quantity can provide valuable information from parameters such as the damping factor, voltage over-shut, and ringing frequency, which may be used as precursors to failure. The single second order system presented in FIG. 37 is a simplified representation of the variable parameters that interact in a real system.

Figure 38:
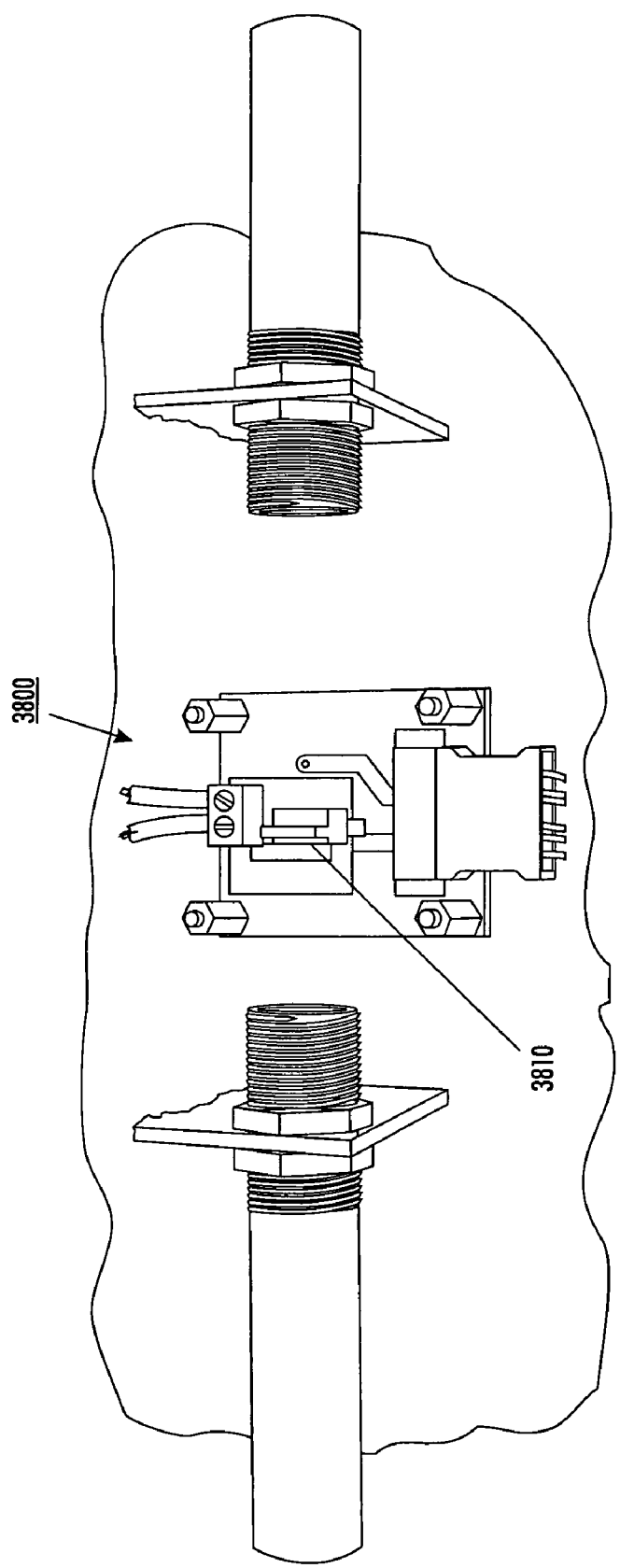
FIGS. 38 and 39 illustrate an exemplary test fixtures for insulated gate bipolar transistors.

FIG. 38, depicts an embodiment in which a system and method for aging and modeling for an insulated gate bipolar transistors (IGBTs) is developed and demonstrated. Accelerated failure testing was performed on Insulated Gate Bipolar Transistors (IGBTs) using the test-bed 3800 shown below in FIG. 38. As in the prior system, thermal-electrical stress was used to generate device damage, applying a controlled temperature by switching the transistor while reducing the heat transfer capability of the components. Additional information regarding monitored parameters, physical models, and preliminary results is provided in subsequent sections. The transistor's case temperature is controlled in a feedback loop to ensure a gradual regulation of the aging process. The test identified as thermo-electrical aging is the quickest and most effective method to evoke degradation and failure in the device under testing.

Figure 39:
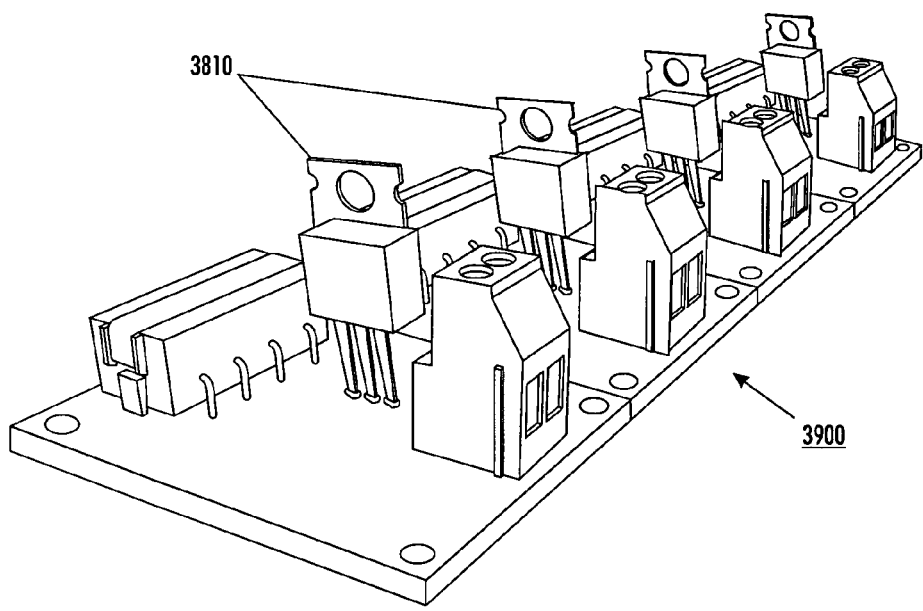
Figure 40:
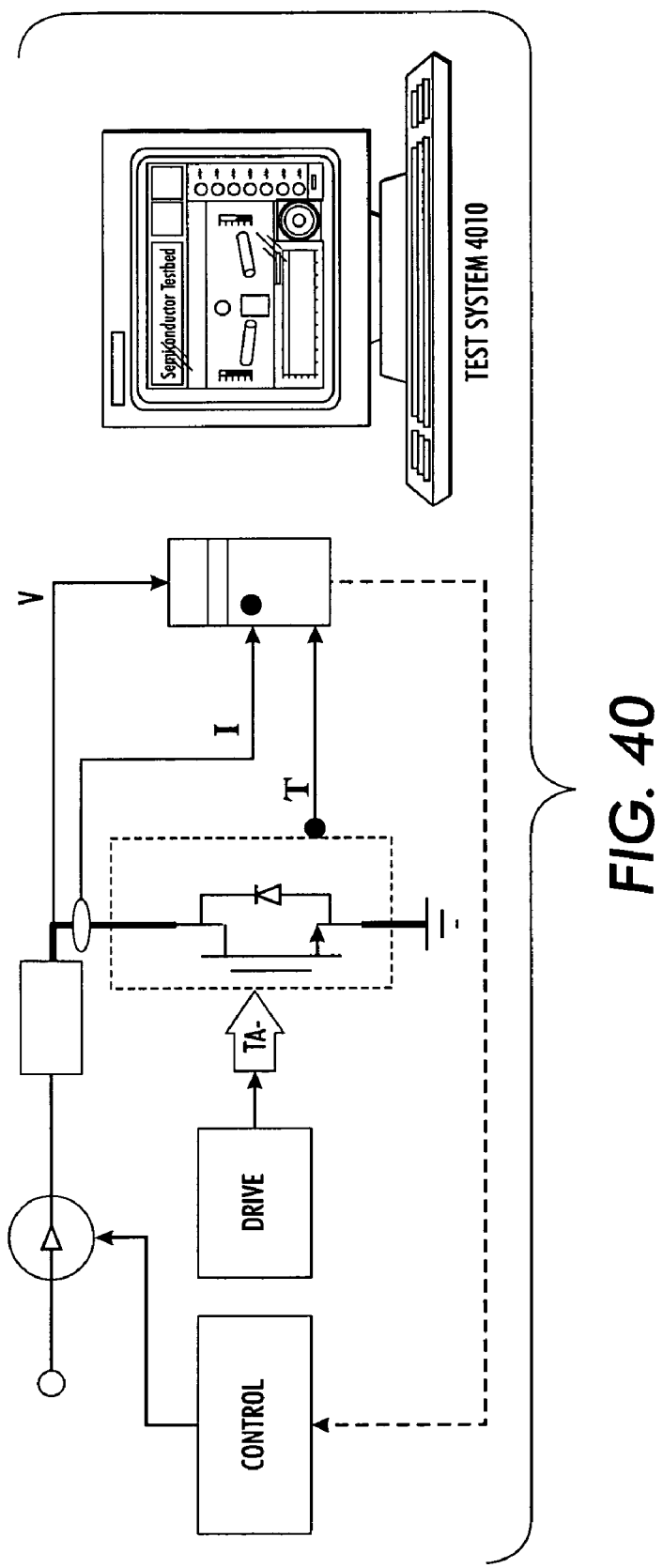
FIG. 40 is an illustration of a thermoelectrical accelerated test.

The insulated gate bipolar transistor (Model: IRG4BC30KD), manufactured by International Rectifier is an ultra-fast IGBT with ultra-fast soft recovery diode. Twenty four test boards, identical to those shown in FIG. 39, were fabricated to record transistor monitoring parameters while undergoing thermoelectric stress. The test-bed 3900 provides measurements of drain-to-source voltage and current (VDS and IDS respectively) in order to compute the drain-to-source resistance (RDS). The temperature is measured along the front and back surfaces of the power semiconductor to approximate the junction temperature of the device ($T_j$). In addition, the gate current ($I_G$) and the gate voltage ($V_G$) are measured. The gate current is computed from the differential voltage over a 100K ohm resistance, for example. The current source used for this experiment was built from a modified voltage controlled power supply. A diagram of the test setup is shown in FIG. 40. The feedback loop maintains temperature constant in order to keep the aging process controlled. The semiconductor test-bed was implemented and developed using LabVIEW software. During operation, a series of data files are created on the computing platform 4010 (e.g., laptop, workstation, etc.) for each experimental measurement. All data files are saved in a standard file format for post analysis using MATLAB.

Highly accelerated failure testing was performed on IGBTs. The IGBT (Model: IRG4BC30KD), manufactured by International Rectifier, is an ultra-fast IGBT with ultra-fast soft recovery diode. Approximately twenty-four test boards, identical to those shown in FIG. 39, were fabricated to record transistor monitoring parameters while undergoing thermo-electric stress.

Thermo-Electrical Aging

Figure 41:
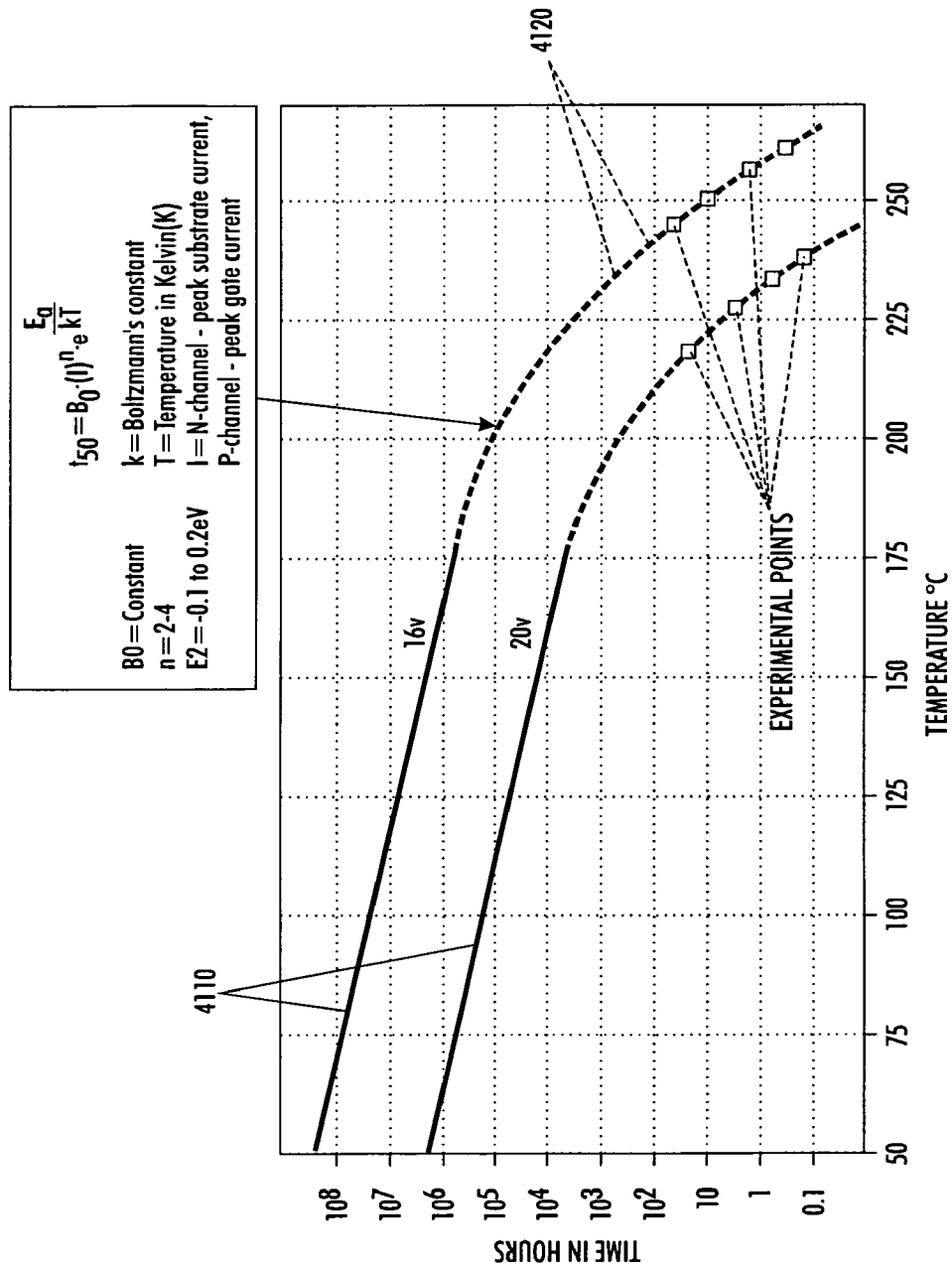
FIG. 41 is a plot of the life expectancy.

FIG. 41 depicts a graphical characterization of the expected life with thermal and gate bias for a 50% accumulated failure rate. Life expectancy given by the manufacturer's data of a power device, indicated in FIG. 41 as a solid line 4110, can be extended for temperatures beyond the maximum rated temperature, shown in dashed lines 4120, by thermo-electrical aging. The solid line is obtained from failure rate data provided by the manufacturer; whereas the ultra-accelerated test produces the experimental points on the dashed line. The dashed line curve is adjusted using the aging model corresponding to hot carrier effect.

Figure 42A:
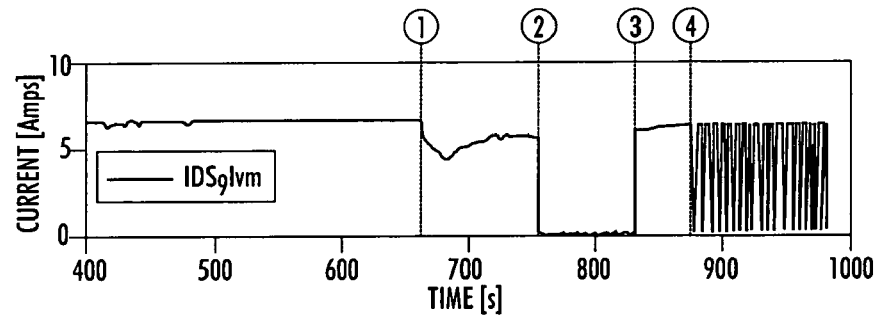
FIGS. 42A-C depict graphical results of latching, and self-healing under a thermo-electrical accelerated test.
Figure 42B:
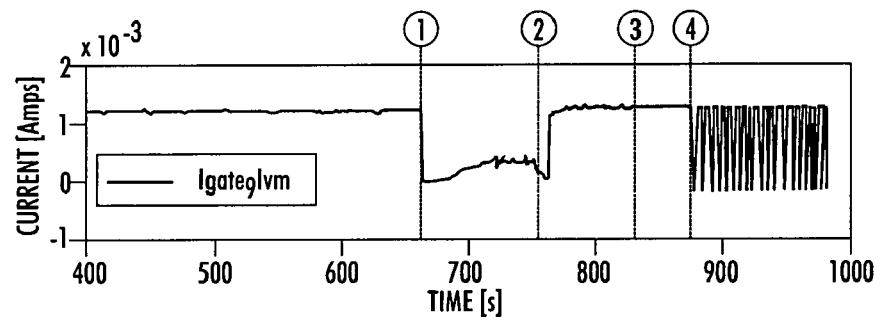
Figure 42C:
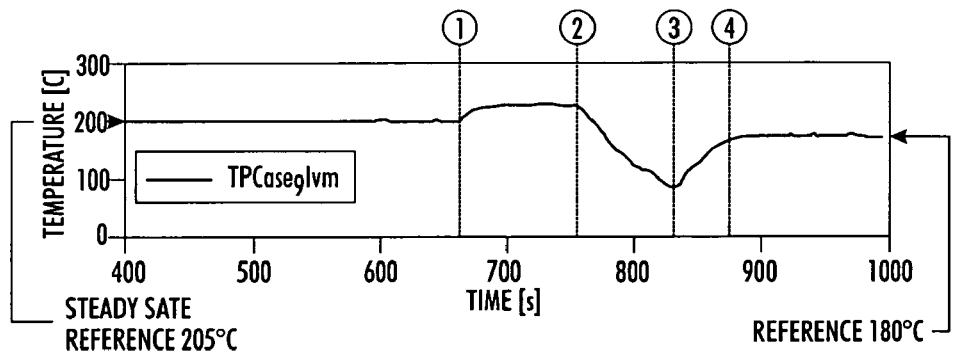

Latching was observed when thermal-electric stress was applied to the IGBT. Gate current, drain current, and case temperature for an IGBT undergoing thermal-electrical aging is shown in FIGS. 42A-C. A detailed description of the plots is provided below where descriptions for the points 1 through 4 correspond to FIGS. 42A-C accordingly. Before point 1: The reference temperature is 205° C., the steady state operation is 202° C. which corresponds to the IGBT drain current of 7 Amperes and no switching is required to maintain the temperature under 205° C. At point 1: A run off temperature was monitored triggering an automatic shutoff of the IGBT by cutting the gate voltage. However, due to latching, the transistor cannot be successfully turned off. The temperature continues to rise. At point 2: Manual interruption occurred. The temperature is drastically reduced. At point 3: Manual connection is applied. The new reference is set to 180° C. At point 4: Switching occurs in order to maintain the reference temperature. The operational characteristic of the device is maintained but aging and degradation in the device occurred. Note: not shown, the degradation is observed as a reduction in time between latching.

Ringing Characterization

During a transition between an off-to-on state for a transistor, second and third order harmonic oscillations are observed among the inductive load and the non-linear capacitive behavior of the semiconductor. As noted previously, FIG. 37 (a) illustrates the ringing observed during this transition between the transistor (S1) and its clamping diode (S2). The circuital model of the circuit in FIG. 37 (b). From this model the system can be analyzed as a second order circuit.

Figure 43:
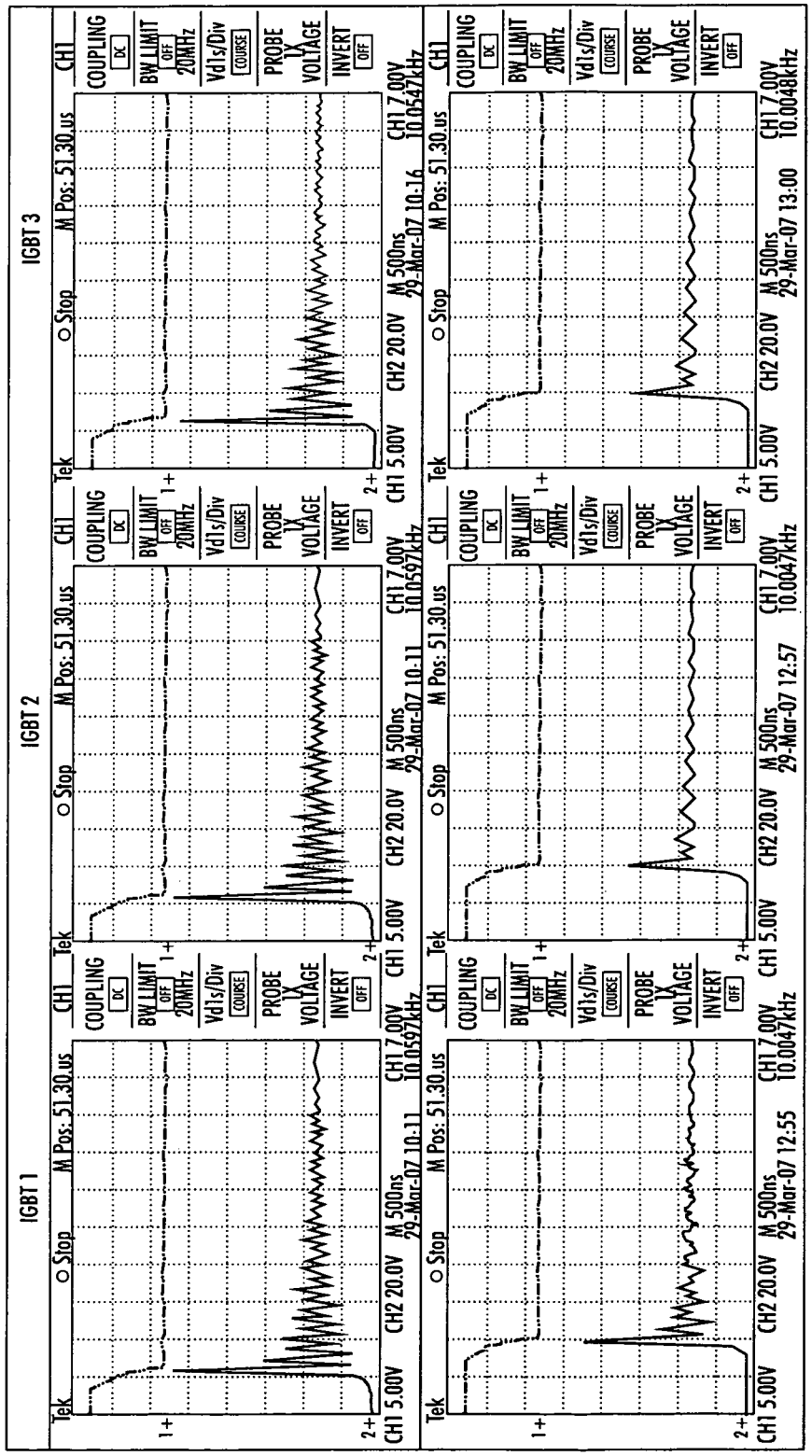
FIG. 43 is a series of graphical representations of changes in the ringing characteristic of new vs. aged insulated gate bipolar transistors.

IGBTs were aged by thermoelectrical stress until latching was observed. The transistors after the stress applied remained in good operational condition with not appreciable indication of aging in the static parameter. FIG. 43 shows clear changes in the dynamic behavior of the switching properties of the IGBT before (top) and after (bottom) aging. An appreciable increase in the damping ($\xi$) and large attenuation in the ringing of high frequencies can be observed as well.

Figure 44A:
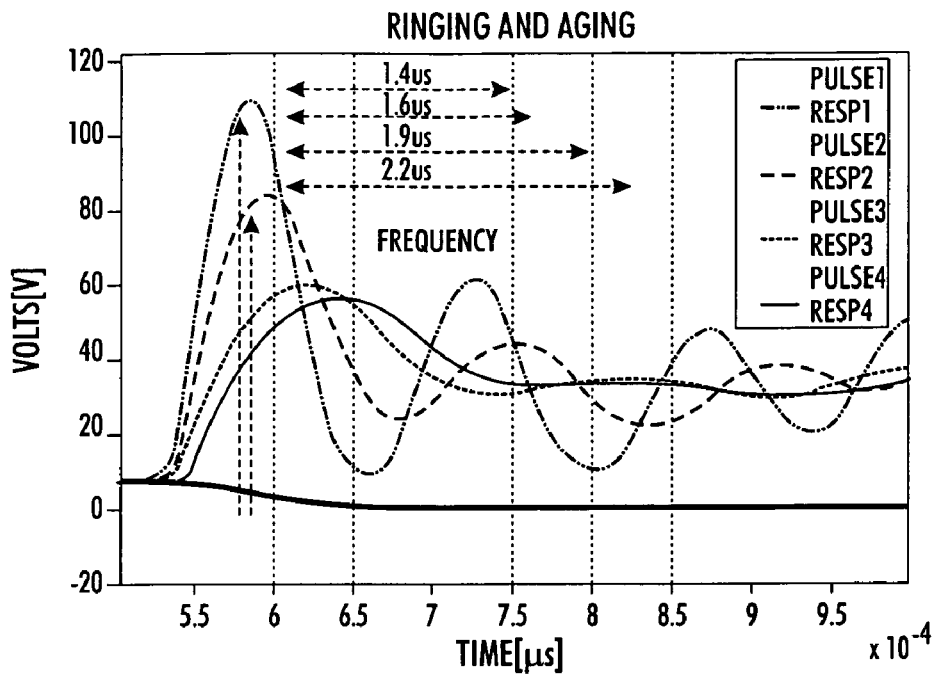
FIGS. 44A and B, illustrate a graphical representation of parameter decays while aging.
Figure 44B:
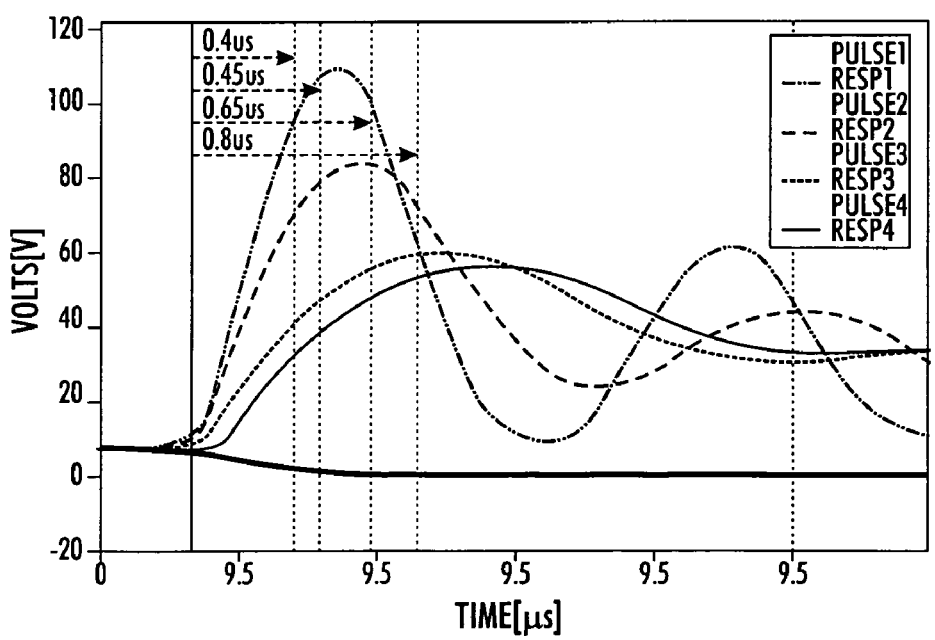

Considering FIGS. 44A and B, illustrated is a graphical depiction of how the parameter decays while aging. The trigger is synchronized allowing switching ringing comparison across different levels of aging transistors. FIG. 44A shows how the main frequency increases with the aging. The rise in time delay is shown in FIG. 44B. Assuming no changes in the inductance of the simplified ringing model developed above, the preliminary results based on this model suggest, according to the equations above and below, an increase in the resistance and a reduction in the capacitance of the parametric values in the power device. It will be further appreciated that a direct relation among the most significant IGBT parameters and its changes due to the device aging may be investigated.

Figure 45A:
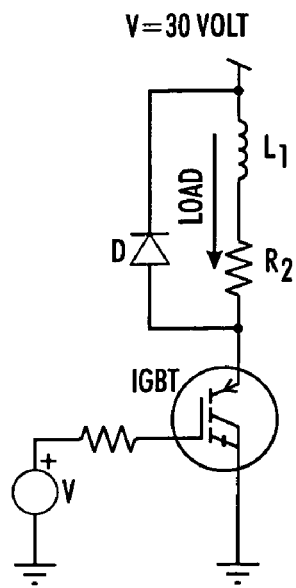
FIGS. 45A and B are schematic illustrations of a platform for aging evaluation using ringing characterization.
Figure 45B:
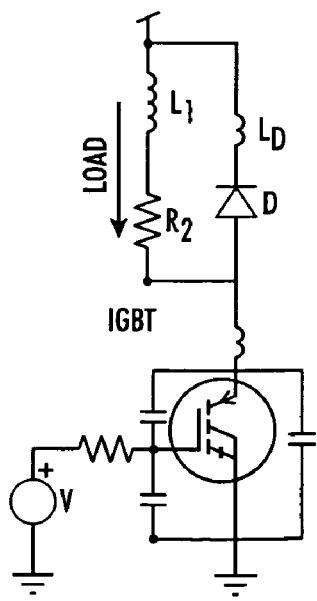

After a thermoelectrical stress is applied to the transistor, a ringing platform is used to evaluate the changes in the parameters of the device. FIGS. 45A and B show, schematically, diagrams of this platform were the load is the coil of a 3-phase induction motor. For the switching frequency of 10 KHz the inductance coil becomes very large and acts as current source.

Figure 46:
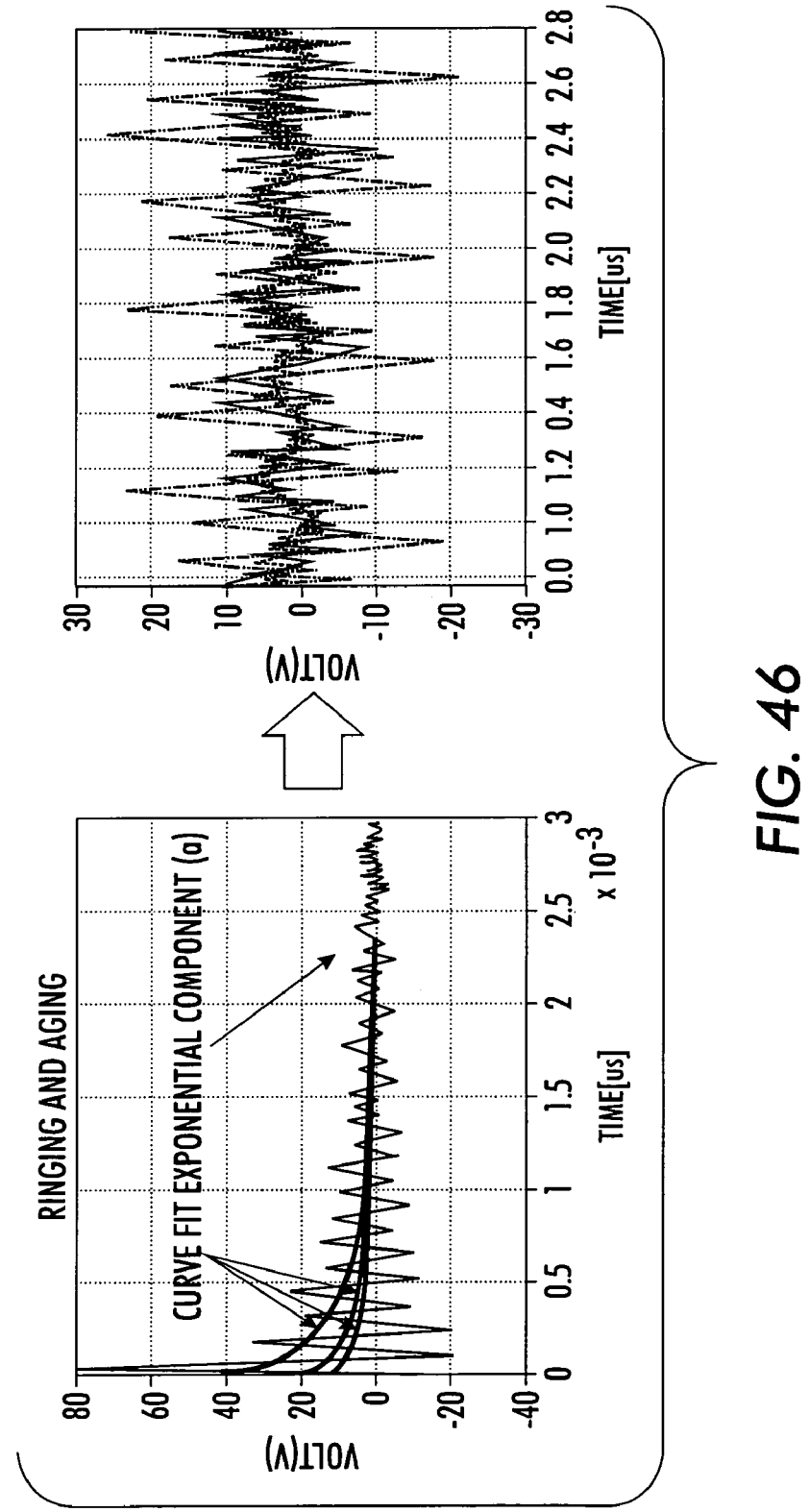
FIG. 46 is a graphical representation of the ringing frequency.
Figure 47:
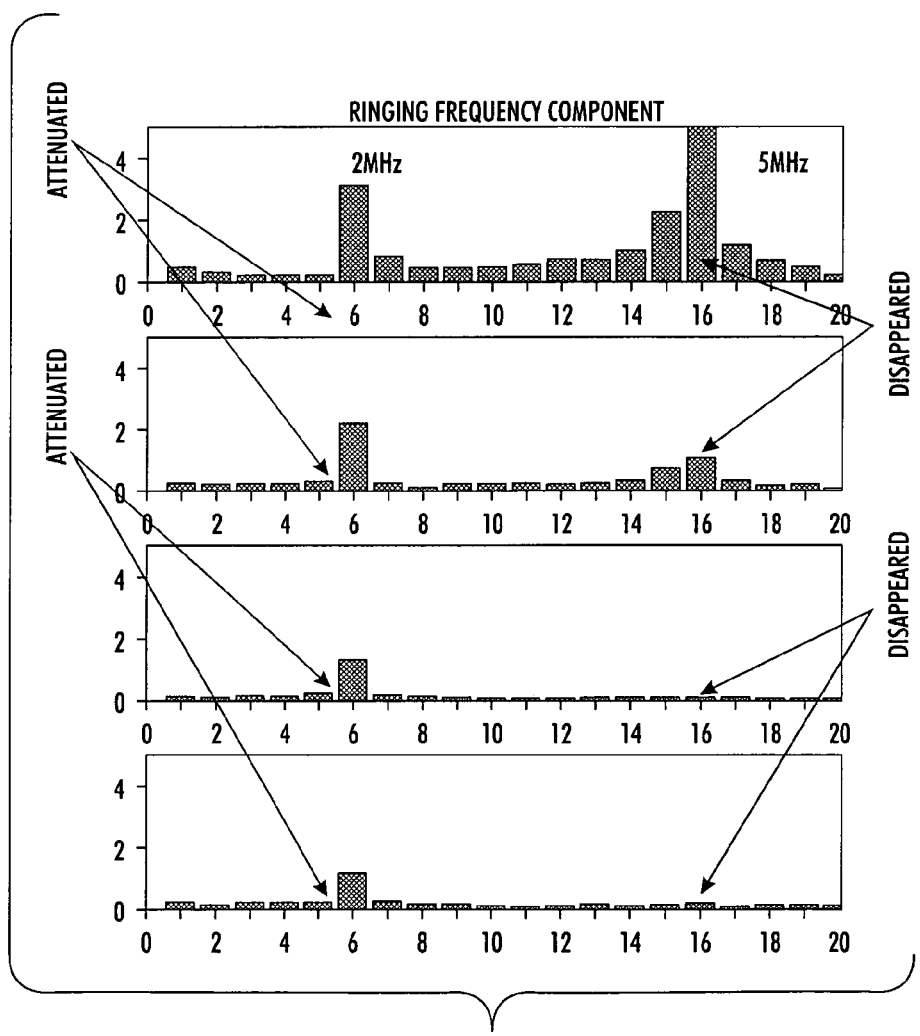
FIG. 47 is a graphical depiction of attenuation of the ringing frequency in insulated gate bipolar transistors.

The ringing response was transformed using the inverse of an exponential curve fitted to the damping. This permitted obtaining the non-attenuated frequencies of the ringing as seen, for example, in FIG. 46. With the non-damped frequency response the attenuation of the main frequency component can be tracked. The graphs of FIG. 47 show attenuation in both of the main components with aging but a large attenuation in the faster resonance frequency.

Modeling ODE and Circuital Representation

Figure 48:
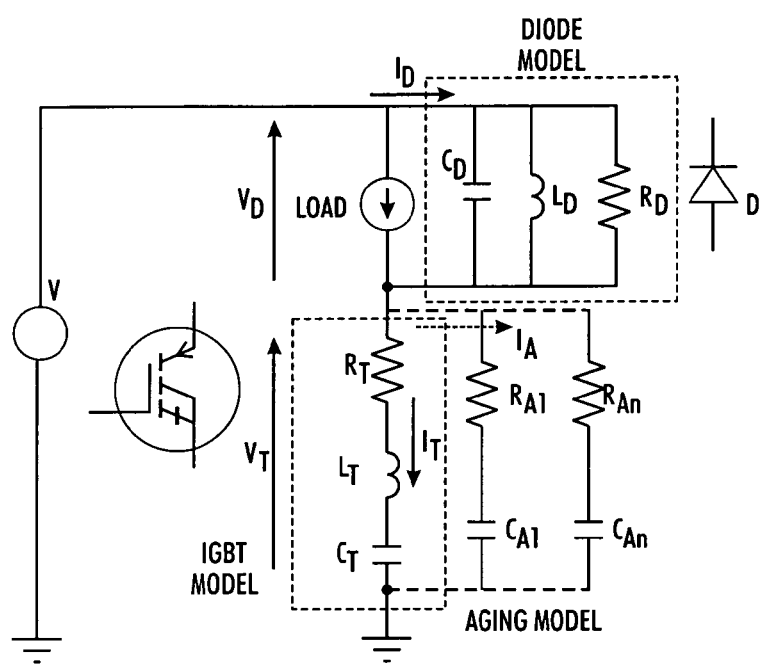
FIG. 48 is schematic illustration of a model for ringing.

A circuital model, shown schematically in FIG. 48, describes in more detail the ringing characterization observed from the experimental results presented above. Each element involved in the equivalent ringing circuit, such as the diode and the IGBT, are modeled as elemental RLC circuits. The electrical coupling between the diode and IGBT circuital models are described using Kirchoffs equations as provided below in Equation 12

$$\begin{cases} V = V_T + V_D \\ I = I_T - I_D \end{cases} \quad \text{Equation 12}$$

Each individual power element for the diode and the IGBT are described using the set equations below in Equation 13. The symbols VT and ID refer to the voltage across the IGBT transistor aging model and the diode drain current.

$$\begin{cases} V_T(t) = R_T i_T(t) + L_T \frac{\partial i_T(t)}{\partial t} + \frac{1}{C_T} \int i_T(t) dt \\ I_D(t) = \frac{v_D(t)}{R_D} + C_D \frac{\partial v_D(t)}{\partial t} + \frac{1}{L_D} \int v_D(t) dt \end{cases} \quad \text{Equation 13}$$

Next, the Laplace transfer functions for the IGBT transistor and diode models were obtained from the set of equations in Equation 13. The resulting set of equations is provided below in Equation 14.

$$\begin{cases} V_T(S) = R_T I_T(S) + SL_T I_T(S) + \frac{I_T(S)}{SC_T} \\ I_D(t) = \frac{V_D(S)}{R_D} + C_D S V_D(S) + \frac{V_D(S)}{L_D S} \end{cases} \quad \text{Equation 14}$$

An additional set of equations were derived for the voltage across the diode and current through the IGBT, represented as VD and IT respectively, in terms of impedance of the diode and admittance of the IGBT expressed in Equation 15.

$$\begin{cases} V_D(S) = Z_D(S) I_D(S) \\ I_T(S) = Y_T(S) V_T(S) \end{cases} \quad \text{Equation 15}$$

The admittance of the transistor and impedance of the diode were found by solving the set of equations given in Equation 14 and 15. The resulting expressions are provided below in Equation 16. Both sets of equations are used to model the IGBT and diode in Simulink, shown in FIG. 49.

$$\begin{cases} Y_T(S) = \dfrac{C_T S}{C_T L_T S^2 + R_T C_T S + 1} \\ Z_D(S) = \dfrac{L_D S}{C_D L_D S^2 + R_D L_D S + 1} \end{cases} \quad \text{Equation 16}$$

Finally, the IGBT aging was modeled as a dynamic process, where the largest source of aging occurs in the transient stages represented as an RC circuit in FIG. 48. The same technique is used for modeling capacitor for varying degrees of degradation. The basic model consists of a set of first order differential equations that represent the RC circuit. The set of Equations describing this model are presented below in Equation 17 where $V_{An}$ and $I_{An}$ represent the current and voltage measured across the RC network.

$$\begin{cases} V_{An}(t) = R_{An} i_{An}(t) + \dfrac{1}{C_{An}} \displaystyle\int i_{An}(t) dt \\ I_{An}(S) = V_{An}(S) \dfrac{C_{An} S}{R_{An} C_{An} S + 1} \end{cases} \quad \text{Equation 17}$$

Figure 49:
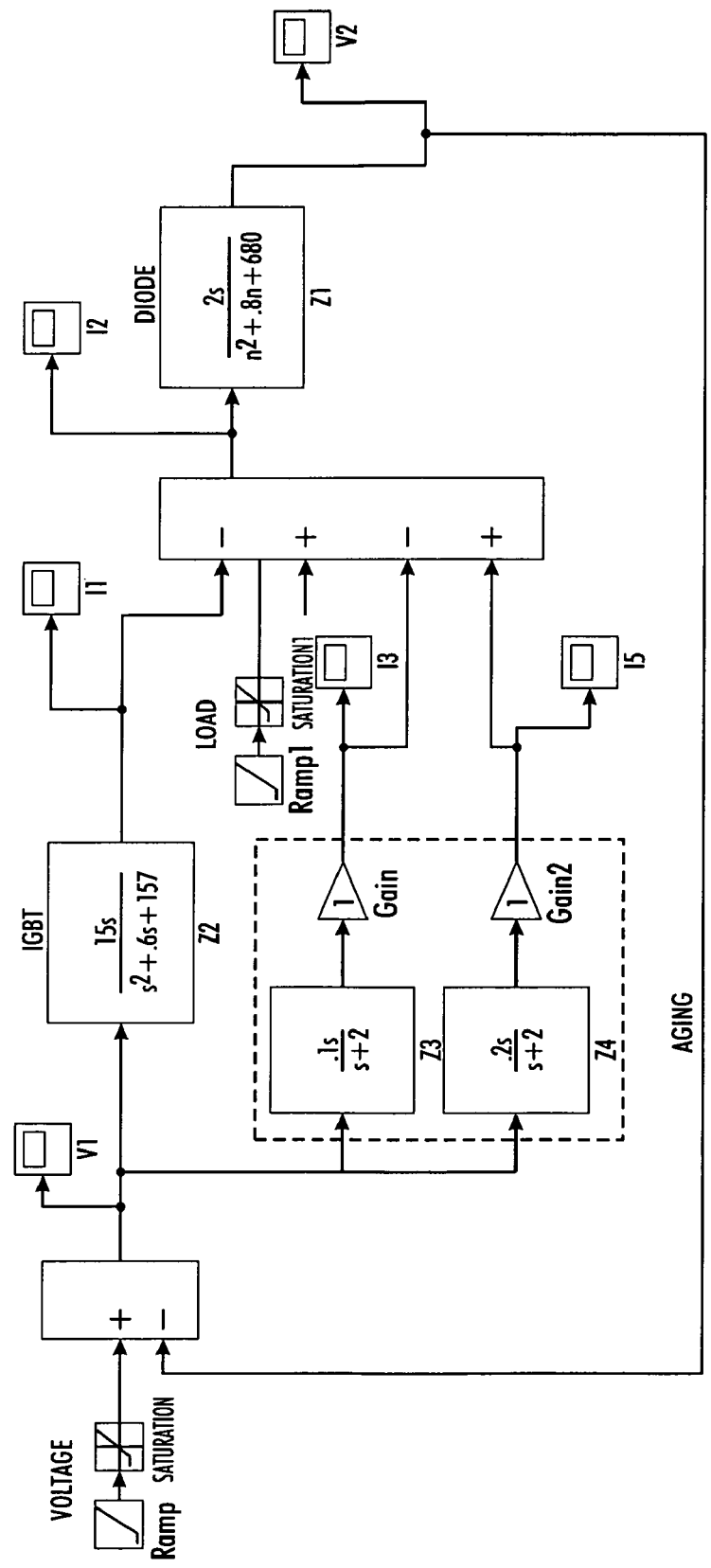
FIG. 49 is a schematic illustration of an exemplary Simulink model with aging.
Figure 50A:
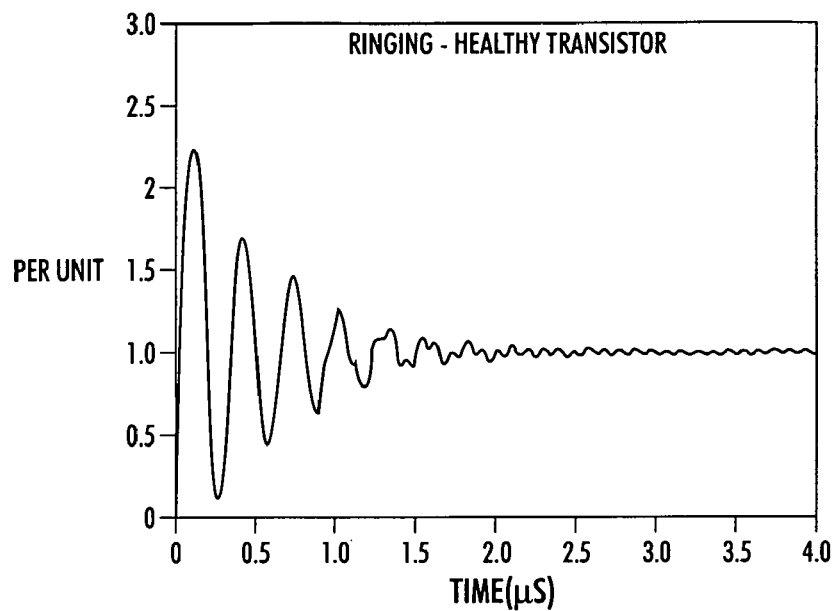
FIGS. 50A-B respectively illustrate simulated results for the insulated gate bipolar transistors aging model for healthy and aged transistors.
Figure 50B:
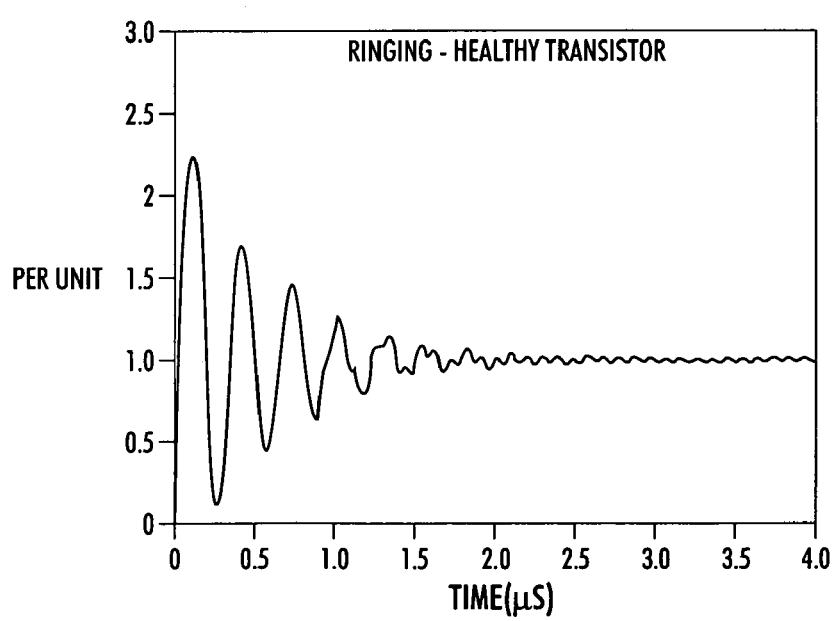

The transfer functions derived in Equations 16 and 17 were used to develop a Simulink model for the circuital model shown earlier in FIG. 48. The resulting Simulink model is represented in FIG. 49. Simulation of the IGBT aging model in Simulink indicates the disappearance of the 5 MHz ringing frequency for the aged transistors. This is illustrated below in FIGS. 50A-B, where the 5 MHz frequency content is present on the healthy transistor (FIG. 50A) and not the aged transistor (FIG. 50B). Additionally, the ringing waveforms generated by the model correspond to the experimental data shown earlier in FIG. 49 for a healthy and aged IGBT.

Ringing Characterization in a Real System

Figure 51:
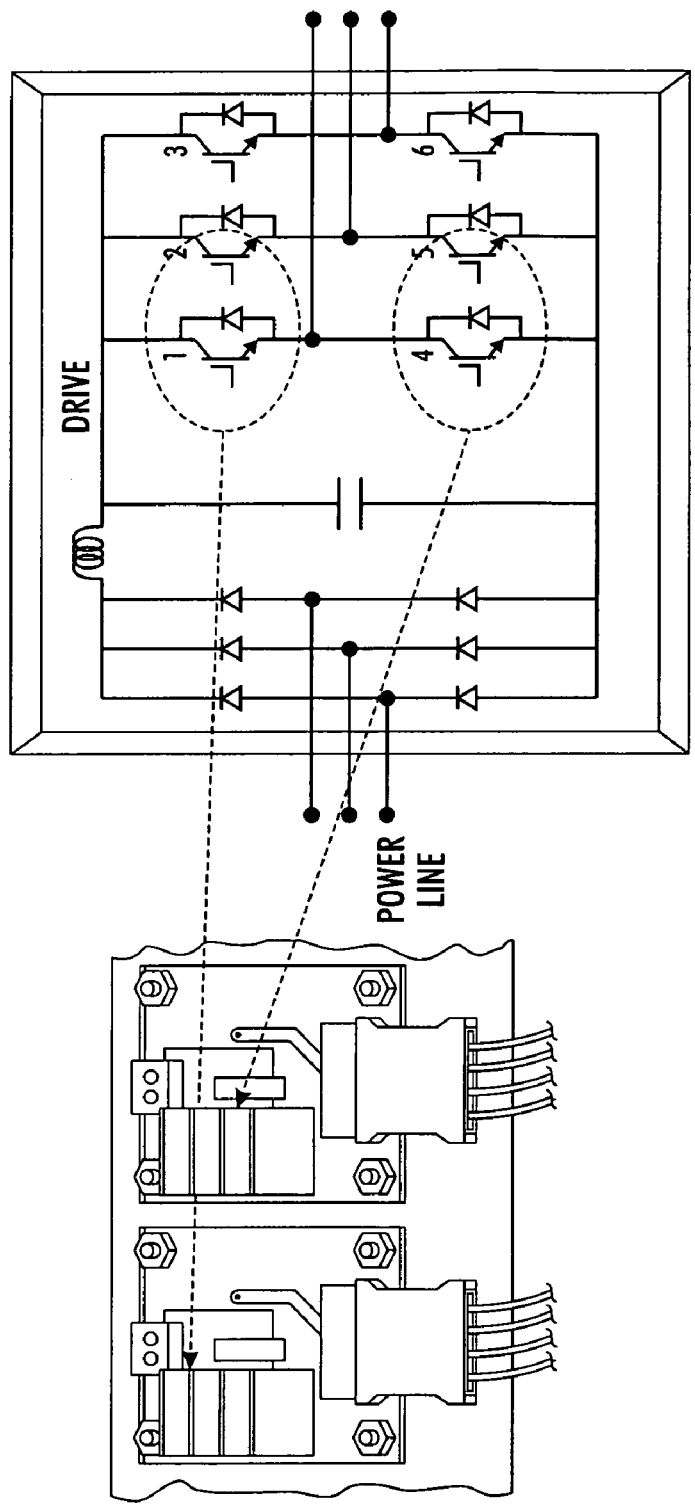
FIG. 51 is an illustrative representation of a modified test setup.

The Microchip microcontroller and power inverter test-bed was enhanced to evaluate IGBTs by utilizing interchangeable transistor test boards, for example those shown in FIG. 51. Each of the six bridge IGBTs were removed from the inverter board and remounted onto a single transistor test board (see FIG. 39) and attached to a heat sink. The thermal dissipation of the heat sink was rated at 2° C./W allowing for nominal inverter operation (see FIG. 41). This enhanced platform with interchangeable power transistors or (PIPT-1) allows for testing of one or more aged IGBT transistors during real-time operation. An illustration of the PIPT-1 testing platform is provided in FIG. 52.

Figure 52:
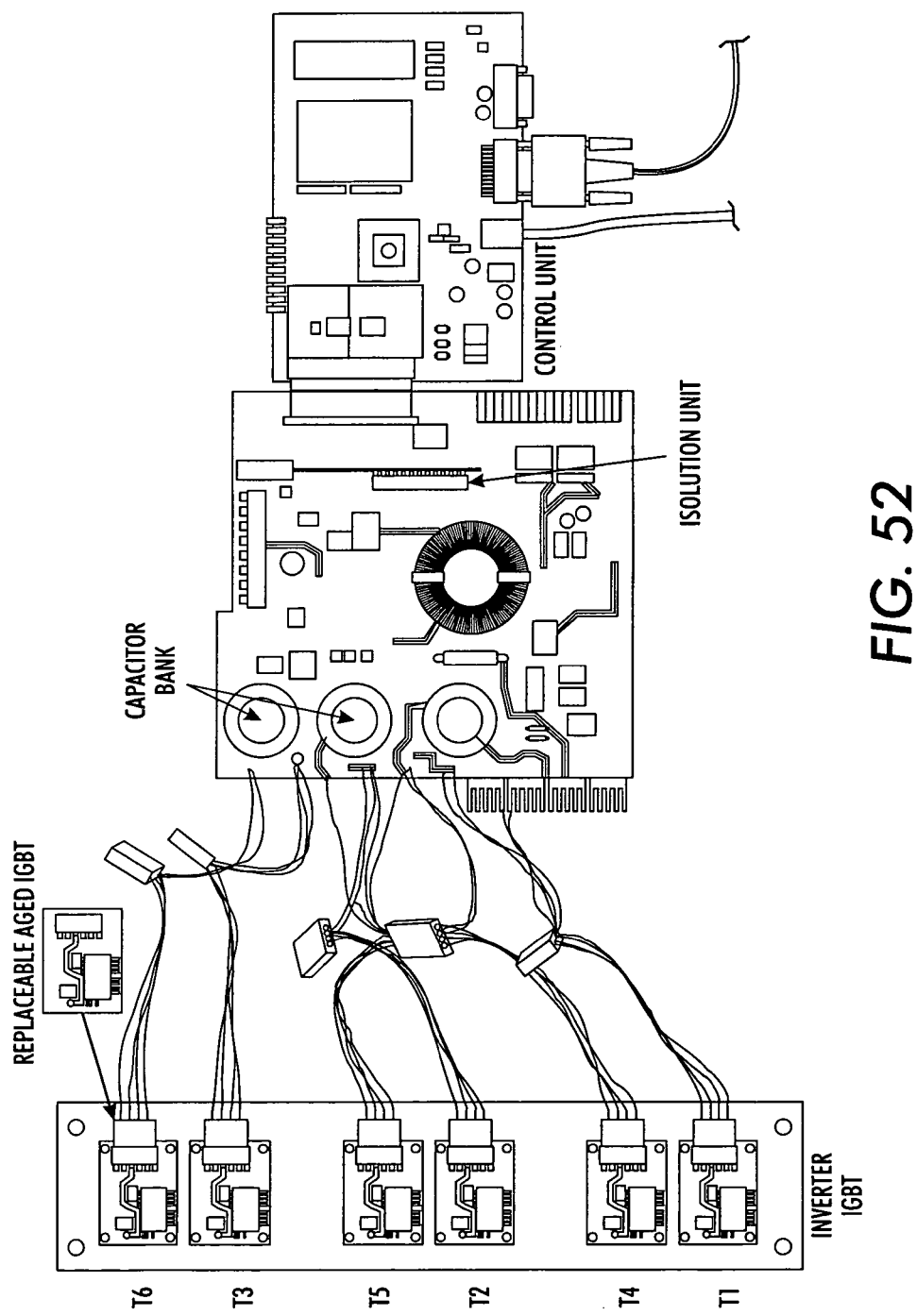
FIG. 52 is an illustration of an enhanced test platform having interchangeable power transistors.
Figure 53A:
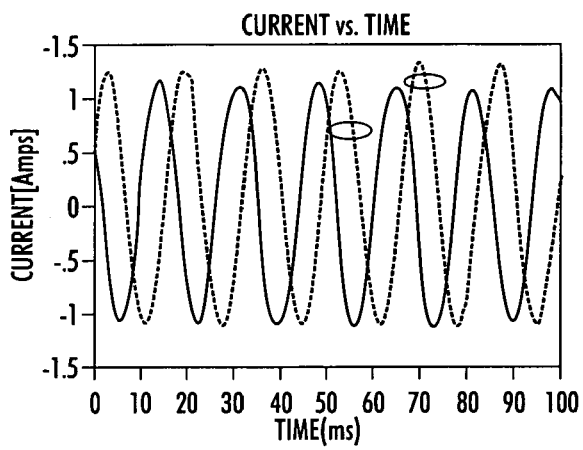
FIGS. 53A-C graphically illustrate example results from the platform of FIG. 52.
Figure 53B:
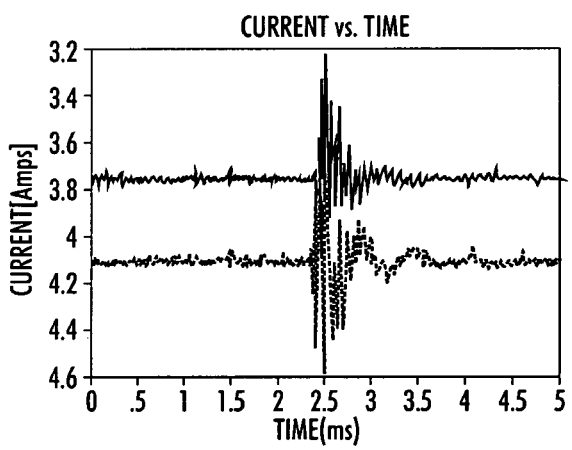
Figure 53C:
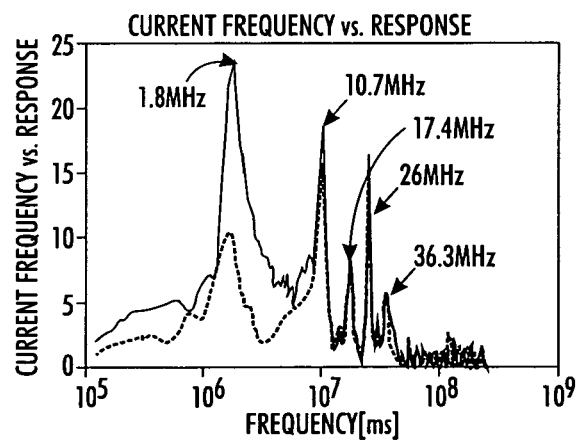

The main characteristics of the PIPT-1 are summarized as follows: (i) perform simultaneous aging and evaluation of degraded IGBTs in a real-time system; (ii) open interface with standardized connectors allowing for rapid development of the proposed fault diagnostic circuit; and (iii) reduce development time by preserving the capacitor bank, sensors, isolation unit, and control unit from the original power-drive test bed. The results of ringing characterization applied to the test-bed of FIG. 52 are shown in FIGS. 53A-C. FIG. 53A illustrates the current for motor phases R and Y. A detailed snapshot of the current for motor phases R and Y shows the ringing oscillation during transistor turn-on and turn-off states. FIG. 53B shows the frequency spectrum allowing the characterization of the ringing with three frequencies.

Figure 54:
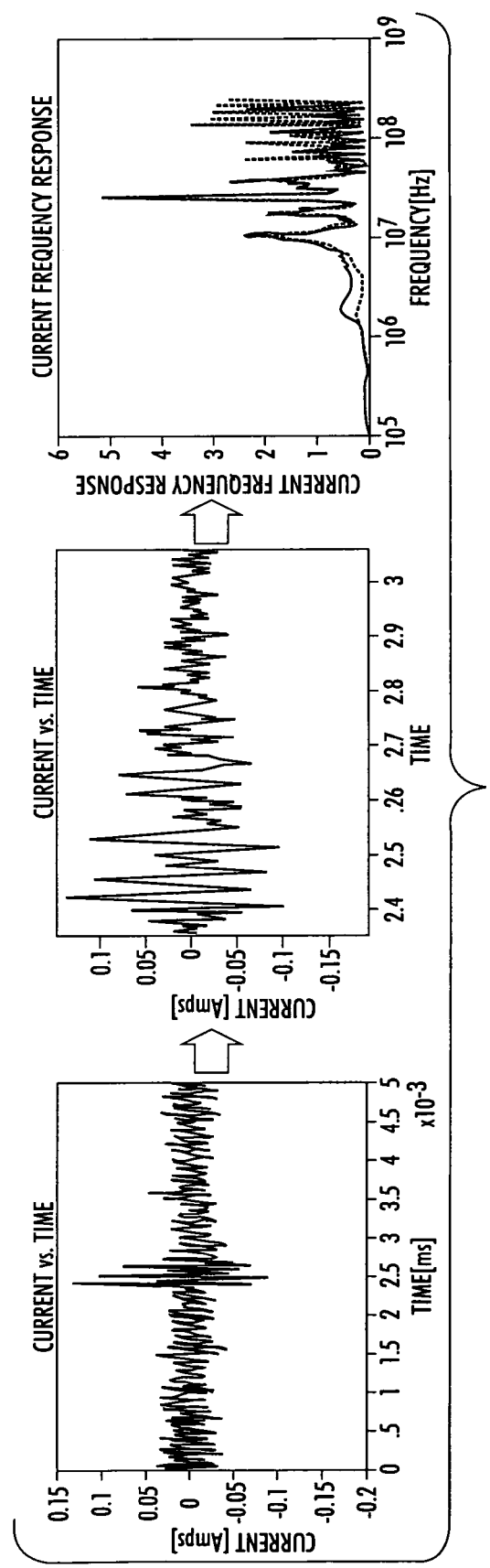
FIG. 54 depicts derivatives of the current signal in FIGS. 53A-C and detail of the ringing during switching.
Figure 55:
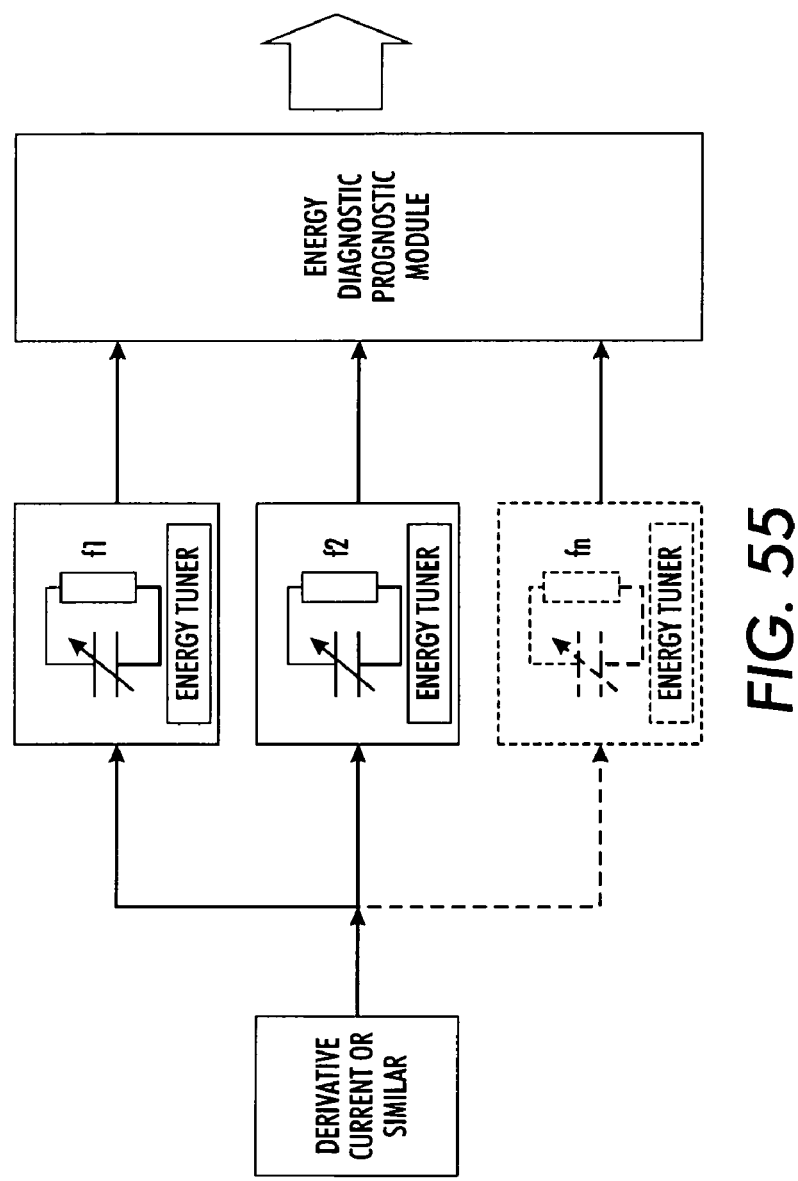
FIG. 55 illustrated, in a block diagram, a possible circuit for ringing characterization.

By calculating the derivative of the current signal, the current bias may be eliminated from the ringing, leading to a better characterization. FIG. 54 depicts derivatives of the current signal and detail of the ringing during switching, and shows how the dynamics of the ringing is almost identical for the two phases. A diagram of a circuit that can provide the ringing characterization feature for the diagnostic and prognostic module is presented in FIG. 55.

Aging Diagnostic Circuit

Figure 56:
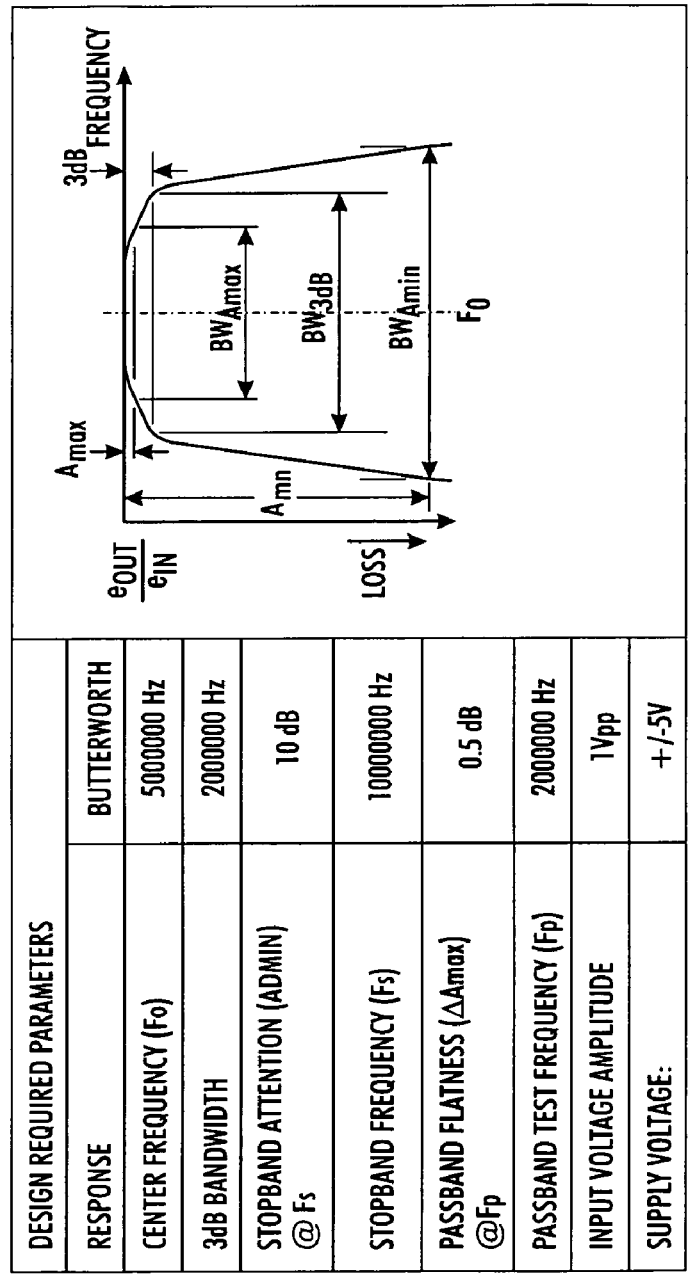
FIG. 56 is an illustration of the band-pass filter design requirements for a ringing diagnostic circuit.
Figure 57:
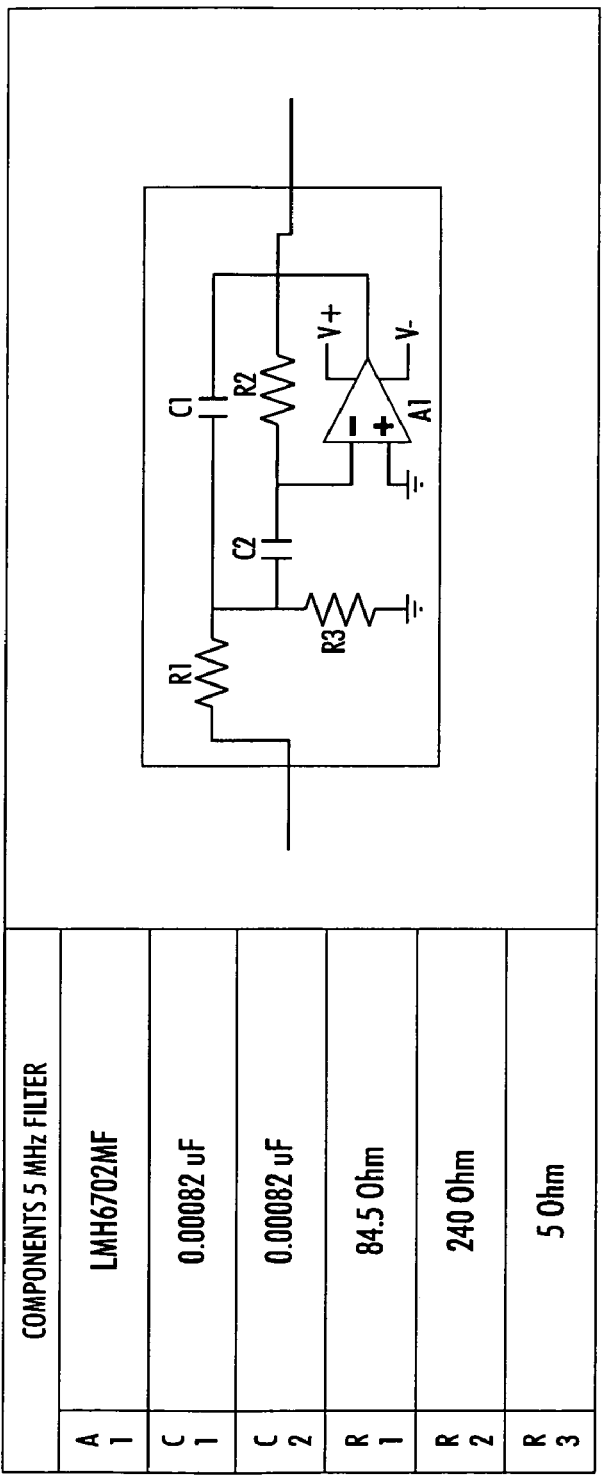
FIG. 57 is an example of a band-pass filter meeting the design of FIG. 56.

To distinguish between a healthy and aged transistor a tuned ringing frequency system will be used to detect the 5 MHz frequency component. The 5 MHz ringing component was identified previously as a diagnostic feature for the IRG4BC30KD IGBT transistor. Note: the primary feature of 5 MHz will differ for different transistors. FIG. 56 shows the conceptual design of the ringing diagnostic circuit developed, including the filter design specifications. From the specification requirements given FIG. 56, a band-pass filter can be designed using an operational amplifier, for example the configuration and components depicted FIG. 57.

It will be appreciated that various of the above-disclosed embodiments and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A method for monitoring the health-state for electronic equipment, comprising:
    measuring current and voltage at an input and an output of the electronic equipment and acquiring data therefrom;
    storing the measured data in a memory;
    using a processor having access to the measured data, calculating performance metrics for the equipment;
    separating the measured data into a plurality of data classes;
    generating performance models for at least one data class;
    extracting diagnostic features from measured data values by comparing calculated performance metrics with the performance models; and
    identifying the source and severity of a fault based upon the diagnostic features.

2. The method according to claim 1, wherein extracting diagnostic features includes statistical analysis.

3. The method according to claim 1, wherein extracting diagnostic features includes trend analysis.

4. The method according to claim 1, wherein extracting diagnostic features includes threshold analysis.

5. The method according to claim 1, wherein extracting diagnostic features includes pattern analysis.

6. The method according to claim 1, wherein extracting diagnostic features includes quantitative state estimation.

7. A method for monitoring the health-state for electronic equipment, comprising:
    measuring current and voltage at an input and an output of the electronic equipment and acquiring data therefrom;
    storing the measured data in a memory;
    using a processor having access to the measured data, calculating performance metrics for the equipment;
    separating the measured data into a plurality of data classes;
    generating performance models for at least one data class;
    extracting diagnostic features from measured data values by comparing calculated performance metrics with the performance models, wherein extracting diagnostic features includes signal processing; and
    identifying the source and severity of a fault based upon the diagnostic features.

8. The method according to claim 1, further including displaying the health assessment to an operator.

9. A method for monitoring the health-state for electronic equipment, comprising:
- measuring current and voltage at an input and an output of the electronic equipment and acquiring data therefrom, wherein said electronic equipment is an electric power converter used to convert power from one form to at least another form;
- storing the measured data in a memory
- using a processor having access to the measured data, calculating performance metrics for the equipment;
- separating the measured data into a plurality of data classes;
- generating performance models for at least one data class;
- extracting diagnostic features from measured data values by comparing calculated performance metrics with the performance models; and
- identifying the source and severity of a fault based upon the diagnostic features.

10. The method according to claim 1, wherein calculating performance metrics includes performing calculations using explicit analytical expressions in terms of measured data values.

11. The method according to claim 1, wherein the performance metrics include loss resistance, power loss, and converter efficiency.

12. The method according to claim 1, wherein generating performance models includes using an analytical best-fit expression that relates the performance metrics with the monitoring values for each data class.

13. The method according to claim 1, wherein generating performance models includes using a neural network that relates the performance metrics with the monitoring values for each data class.

14. A method for monitoring the health-state for electronic equipment, comprising:
- measuring current and voltage at an input and an output of the electronic equipment and acquiring data therefrom, wherein said electronic equipment includes a plurality of electronic circuit components;
- storing the measured data in a memory;
- using a processor having access to the measured data, calculating performance metrics for the equipment;
- separating the measured data into a plurality of data classes;
- generating performance models for at least one data class;
- extracting diagnostic features from measured data values by comparing calculated performance metrics with the performance models; and
- identifying the source and severity of a fault based upon the diagnostic features.

15. The method according to claim 14, wherein the circuit components include digital components.

16. The method according to claim 14, wherein the circuit components include radio-frequency components.

17. The method according to claim 14, wherein at least one of said circuit components includes a radio-frequency component of a global positioning system, and where said performance metrics include at least one parameter selected from the group consisting of:
- signal-to-noise-ratio;
- bit-error-rate;
- cyclic-redundancy-check;
- link quality indicator;
- received signal strength indication;
- frequency offset;
- number of satellites; and
- dilution of precision.

18. The method according to claim 1, wherein the electronic equipment is an avionic system.

19. The method according to claim 1, wherein the electronic equipment is a navigational system.

20. The method according to claim 1, wherein the electronic equipment is a radio-frequency system.

21. The method according to claim 9 wherein a diagnostic feature extracted from the measured data includes the frequency response of a circuit in the power converter.

22. The method according to claim 21, wherein said frequency response includes at least second order harmonic oscillations.

23. The method according to claim 1, wherein measuring current and voltage at an input and an output of the electronic equipment and acquiring data therefrom is accomplished in real-time without interrupting operation of the electronic equipment.

24. The method according to claim 1, wherein the model is a model of the ringing oscillation observed during a transistor transition.

25. The method according to claim 1, wherein the model further includes an aging component.

26. The method according to claim 1, wherein the diagnostic features are extracted by comparing a measured performance history with a diagnostic model for each class.

27. The method according to claim 1, wherein diagnostic features are generated from at least one of the plurality of data classes and the diagnostic features are employed to detect health variations within for at least one electronic circuit component.

28. The method of claim 1, further including using a plurality of environmental sensors to measure various environmental parameters in which the electronic equipment operates, each of the environmental sensors producing a signal representing a respective environmental parameter.

29. The method according to claim 28, wherein the signals collected by the environmental sensors are used to generate hybrid models to account for feature variation caused by changes in environmental conditions.

* * * * *